United States Patent
Gomi et al.

(10) Patent No.: US 10,049,860 B2
(45) Date of Patent: Aug. 14, 2018

(54) SUBSTRATE PROCESSING APPARATUS

(71) Applicant: Tokyo Electron Limited, Tokyo (JP)

(72) Inventors: Atsushi Gomi, Nirasaki (JP); Tetsuya Miyashita, Nirasaki (JP); Shinji Furukawa, Nirasaki (JP); Koji Maeda, Nirasaki (JP); Masamichi Hara, Nirasaki (JP); Naoyuki Suzuki, Nirasaki (JP); Hiroshi Miki, Nirasaki (JP); Toshiharu Hirata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 32 days.

(21) Appl. No.: 14/412,258

(22) PCT Filed: Apr. 30, 2013

(86) PCT No.: PCT/JP2013/002889
§ 371 (c)(1),
(2) Date: Dec. 31, 2014

(87) PCT Pub. No.: WO2014/006804
PCT Pub. Date: Jan. 9, 2014

(65) Prior Publication Data
US 2015/0235815 A1    Aug. 20, 2015

(30) Foreign Application Priority Data
Jul. 4, 2012    (JP) .................................. 2012-150916

(51) Int. Cl.
*B65G 1/06*    (2006.01)
*H01J 37/32*    (2006.01)
*H01L 21/67*    (2006.01)

(52) U.S. Cl.
CPC .. *H01J 37/32733* (2013.01); *H01L 21/67161* (2013.01); *H01L 21/67184* (2013.01); *H01L 21/67196* (2013.01)

(58) Field of Classification Search
CPC ......... H01L 21/67161; H01L 23/67184; H01L 21/37196; H01L 21/67184
See application file for complete search history.

(56) References Cited

U.S. PATENT DOCUMENTS

| 5,882,165 A * | 3/1999 | Maydan ............ H01L 21/67161 118/719 |
| 2005/0005848 A1* | 1/2005 | Yamazaki ............... C23C 14/12 118/719 |
| 2010/0215460 A1* | 8/2010 | Watanabe ......... H01L 21/67207 414/217 |

FOREIGN PATENT DOCUMENTS

| JP | 64-500072 A | 1/1989 |
| JP | 2000-100922 A | 4/2000 |

(Continued)

OTHER PUBLICATIONS

International Search Report for PCT/JP2013/002889 dated Jul. 30, 2013.

*Primary Examiner* — Jason Berman
(74) *Attorney, Agent, or Firm* — Pearne & Gordon LLP

(57) ABSTRACT

An apparatus includes a row of substrate transfer devices 3 which can deliver a wafer W within a transfer chamber; and rows of process modules PM, arranged at right and left sides of the row of the substrate transfer devices along the row, configured to perform processes to the wafer W. The rows of the process modules PM are arranged such that each of the processes can be performed by at least two process modules PM. Thus, when a single process module PM cannot be used, the wafer W can be rapidly transferred to another process module PM which can perform the same process as (Continued)

performed in the corresponding process module. Therefore, even when the single process module PM cannot be used, the processes can be continued to the wafers W without stopping an operation of the apparatus, so that the number of wasted wafers W can be reduced.

9 Claims, 57 Drawing Sheets

(56) References Cited

FOREIGN PATENT DOCUMENTS

| | | | |
|---|---|---|---|
| JP | 2003-060008 | A | 2/2003 |
| JP | 2009-071214 | A | 4/2009 |
| JP | 4473343 | B2 | 3/2010 |
| KR | 10-2000-0034932 | A | 6/2000 |
| KR | 10-2004-0093011 | A | 11/2004 |
| WO | 87/06561 | A1 | 11/1987 |
| WO | 00/17925 | A1 | 3/2000 |
| WO | 2009/060540 | A1 | 5/2009 |

* cited by examiner

FIG. 19

| | | |
|---|---|---|
| PROCESS M | Ta FILM FORMATION | |
| PROCESS L | Ru FILM FORMATION | |
| PROCESS K | CoFeB FILM FORMATION | |
| PROCESS J | COOLING | |
| PROCESS I | HEATING | THIRD PRIORITY OF NEXT PROCESS |
| PROCESS H | OXIDATION | SECOND PRIORITY OF NEXT PROCESS |
| PROCESS G | Mg FILM FORMATION | |
| PROCESS F | CoFeB FILM FORMATION | FIRST PRIORITY OF NEXT PROCESS |
| PROCESS E | Ru FILM FORMATION | |
| PROCESS D | CoFeB FILM FORMATION | |
| PROCESS C | PtMn FILM FORMATION | FOURTH PRIORITY OF NEXT PROCESS |
| PROCESS B | Ta FILM FORMATION | |
| PROCESS A | PRE-CLEANING | |

LOW ELECTRIC RESISTANCE

HIGH ELECTRIC RESISTANCE

SUBSTRATE PROCESSING APPARATUS

CROSS-REFERENCE TO RELATED APPLICATION

This Application is a U.S. national phase application under 35 U.S.C. § 371 of PCT Application No. PCT/JP2013/002889 filed on Apr. 30, 2013, which claims the benefit of Japanese Patent Application No. 2012-150916 filed on Jul. 4, 2012, the entire disclosures of which are incorporated herein by reference.

TECHNICAL FIELD

The embodiments described herein pertain generally to a substrate processing apparatus that performs a series of processes to a substrate in a vacuum atmosphere using multiple process modules in sequence.

BACKGROUND

Recently, there has been a requirement for promoting non-volatilization of a system internal memory, and there has been suggested a MRAM (Magnetoresistive Random Access Memory) which uses a Tunneling Magnetoresistive (TMR) effect. The MRAM includes a MTJ (Magnetic Tunnel Junction) device at an intersection point between a word line and a bit line, and the MTJ device stores one-bit information. This MTJ device 9, as depicted in FIG. 58 and FIG. 59, serves as a laminated film in which a tunnel barrier layer is formed by interposing an insulating layer 96 between two ferromagnetic layers 95 (95a and 95b). In the MTJ device 9, when the magnetization directions of the two ferromagnetic layers 95 are identical with each other, electric resistance is low (see FIG. 58), whereas when the magnetization directions are different from each other, electric resistance is high (see FIG. 59). Thus, "0" and "1" of memory devices are determined depending on the magnetization directions and used as data.

The MTJ device 9 is formed by forming the ferromagnetic layer 95b on a substrate, forming the insulating layer 96 serving as the tunnel barrier layer thereon, and then forming the ferromagnetic layer 95a. Metal films are used as the ferromagnetic layers 95, and a metal oxide film is used as the insulating film 96. The metal films are formed mainly by sputtering. Further, the metal oxide film is formed, for example, by forming a metal film by a sputtering device and then oxidizing the metal film with oxygen radicals by another device. Therefore, in order to form the MTJ device 9, vacuum chambers or chambers for oxidation are needed corresponding to the number of laminated metal films or metal oxide films.

In paragraph [0068] of International Publication No. WO2009/060540, as a device that forms such a laminated film, there is suggested an inline-type wafer transfer device in which transfer chambers and process modules are connected with each other alternately. In this device, an arm within the transfer chamber receives a wafer from an upstream process module of the transfer chamber and delivers the wafer to a downstream process module of the transfer chamber. As such, a substrate is transferred through the process modules. Further, in Japanese Patent Laid-open Publication No. 2003-060008, there is described a technology of forming a laminated film of metal films by a device in which multiple processing units are connected around a second transfer chamber set to a vacuum atmosphere. In this configuration, two second transfer arms provided within the second transfer chamber load and unload a substrate with respect to the processing units.

In the case of manufacturing the MTJ device 9 by a single device, processing chambers corresponding to the total number of laminated metal films and metal oxide films are provided in the device. Further, substrates are continuously loaded into the device and transferred in sequence from an upstream processing chamber to a downstream processing chamber, and a series of processes for forming the laminated films are performed.

However, when the device is operated, the processing chambers provide in the device may break down and thus may not be applicable. In this case, a process of the broken processing chamber cannot be performed to the substrate loaded within the broken processing chamber and the substrates loaded into the device after the corresponding substrate, so that the laminated film cannot be formed by the device, and these substrates may be discarded.

Further, if the processing chamber breaks down, the operation of the device is stopped first, so that the series of processes performed to the substrates within the device are interrupted. Therefore, a series of processes can be continued with respect to the substrates loaded into the device before the substrate loaded within the broken processing chamber when the device is recovered and the series of processes are resumed. However, if the processes are stopped, a surface of a metal film is oxidized and MR (magnetic resistance)/RA (resistance) may be changed. As such, electric characteristics may be deteriorated. For this reason, even if the device is rapidly recovered and the processes are resumed, the corresponding substrate may be discarded. Since a device becomes precise and there has been a tendency to form a very expensive device on a substrate, there has been a demand for a vacuum processing device capable of reducing the number of discarded substrates while suppressing a decrease in throughput.

Neither International Publication No. WO2009/060540 nor Japanese Patent Laid-open Publication No. 2003-060008 does not describe a breakdown of a processing module and cannot solve a problem occurring when a processing module cannot be used. Further, even if a standby processing module that performs the process corresponding to that performed in the broken processing module is provided in the device described in International Publication No. WO2009/060540, a substrate is transferred through the process modules in this device. As a result, a transfer route for a substrate toward the corresponding standby process module becomes very complicated. Further, when the process modules are operated, the transfer of substrate is restricted, so that the throughput is decreased.

In the device described in Japanese Patent Laid-open Publication No. 2003-060008, the number of the processing chambers which can be connected to the second transfer chamber is limited, so that it is difficult to connect standby processing chambers to the second transfer chamber. Further, multiple transfer arms are provided within the second transfer chamber, but a substrate cannot be delivered within the second transfer chamber, and, thus, the substrate is transferred through the processing chambers. For this reason, in common with International Publication No. WO2009/060540, a transfer route for a substrate becomes very complicated, so that the throughput is decreased.

DISCLOSURE OF THE INVENTION

Problems to be Solved by the Invention

In view of the foregoing, example embodiments provide a technology of reducing the number of discarded substrates by continuing processes to substrates without stopping an operation of an apparatus even when a process module cannot be used.

Means for Solving the Problems

In one example embodiment, a substrate processing apparatus performs a series of processes to a substrate in a vacuum atmosphere by using multiple process modules in sequence. The substrate processing apparatus includes a row of substrate transfer devices each arranged within a transfer chamber in a vacuum atmosphere and each configured to be rotatable horizontally and movable back and forth, the substrate being delivered between the substrate transfer devices adjacent to each other within the transfer chamber; rows of process modules arranged at right and left sides of the row of the substrate transfer devices along the row, each of the process modules performing a process to the substrate; standby decompression chambers arranged at one ends of the respective rows of the process modules; and a control unit configured to control a transfer of the substrate. Further, the multiple process modules include a process module, having a sidewall at a side of the row of the substrate transfer devices protruded toward a space between the adjacent substrate transfer devices, configured to deliver the substrate with respect to any one of the substrate transfer devices at a front side in an inclination direction of the sidewall and a rear side in the inclination direction thereof. Furthermore, in the rows of the process modules, each of the series of the processes is performed in all of at least two process modules. When one process module of the rows of the process modules is not applicable, the control unit outputs a control signal to continuously process the substrate by using another process module that performs the same process as performed in the one process module.

Effect of the Invention

In accordance with the example embodiments, in a vacuum processing apparatus configured to perform a series of processes to a substrate in vacuum atmosphere using multiple process modules in sequence, the process modules are arranged such that each of the processes can be performed by all of at least two process modules. Further, in a transfer chamber, the substrate is delivered between adjacent substrate transfer devices. For this reason, when a single process module cannot be used, the substrate can be rapidly transferred through the inside of the transfer chamber to another process module which can perform the same process as performed in the corresponding process module without passing through the corresponding process module. Therefore, even when the single process module cannot be used, the processes can be continued with respect to the substrates without stopping an operation of the apparatus. Accordingly, the above-described series of processes can be continuously performed without any interruption. Thus, it is possible to avoid waste of substrates caused by the interruption of the series of processes. Therefore, the number of wasted substrates can be reduced.

BRIEF DESCRIPTION OF THE DRAWINGS

FIG. 19 is a process diagram illustrating an operation of the vacuum processing apparatus.

MODE FOR CARRYING OUT THE INVENTION

Figure 1:
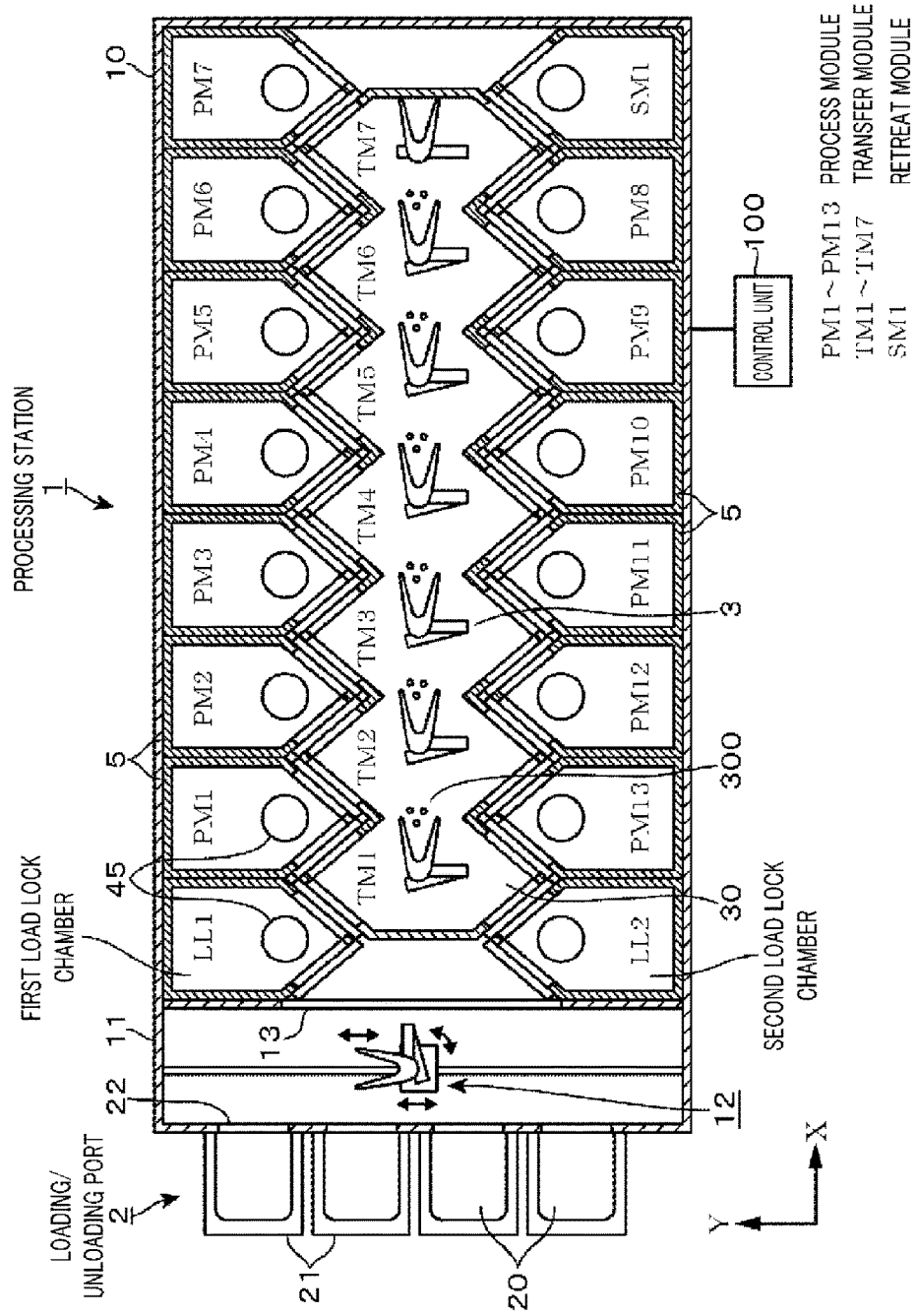
FIG. 1 is a plane view illustrating an example of a vacuum processing apparatus to which a substrate processing apparatus in accordance with an example embodiment is applied.

An example of a vacuum processing apparatus to which a substrate processing apparatus of an example embodiment is applied will be explained with reference to FIG. 1 to FIG. 18. This apparatus includes a processing station 1 arranged to be extended in an X direction (forward/backward direction) in FIG. 1 and configured to perform a process to a semiconductor wafer W (hereinafter, referred to as "wafer") as a substrate in a vacuum atmosphere. An end of the processing station 1 is connected to a loading/unloading port 2 via an atmospheric transfer module 11. The loading/unloading port 2 is configured to load and unload the wafer W with respect to the processing station 1. In the loading/unloading port 2, a mounting table 21 serving as a loading port is arranged at multiple positions, for example, four positions, in a Y direction (right and left direction) in FIG. 1. On each mounting table 21, a FOUP 20 as a transfer container accommodating, for example, 25 wafers W is mounted. Reference numeral 22 in the drawings denotes a loading/unloading opening for the wafer W.

In the atmospheric transfer module 11, an atmospheric transfer arm 12 is provided as a transfer device in order to deliver the wafer W between a process module to be described later and the FOUP 20. The atmospheric transfer arm 12 is configured to be rotated about, for example, a vertical axis, vertically moved, and moved along the arrangement of the mounting tables 21. In this example, the atmospheric transfer arm 12 is configured as a multi-joint arm in the same manner as a wafer transfer device to be described later. In FIG. 1, reference numeral 10 denotes an outer cover serving as a main body of the apparatus, and reference numeral 13 denotes an opening for transfer of wafer W.

In the processing station 1, a first load lock chamber LL1 and a second load lock chamber LL2 are provided. The first load lock chamber LL1 serves as a loading standby decompression chamber into which a wafer W is loaded at a normal pressure atmosphere. Further, the second load lock chamber LL2 serves as an unloading standby vacuum chamber from which a wafer W processed in a process module to be described later is unloaded at a normal pressure atmosphere. The first load lock chamber LL1 and the second load lock chamber LL2 are provided to be adjacent to the atmospheric transfer module 11 to access the atmospheric transfer arm 12.

Further, the processing station 1 includes multiple process modules PM (PM1 to PM13) each configured to perform a process to the wafer W, multiple transfer modules TM (TM1 to TM7), and a retreat module SM1. In each of the transfer modules TM, a wafer transfer device 3 serving as a substrate transfer device is provided.

The process modules PM are arranged in a row with a distance from each other in the forward/backward direction (X direction) along the arrangement of the first load lock chamber LL1, and arranged in a row with a distance from each other in the forward/backward direction along the arrangement of the second load lock chamber LL2. The arrangement of the process modules PM at the side of the first load lock chamber LL1 will be referred to as "first row" and the arrangement of the process modules PM at the second load lock chamber LL2 will be referred to as "second row".

The transfer modules TM are provided between the first row and the second row of the process modules PM, and arranged in a row in the forward/backward direction to deliver wafers W with respect to the process modules PM in the first row and the second row. Further, the wafer transfer device 3 of each transfer module TM is configured to deliver the wafer W with respect to two process modules PM arranged in the first row and two process modules PM arranged in the second row, and also configured to deliver the wafer W with respect to the wafer transfer device 3 of the adjacent transfer module TM.

In this example, the first row and the second row of the process modules PM are arranged to be symmetric with each other via the row of the transfer modules TM. By way of example, when viewed from the loading/unloading port 2, seven transfer modules TM1 to TM7 are provided at a central portion in the right and left direction, and when viewed from the loading/unloading port 2, seven process modules PM1 to PM7 arranged along the first load lock chamber LL1 are provided at the left side of the row of the transfer modules TM1 to TM7. Further, when viewed from the loading/unloading port 2, seven process modules PM8 to PM13 arranged along the second load lock chamber LL2 and a single retreat module SM1 are provided at the right side of the transfer modules TM1 to TM7.

Each of the transfer modules TM is provided between the adjacent load lock chamber (LL1 (LL2)) and process module (PM1 (PM13)) and between the adjacent process modules PM in the first row and the second row. Hereinafter, the loading/unloading port 2 side of the processing station 1 will be referred to as "one end side", and the one end side will be referred to as "front side" of the forward/backward direction (X direction) and the other end side will be referred to as "inner side" in the following explanation.

Figure 2:
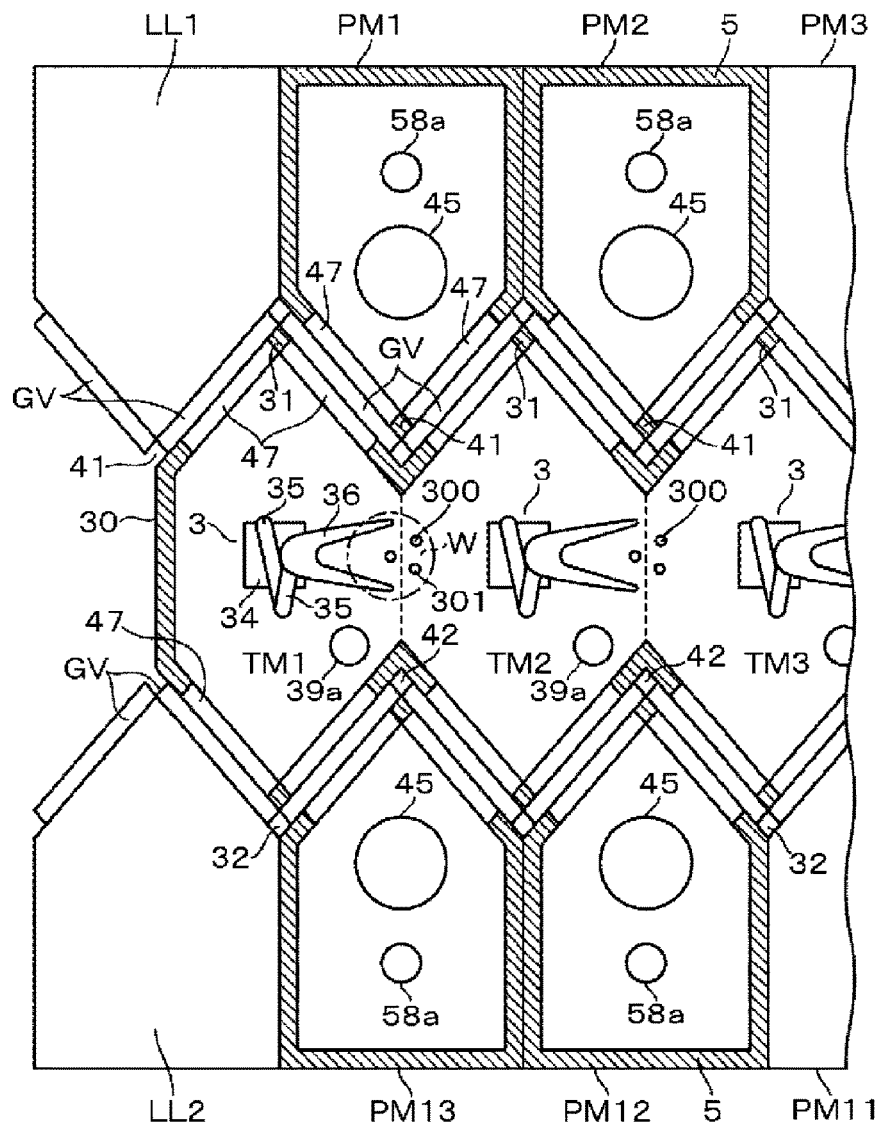
FIG. 2 is a plane view illustrating an example of process modules and transfer modules provided in the vacuum processing apparatus.

Each of the load lock chambers LL, the process modules PM, the transfer modules TM, and the retreat module SM is configured as a decompression container (processing container) which can be set to a vacuum atmosphere. A decompression container 30 of the transfer module TM is formed into an approximately hexagonal shape in a plane view as depicted in FIG. 1 and FIG. 2, and one vertex of the hexagonal shape protrudes toward the first row side and another vertex of the hexagonal shape protrudes toward the second row side. That is, the decompression container 30 of the transfer module TM includes a sidewall 31 that protrudes and bends in a V shape toward the first row side (left side) when viewed from the loading/unloading port 2; and a sidewall 32 that protrudes and bends in a V shape toward the second row side (right side) when viewed from the loading/unloading port 2.

Figure 3:
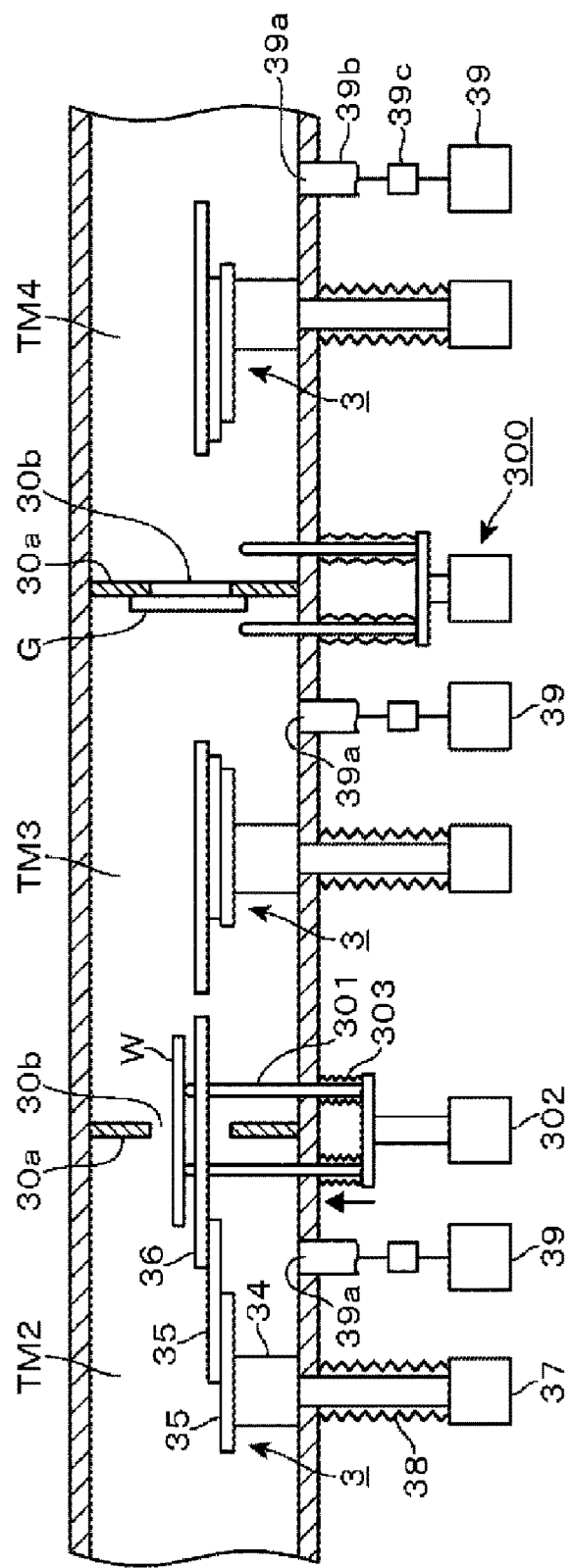
FIG. 3 is a longitudinal cross-sectional view illustrating the transfer modules provided in the vacuum processing apparatus.
Figure 4:
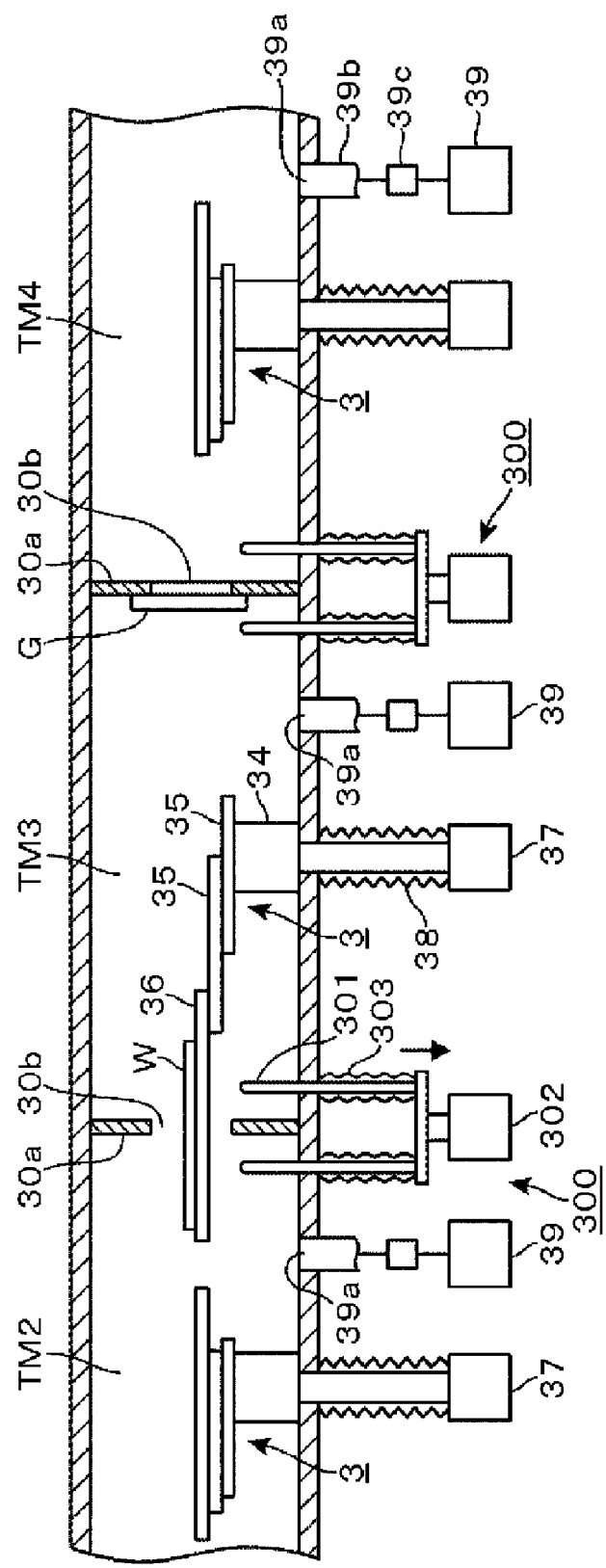
FIG. 4 is a longitudinal cross-sectional view illustrating the transfer modules provided in the vacuum processing apparatus.

The adjacent transfer modules TM are partitioned by a partition wall 30a as depicted in FIG. 3 and FIG. 4. In the partition wall 30a, an opening 30b for transferring the wafer W is formed, and the opening 30b is opened and closed by a gate valve G. As described below, in the processing station 1, a process module for an oxidation process is provided. Therefore, the gate valve G is provided to partition a transfer atmosphere and thus to suppress diffusion of oxygen. However, this gate valve G is not necessarily required, and the opening may be formed between the transfer modules. In FIG. 1 and FIG. 2, illustration of the partition wall 30a and the gate valve G is omitted for the sake of convenience of illustration, and FIG. 2 illustrates the adjacent transfer modules as being partitioned by a dotted line.

Further, decompression containers 5 in the load lock chamber LL1 and the process modules PM1 to PM7 in the first row include sidewalls 41 that protrude and bend in a V-shape toward, for example, the right side when viewed from the loading/unloading port 2 as depicted in FIG. 1 and FIG. 2. Furthermore, the sidewalls 31 of the transfer modules TM are respectively inserted between the sidewalls 41 of the adjacent load lock chamber LL1 and process modules PM1 to PM7 in the first row.

Further, decompression containers 5 in the load lock chamber LL2, the process modules PM8 to PM13, and the retreat module SM1 in the second row include sidewalls 42 that protrude and bend in a V-shape toward, for example, the left side when viewed from the loading/unloading port 2 as depicted in FIG. 1 and FIG. 2. Furthermore, the sidewalls 32 of the transfer modules TM are respectively inserted between the sidewalls 42 of the adjacent load lock chamber LL2, process modules PM8 to PM13, and retreat module SM1 in the second row.

Details of the process modules PM (PM1 to PM13) will be described later. Within each of the process modules PM, a mounting unit 45 configured to mount the wafer W is provided. Further, the wafer transfer device 3 of the transfer module TM (TM1 to TM7) is configured as a multi-joint arm as depicted in FIG. 2 to FIG. 4. This multi-joint arm includes, for example, two arms 35 and 35 stacked on, for example, a base 34; and a pick 36 provided at a front end of the upper arm 35 of the arms 35 and 35. By way of example, each wafer transfer device 3 is configured to be rotated about the vertical axis via the base 34 by a driving unit 37 provided at a lower side of the transfer module TM, and the pick 36 is configured to be moved back and forth by the driving unit 37. In FIG. 3 and FIG. 4, reference numeral 38 denotes a bellows.

As for the wafer transfer device 3, an arrangement position or increased stroke is set such that the wafer transfer device 3 can access the mounting units 45 of the four process modules PM surrounding the transfer module TM in which the wafer transfer device 3 is provided and can access a delivery stage 300 provided between the transfer module TM and the adjacent transfer module TM. By way of example, as for the transfer module TM1, the wafer transfer device 3 of the transfer module is configured to access the load lock chambers LL1 and LL2, the process modules PM1 and PM13, and the delivery stage 300 between the transfer module TM1 and the transfer module TM2.

The delivery stage 300 is provided between the adjacent transfer modules TM without being interfered with the partition wall 30a as depicted in FIG. 2 to FIG. 4. FIG. 3 and FIG. 4 schematically illustrate the transfer modules TM2 to TM4 in an example where the wafer W is delivered between the transfer module TM2 and the transfer module TM3. The delivery stage 300 includes supporting pins 301 configured to be vertically moved by, for example, an elevating device 302. The supporting pins 301 are configured such that two wafer transfer devices 3 at both sides of the supporting pins 301 can deliver the wafer W with respect to the supporting pins 301 without being interfered with each other. In the drawings, reference numeral 303 denotes a bellows.

Each of the transfer modules TM1 to TM7 is connected to a vacuum exhaust device 39 such as a vacuum pump via an exhaust line 39b through an exhaust opening 39a formed at the bottom thereof. In FIG. 3 and FIG. 4, reference numeral 39c denotes a pressure control unit. In this example, each transfer module TM is configured to be exhausted, but in the case where the gate valve G is not provided between the transfer modules TM, any one transfer module TM may be connected to a common vacuum exhaust device 39, and all of the transfer modules TM may be exhausted by the common vacuum exhaust device 39. With the above-described configuration, when the entire transfer region where the transfer modules TM1 to TM7 are connected is referred to as "transfer chamber", the wafer transfer device 3 is provided within the transfer chamber in a vacuum atmosphere. Further, each wafer transfer device 3 is configured to be horizontally rotated and moved back and forth, and the adjacent wafer transfer devices 3 can deliver the wafer W to each other within the transfer chamber.

In each decompression container of the load lock chambers LL, the process modules PM, the transfer modules TM, and the retreat module SM, a transfer opening 47 for the wafer W is formed to correspond to a moving region of the wafer transfer device 3. The transfer opening 47 is set such that the pick 36 holding the wafer W can be moved back and forth. At the transfer opening 47, a gate valve GV is provided to airtightly close the opening. In this example, a common gate valve GV is provided between the adjacent decompression containers.

As such, in the processing station 1, the row of the process modules PM and the row of the wafer transfer devices 3 are arranged such that the process modules PM, the wafer transfer devices 3 and the process modules PM are arranged in a zigzag shape. Further, the sidewalls of the process modules PM at the row of the wafer transfer devices 3 protrude toward a space between the adjacent wafer transfer devices 3, and the wafer W can be delivered from any wafer transfer device 3 at a diagonally front side and a diagonally rear side.

To be specific, the wafer transfer device 3 of the transfer module TM1 accesses the load lock chambers LL1 and LL2 and the process modules PM1 and PM13, and the wafer transfer device 3 of the transfer module TM2 accesses the process modules PM1, PM2, PM12, and PM13. Further, the wafer transfer device 3 of the transfer module TM3 accesses the process modules PM2, PM3, PM11, and PM12, and the wafer transfer device 3 of the transfer module TM4 accesses the process modules PM3, PM4, PM10, and PM11. Further, the wafer transfer device 3 of the transfer module TM5 accesses the process modules PM4, PM5, PM9, and PM10, and the wafer transfer device 3 of the transfer module TM6 accesses the process modules PM5, PM6, PM8, and PM9. Furthermore, the wafer transfer device 3 of the transfer module TM7 accesses the process modules PM6, PM7, and PM8 and the retreat module SM1.

Figure 5:
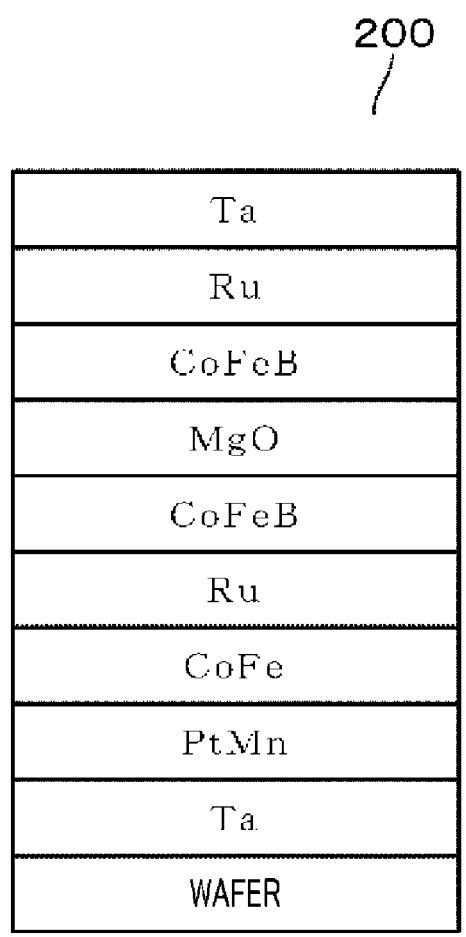
FIG. 5 is a configuration view illustrating an example of a laminated film manufactured using the vacuum processing apparatus.

Hereinafter, a configuration of each process module PM will be explained in detail in an example where a laminated film 200 having a structure depicted in FIG. 5 is formed by the above-described vacuum processing apparatus. This laminated film 200 is a configuration example of a MTJ film used in a storage device, for example, a MRAM device. This MTJ film is formed of a laminated film in which nine metal films and metal oxide films in total are laminated. In this example, the MTJ film is formed by laminating a tantalum (Ta) film, a PtMn film, a CoFe film, a ruthenium (Ru) film, a CoFeB film, a MgO (magnesium oxide) film, a CoFeB film, a Ru film, and a Ta film in sequence from the bottom. The PtMn film contains platina (Pt) and manganese (Mn), the CoFe film contains cobalt (Co) and iron (Fe), and the CoFeB film contains Co, Fe, and B (boron)

By way of example, if the MTJ film 200 is manufactured by the vacuum processing apparatus depicted in FIG. 2, a series of processes are performed to the wafer W in a vacuum atmosphere by the multiple process modules in sequence. Details of the series of processes will be described later. These processes include a film forming process of a metal film, an oxidation process of the metal film, a heating process of the metal oxide film or the metal film, a cooling process of the metal oxide film or the metal film. Therefore, a film forming module configured to perform the film forming process, an oxidation module configured to perform the oxidation process, a heating module configured to perform the heating process, and a cooling module configured to perform the cooling process are respectively provided as the process modules.

Further, in this vacuum processing apparatus, the process modules are arranged such that each of the processes can be performed by at least two process modules. Therefore, the vacuum processing apparatus includes at least two film forming modules configured to perform the same film forming process of a metal film, at least two oxidation modules, at least two film heating modules, and at least two cooling modules in order for at least two process modules to perform the same process. As for the oxidation modules, the heating modules, and the cooling modules, one module is used to process the wafer W, and the other module serves as a standby process module.

The film forming module in this example is configured as a sputtering module that forms a metal film by a sputtering method, and the same film forming process is performed using metal targets of the same kind. The film forming module (sputtering module) includes two targets as described later, and the single film forming module can form two kinds of metal films. For this reason, the same process (for example, a Ta film forming process) is included in the series of processes, and when the same process is performed by different film forming modules, two film forming modules are prepared for the same process. If the same process is not included in the series of processes, a standby film forming module is provided. Thus, the film forming modules are configured such that metal targets corresponding to the kinds of metal films constituting the laminated film 200 can be provided in at least two different film forming modules including process modules to be used in an actual process and standby process modules.

Figure 6:
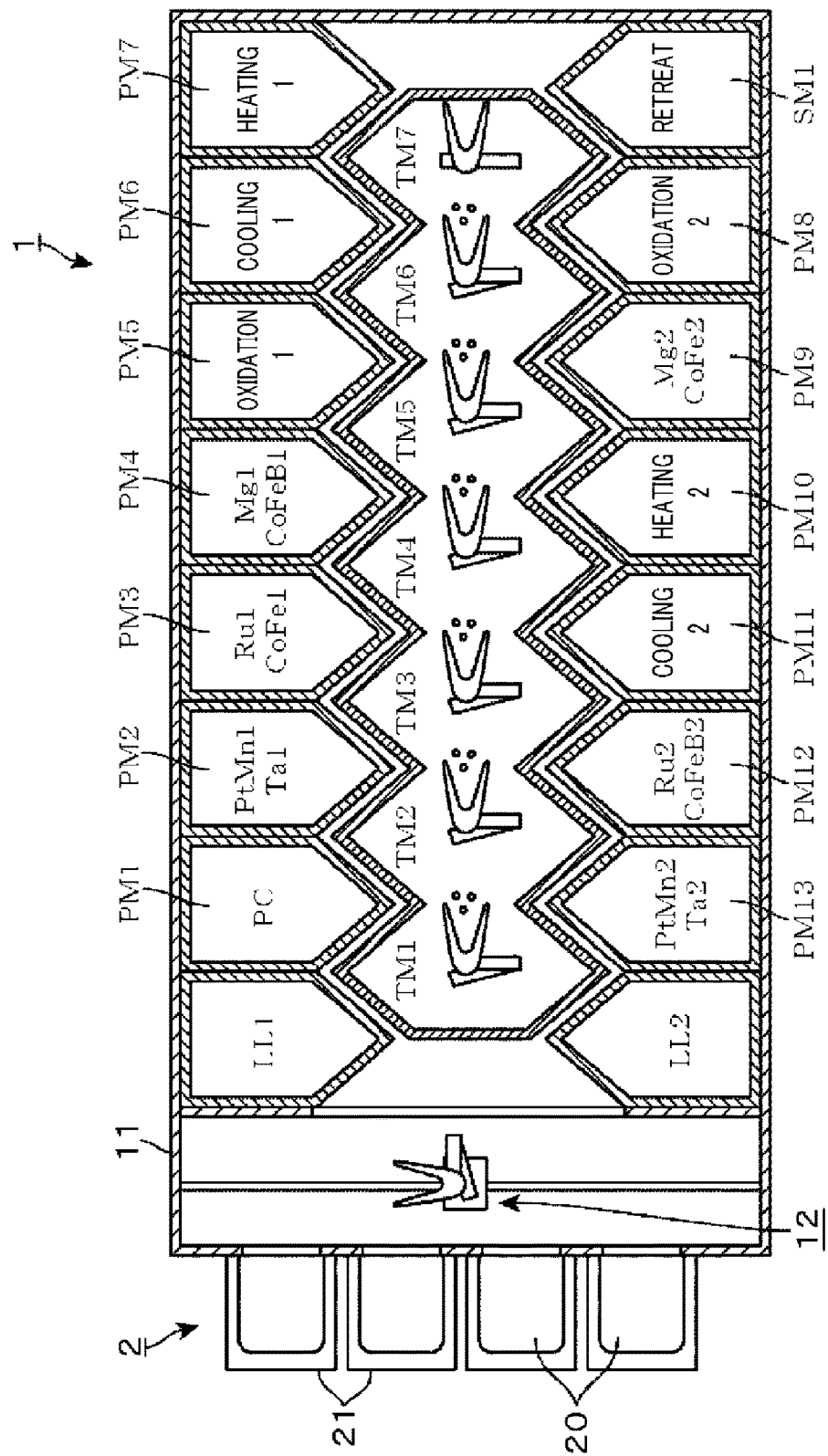
FIG. 6 is a plane view illustrating the vacuum processing apparatus.

To be specific, as depicted in FIG. 6, the process module PM1 is configured as a cleaning module that performs a pre-cleaning process to be described later, and the process modules PM2 to PM4, PM9, PM12, and PM13 are configured as film forming modules that form metal films. Further, the process modules PM5 and PM8 are configured as oxidation modules, the process modules PM7 and PM10 are configured as heating modules, and the process modules PM6 and PM11 are configured as cooling modules. Further, in FIG. 6, for the sake of convenience of illustration, illustration of the transfer opening 47, the opening 30b, the partition wall 30a, and the gate valves G and GV is omitted.

In this example, the process module PM2, the process module PM3, and the process module PM4 are configured as film forming modules configured to form a PtMn film and a Ta film, a CoFe film and a Ru film, and a CoFeB film and a Mg film, respectively. Further, the process module PM9, the process module PM12, and the process module PM13 are configured as film forming modules configured to form a CoFe film and a Mg film, a CoFe film and a Ru film, and a Ta film and a PtMn film, respectively.

Therefore, as depicted in FIG. 6, the two film forming modules PM2 and PM13 are provided for forming the Ta film and the PtMn film, and the two film forming modules PM3 and PM9 are provided for forming the CoFe film. Further, the two film forming modules PM3 and PM12 are provided for forming the Ru film, the two film forming modules PM4 and PM12 are provided for forming the CoFeB film, and the two film forming modules PM4 and PM9 are provided for forming the Mg film. Furthermore, the two oxidation modules PM5 and PM8, the two heating modules PM7 and PM10, and the two cooling modules PM6 and PM11 are provided. In FIG. 6, numerals "1" and "2" are assigned for convenience to explain that there are two process modules PM that perform the same process. By way of example, Ta1 and Ta2 are the film forming processes of forming the Ta film of the same kind.

Hereinafter, each process module PM will be explained in detail. The cleaning module is configured to perform any one of a surface cleaning process, a high-temperature hydrogen reduction process, a hydrogen radical process. The surface cleaning process is a process of cleaning a surface of the wafer W by sputter etching with an Ar gas, and the high-temperature hydrogen reduction process is a process of reducing an oxide on the surface of the wafer W by heating the wafer W and supplying a hydrogen ($H_2$) gas. Further, the hydrogen radical process is a process of reducing an oxide on the surface of the wafer W by supplying hydrogen radicals to the surface of the wafer W.

Figure 7:
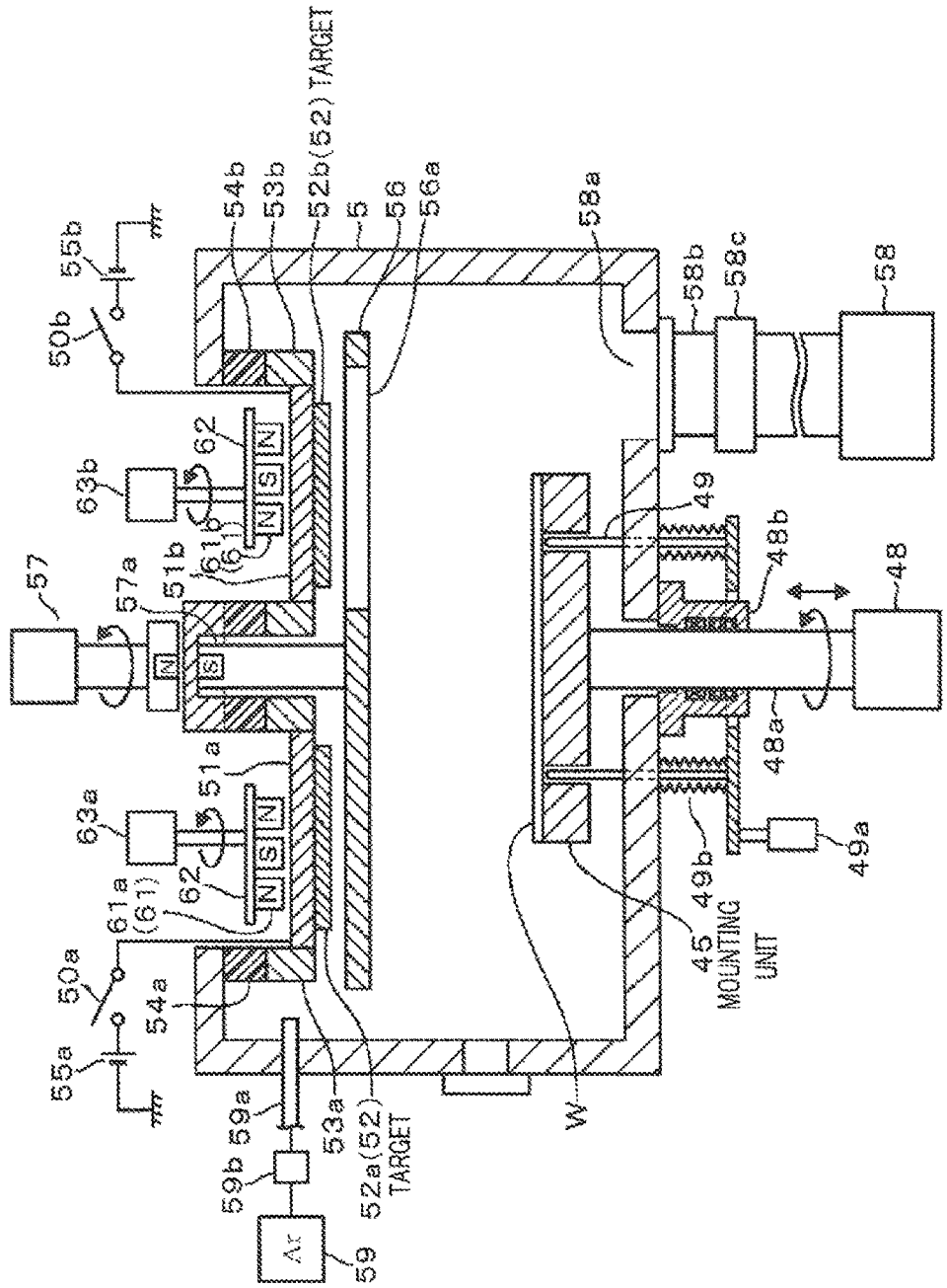
FIG. 7 is a longitudinal cross-sectional view illustrating an example of a film forming module (sputtering module).

A configuration of the film forming module will be explained using the process module PM2 as an example with reference to FIG. 7 to FIG. 16. In FIG. 7, reference numeral 5 denotes a decompression container (processing container) constituting the process module, and the decompression container 5 is made of a conductive material such as stainless steel. At an upper portion of the decompression container 5, two target electrodes 51a and 51b are provided. Targets 52a and 52b are provided to lower portions of the target electrodes 51a and 51b, respectively. The targets 52a and 52b are formed into a square shape or a rectangular shape. These targets 52a and 52b are film forming target members with respect to the wafer W, and made of metals different from each other. The target 52a is made of Ta and the target 52b is made of PtMn.

By way of example, the target electrodes 51a and 51b are formed to be larger than the targets 52a and 52b, and provided to insulators 54a and 54b via holders 53a and 53b, respectively. These insulators 54a and 54b are press-connected to a ceiling portion of the decompression container 5, and, thus, the target electrodes 51a and 51b are electrically insulated from the decompression container 5. Further, the target electrodes 51a and 51b are connected to DC power supplies 55a and 55b via switches 50a and 50b, respectively, and negative DC voltages are applied to the target electrodes 51a and 51b.

Figure 8:
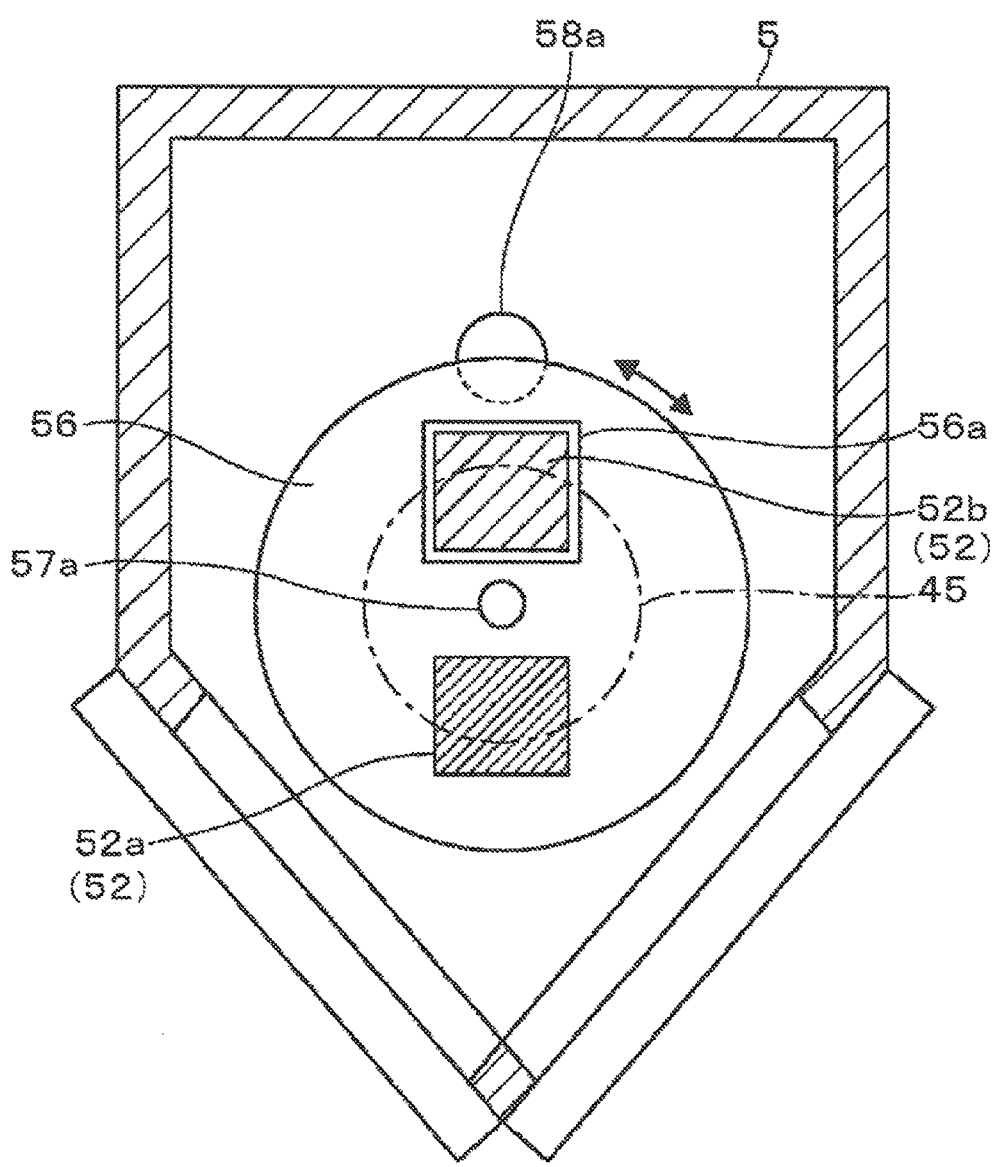
FIG. 8 is a plane view illustrating an example of the film forming module.

Right under the targets 52a and 52b, a target shutter 56 is provided. As depicted in FIG. 8, the target shutter 56 is formed into, for example, a circular shape, and includes an opening 56a having substantially the same size and the same shape as the targets 52a and 52b. FIG. 8 is a plane view when viewed from the targets 52a and 52b. In FIG. 8, the opening 56a is illustrated as being slightly greater than the targets 52a and 52b. At an upper central portion of the target shutter 56, a rotation shaft 57a is provided, and the rotation shaft 57a is configured to be rotated by a rotation device 57 provided at an outside of the decompression container 5. In this example, the rotation device 57 is configured to rotate the rotation shaft 57a by a magnetic force. When the target shutter 56 is rotated as such, the targets 52a and 52b and the target shutter 56 are configured such that the target 52a and the opening 56a correspond to each other at one position, and the target 52b and the opening 56a correspond to each other at another position.

Figure 9:
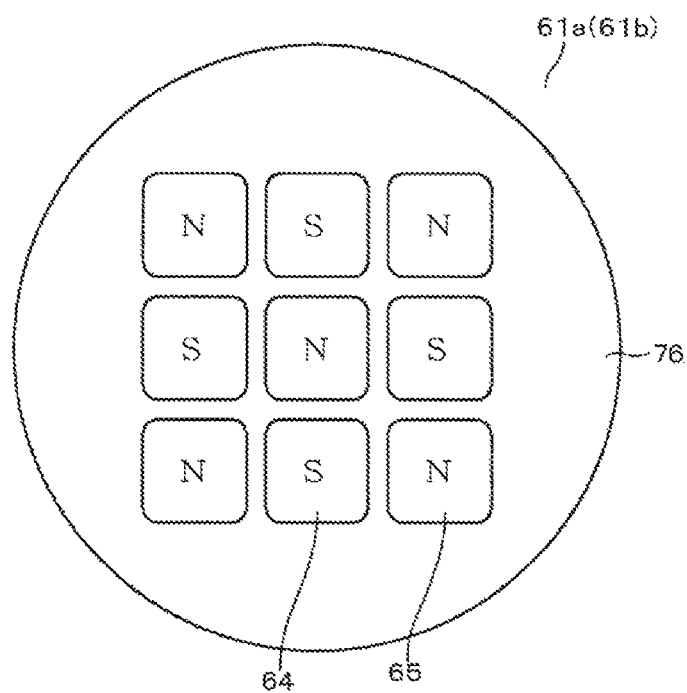
FIG. 9 is a plane view illustrating an example of a magnet arrangement unit provided in the film forming module.

Above the targets 52a and 52b, magnet arrangement units 61a and 61b are provided to be close to the target electrodes 51a and 51b, respectively. The magnet arrangement units 61a and 61b are configured, for example, as depicted in FIG. 9, by arranging magnets 64 and 65 on a base body 76 made of a high-permeability material such as iron (Fe). FIG. 9 is a plane view when the magnet arrangement units 61a and 61b are seen from the targets 52a and 52b.

By way of example, central portions of the magnet arrangement units 61a and 61b are biased to a certain degree from central portions of the targets 52a and 52b, respectively. Further, the magnet arrangement units 61a and 61b are configured to be rotated by rotation devices 63a and 63b around the vicinities of the central portions of the targets 52a and 52b, respectively. As such, the magnet arrangement units 61a and 61b are rotated while being biased from the central portions of the targets 52a and 52b, respectively. Thus, non-uniform progress of erosion (abrasion caused by consumption of the targets) is suppressed, and a decrease in application efficiency of the targets 52a and 52b is suppressed.

Further, in the decompression container 5, the mounting unit 45 configured to horizontally mount the wafer W is provided to face a target group including the targets 52a and 52b. This mounting unit 45 is configured to be movable vertically and rotatable by a driving device 48 via a driving shaft 48a. In FIG. 7, reference numeral 48b denotes a sealing device using a ferrofluid. A non-illustrated heating device is provided within the mounting unit 45, and configured to heat the wafer W, if necessary. Further, the mounting unit 45 includes delivery pins 49 for delivering the wafer W with respect to the wafer transfer device 3 during loading/unloading of the wafer W. In FIG. 7, reference numeral 49a denotes an elevating device for the delivery pins 49, and reference numeral 49b denotes a bellows. Further, in FIG. 10 to FIG. 14, illustration of the delivery pins 49 is omitted.

Further, the decompression container 5 is connected to a vacuum exhaust device 58 such as a vacuum pump via an exhaust line 58b and a pressure control unit 58c through an exhaust opening 58a formed at the bottom thereof. Further, at a side surface of the decompression container 5, as described above, the transfer opening 47 for the wafer W that is opened and closed by the gate valve GV is formed. Furthermore, a gas supply unit 59a is provided at an upper portion of the decompression container 5, and connected to a supply source for an inert gas, such as an Ar gas, for plasma generation via a flow rate control unit 59b including a valve, a flow meter, and the like.

Figure 10:
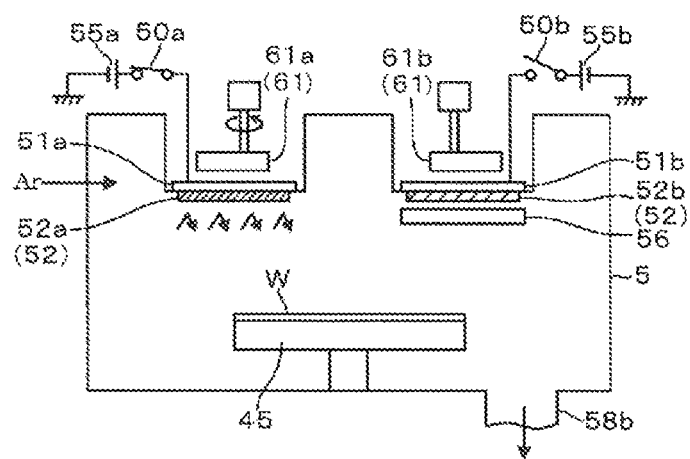
FIG. 10 is a longitudinal cross-sectional view illustrating an operation of the film forming module.

In this film forming module (process module PM2), a film forming process of forming a Ta film is performed first. In forming such a Ta film, as depicted in FIG. 10, the wafer W is mounted on the mounting unit 45, and the opening 56a of the target shutter 56 is positioned under the target 52a. Thus, the target 52b is in a state of being covered by the target shutter 56 when viewed from the wafer W. Further, an Ar gas is introduced into the decompression container 5, and a negative DC voltage is applied from the DC power supply 55a to the target electrode 51a via the switch 50a, and the magnet arrangement unit 61a is rotated. Thus, the Ar gas is ionized by an electric field, so that electrons are generated. Further, a horizontal magnetic field is formed under the target 52a by the magnet arrangement unit 61a. The electrons are drifted by the horizontal magnetic field and the electric field, so that high-density plasma is generated. As such, Ar ions in the plasma sputter the target 52a to beat Ta metal particles from the target 52a. With the released metal particles, the Ta film is formed on the wafer W.

Figure 11:
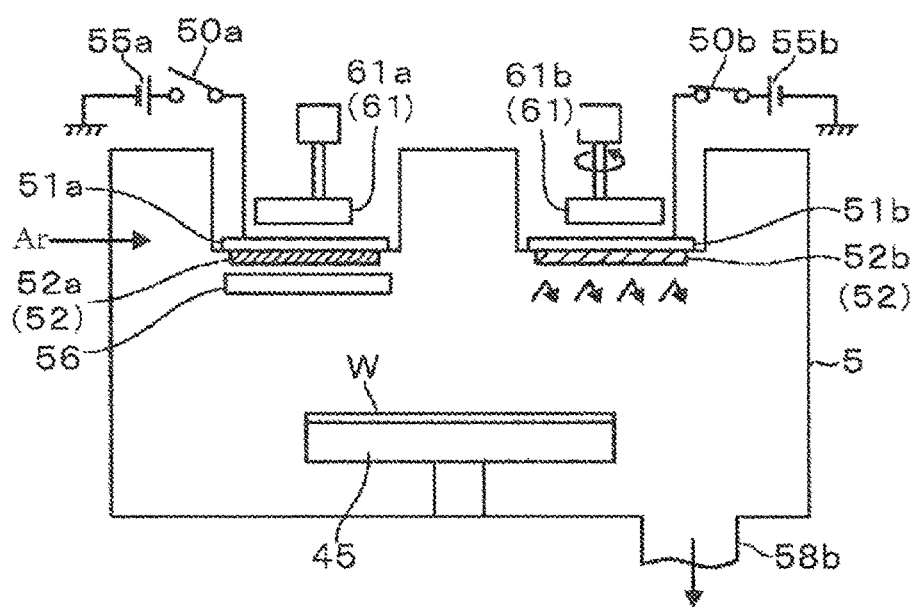
FIG. 11 is a longitudinal cross-sectional view illustrating an operation of the film forming module.

Then, a film forming process of forming a PtMn film is performed. In forming such a PtMn film, as depicted in FIG. 11, the target shutter 56 is arranged such that the opening 56a thereof is positioned under the target 52b. Thus, the target 52a is in a state of being covered by the target shutter 56 when viewed from the wafer W. Further, the switch 50a is turned off and the switch 50b is turned on, and then, a negative DC voltage is applied from the DC power supply 55b to the target electrode 51b. Furthermore, an Ar gas is introduced into the decompression container 5, and the magnet arrangement unit 61b is rotated. As such, high-density plasma is generated, and Ar ions in the plasma sputter the target 52*b* to beat PtMn metal particles therefrom. With the released metal particles, the PtMn film is formed on the Ta film on the wafer W.

The process modules (film forming modules) PM3, PM4, PM9, PM12, and PM13 have the same configuration as the process module PM2 except different kinds of the targets 52*a* and 52*b*. By way of example, the targets 52*a* and 52*b* are respectively made of CoFe and Ru in the process module PM3, respectively made of CoFeB and Mg in the process module PM4, and respectively made of CoFe and Mg in the process module PM9. Further, the targets 52*a* and 52*b* are respectively made of CoFeB and Ru in the process module PM12 and respectively made of Ta and PtMn in the process module PM13. As such, in each process module, two metal films different from each other may be formed by the magnetron sputtering method.

Figure 12:
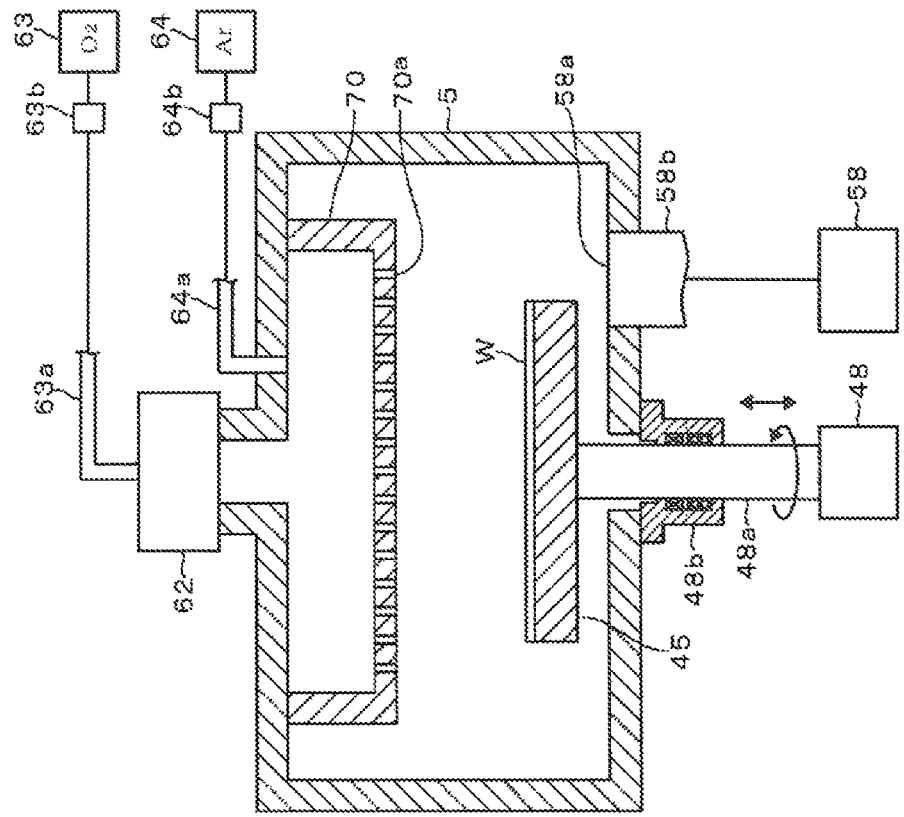
FIG. 12 is a longitudinal cross-sectional view illustrating an example of an oxidation module.

The oxidation module is configured as depicted in, for example, FIG. 12. In FIG. 12, the same parts as those of the film forming module depicted in FIG. 7 are assigned the same reference numerals, and explanation thereof will be omitted. In the oxidation module, a gas supply room 70 is provided to face the mounting unit 45 within the decompression container 5. At a lower surface of the gas supply room 70, multiple gas supply holes 70*a* are formed. At the decompression container 5, a remote plasma generation unit 62 is provided. An $O_2$ gas is supplied to the remote generation unit 62 from a supply source 63 for an oxidation gas, such as an $O_2$ gas, through a supply line 63*a* including a flow rate control unit 63*b*. Thus, the $O_2$ gas is radicalized by plasma generated through the remote plasma generation unit 62 and then supplied to the gas supply room 70. Further, the gas supply room 70 is connected to an inert gas supply source 64, such as an Ar gas, via a supply line 64*a* including a flow rate control unit 64*b*. The Ar gas is used as a dilution gas. As such, 100% $O_2$ gas radicals or $O_2$ radicals diluted to a certain concentration by the Ar gas are supplied to the wafer W on the mounting unit 45, and the metal film (Mg film) formed on the wafer W is oxidized with the $O_2$ radicals, so that a metal oxide film (MgO film) is formed.

Figure 13:
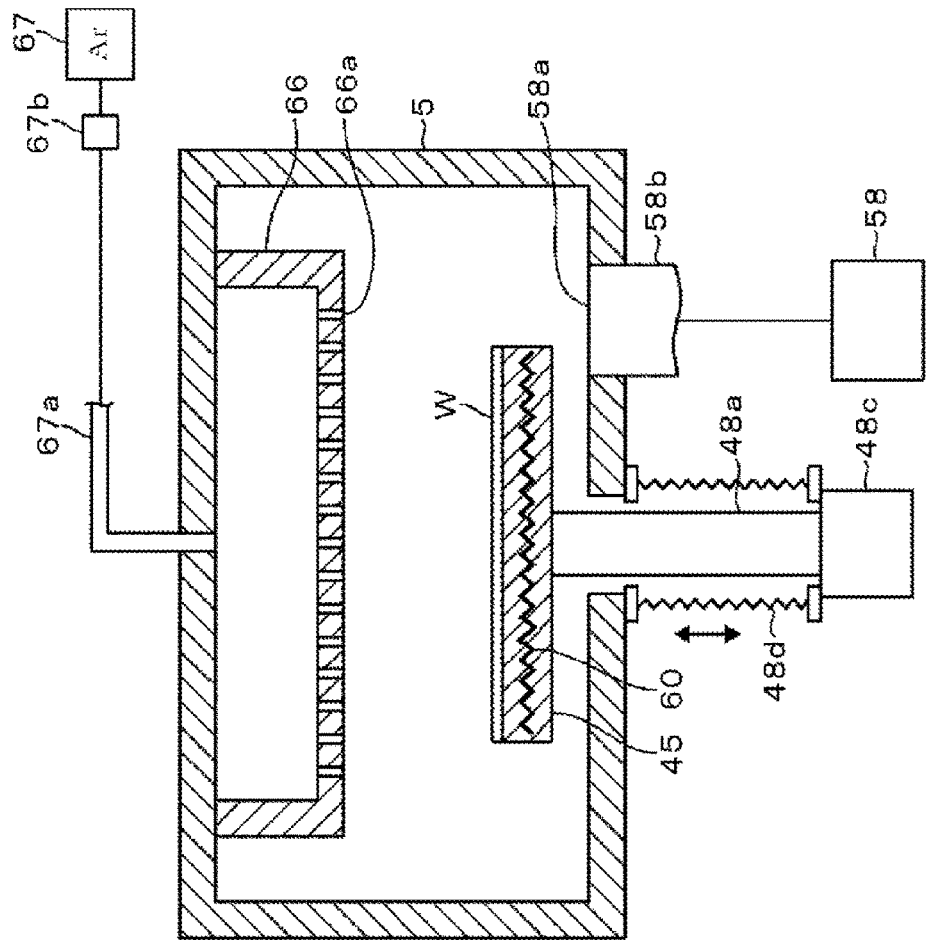
FIG. 13 is a longitudinal cross-sectional view illustrating an example of a heating module.

The heating module is configured as depicted in, for example, FIG. 13. In FIG. 13, the same parts as those of the film forming module depicted in FIG. 7 are assigned the same reference numerals, and explanation thereof will be omitted. In the heating module, a gas supply room 66 including multiple gas supply holes 66*a* is provided to face the mounting unit 45 within the decompression container 5. The gas supply room 66 is connected to an inert gas supply source 67, such as an Ar gas, via a supply line 67*a* including a flow rate control unit 67*b*. Within the mounting unit 45, a heater 60 as a heating member is embedded. By the heater 60, a surface of the mounting unit 45 is heated to a certain temperature. Further, the mounting unit 45 in this example is configured to be movable vertically by an elevating device 48*c*, and a bellows 48*d* is provided as a sealing member. In the heating module, an Ar gas is supplied into the decompression container 5, and the inside of the decompression container 5 is exhausted to heat the wafer W to, for example, 250° C. to 350° C. Thus, a thermal annealing process is performed to the metal oxide film (MgO film) formed on the surface of the wafer W. The thermal annealing process is performed as such in order to control (improve) crystalline orientation of the metal oxide film.

Figure 14:
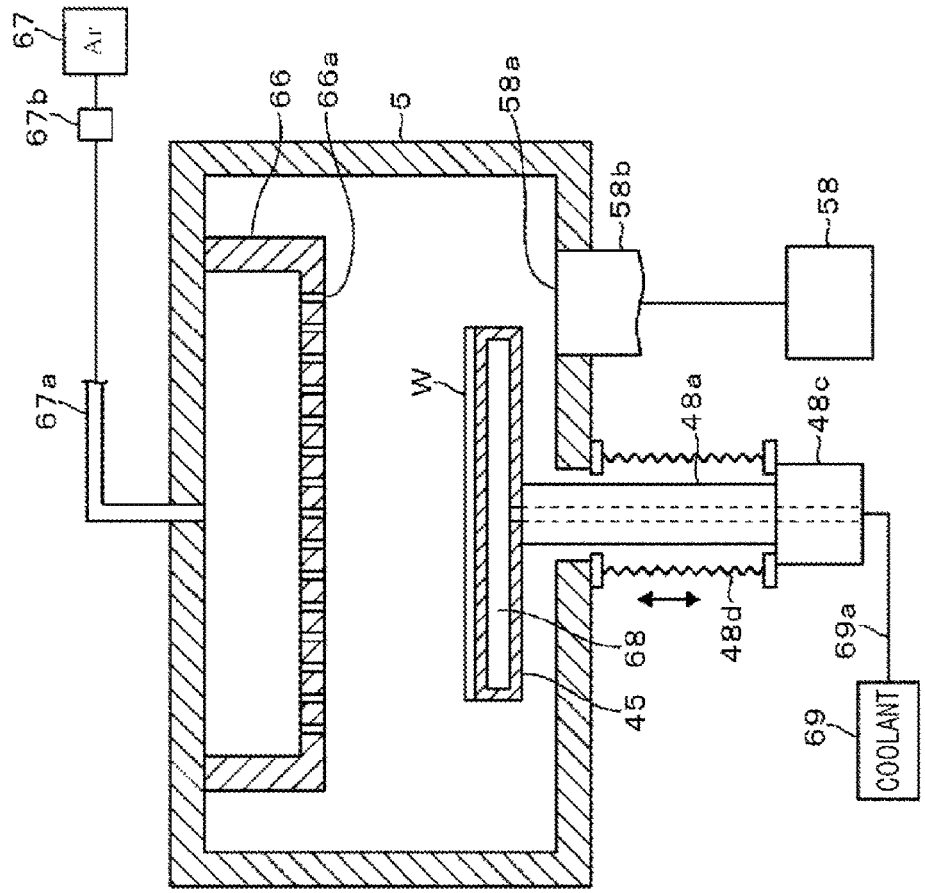
FIG. 14 is a longitudinal cross-sectional view illustrating an example of a cooling module.

The cooling module is configured as depicted in, for example, FIG. 14. In FIG. 14, the same parts as those of the film forming module depicted in FIG. 7 and those of the heating module depicted in FIG. 13 are assigned the same reference numerals, and explanation thereof will be omitted. In the cooling module, a cooling jacket 68 is formed within the mounting unit 45. In the cooling jacket 68, a temperature-controlled coolant supplied from a coolant supply source 69 through a supply line 69*a* is circulated, and the mounting unit 45 is adjusted to a certain temperature. In the cooling module, an Ar gas is supplied into the decompression container 5, and the inside of the decompression container 5 is exhausted to cool the wafer W to, for example, 80° C. or less. Thus, the wafer W heated by the thermal annealing process in the previous process is cooled to be suitable for forming a metal film in the subsequent process.

Figure 15:
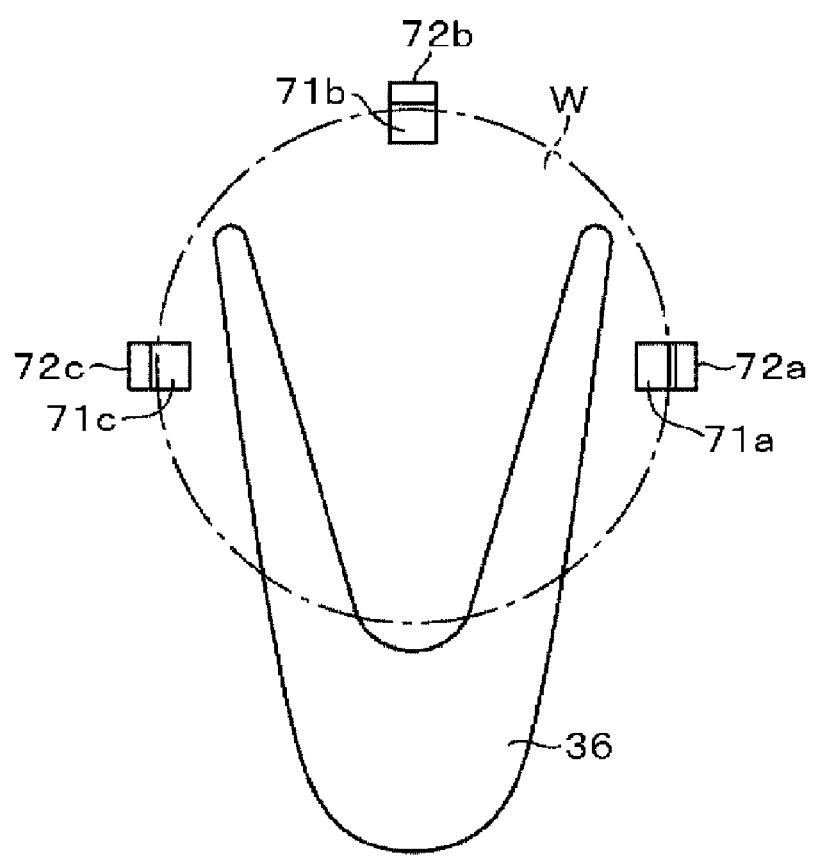
FIG. 15 is a plane view illustrating an example of a retreat module.
Figure 16:
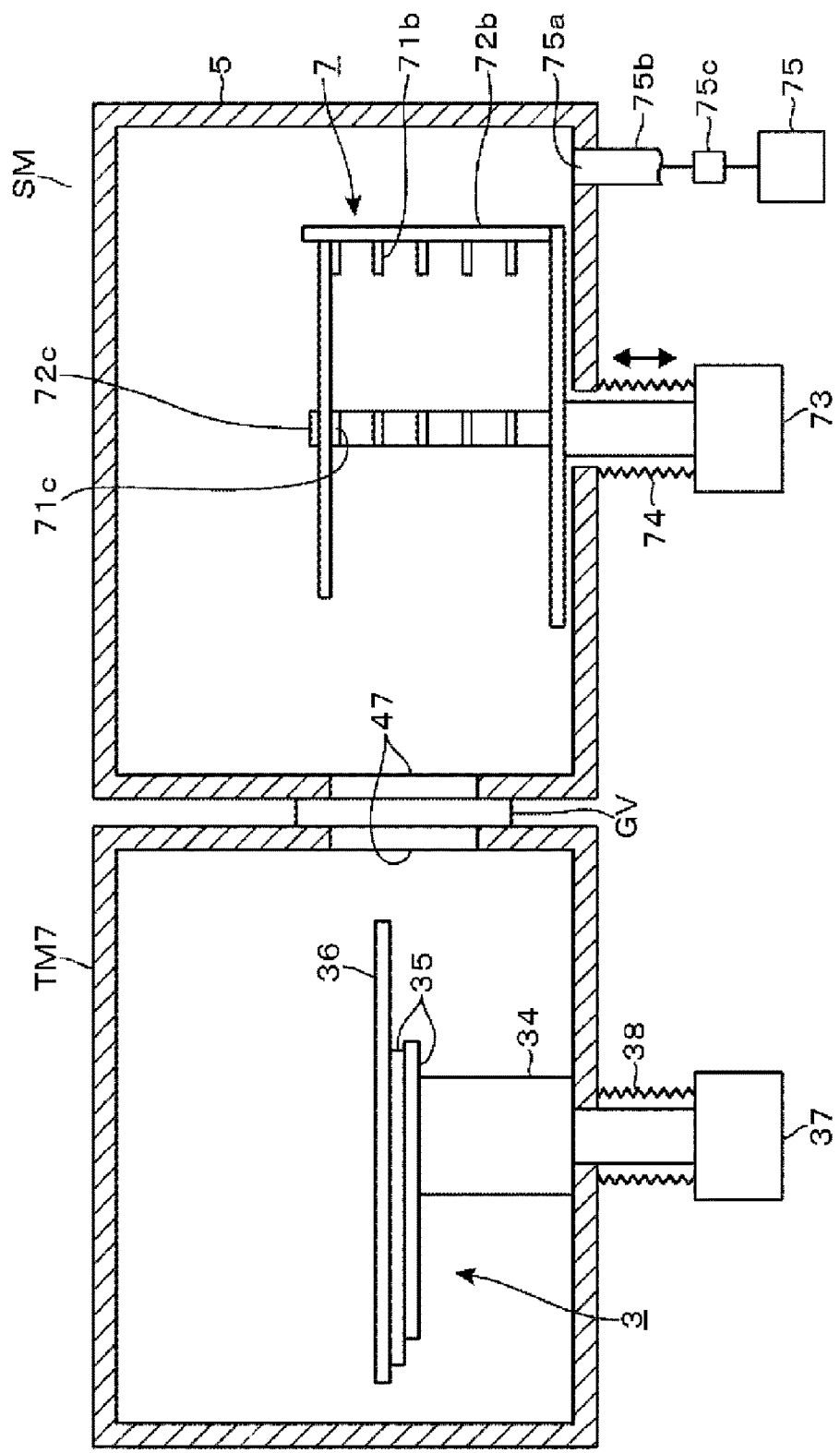
FIG. 16 is a longitudinal cross-sectional view illustrating an example of the retreat module.

The retreat module SM1 is a module to which a wafer W positioned within a process module is temporally retreated when the process module included in the row of the process modules cannot be used, and the retreat module SM1 is connected to the transfer chamber (transfer module TM7). The retreat module SM1 includes a shelf 7 in which holders 71*a* to 71*c* supporting, for example, three portions of the periphery of the wafer W are arranged at multiple levels as depicted in FIG. 15 and FIG. 16. The holders 71*a* to 71*c* are provided at, for example, three supporting columns 72*a* to 72*c* constituting the shelf 7, respectively. Shapes and positions of the holders 71*a* to 71*c* are set such that a wafer W can be delivered between the holders 71*a* to 71*c* and the pick 36 of the wafer transfer device 3 without being interfered with each other. Further, in order to deliver a wafer W with respect to the wafer transfer device 3, the shelf 7 is configured to be movable vertically by an elevating device 73. Furthermore, the decompression container 5 of the retreat module SM1 is connected to a vacuum exhaust device 75 such as a vacuum pump via an exhaust line 75*b* through an exhaust opening 75*a* formed at the bottom thereof. In FIG. 16, reference numeral 75*c* denotes a pressure control unit and reference numeral 74 denotes a bellows. In this example, a pressure within the decompression container 5 of the retreat module SM1 is set such that a vacuum degree is higher (a pressure is lower) than that of the decompression container 30 of the transfer module TM. By way of example, the inside of the decompression container 5 of the retreat module SM1 is adjusted to a pressure of 6.67 E-7 Pa or less.

The vacuum processing apparatus includes a control unit 100 formed of, for example, a computer as depicted in FIG. 1. The control unit 100 includes a data processing unit formed of a program, a memory, and a CPU. The program is used to control a series of operations of the vacuum processing apparatus, and includes a transfer program that defines a sequence of transferring wafers W and process programs for processing wafers W within the respective process modules PM.

Figure 17:
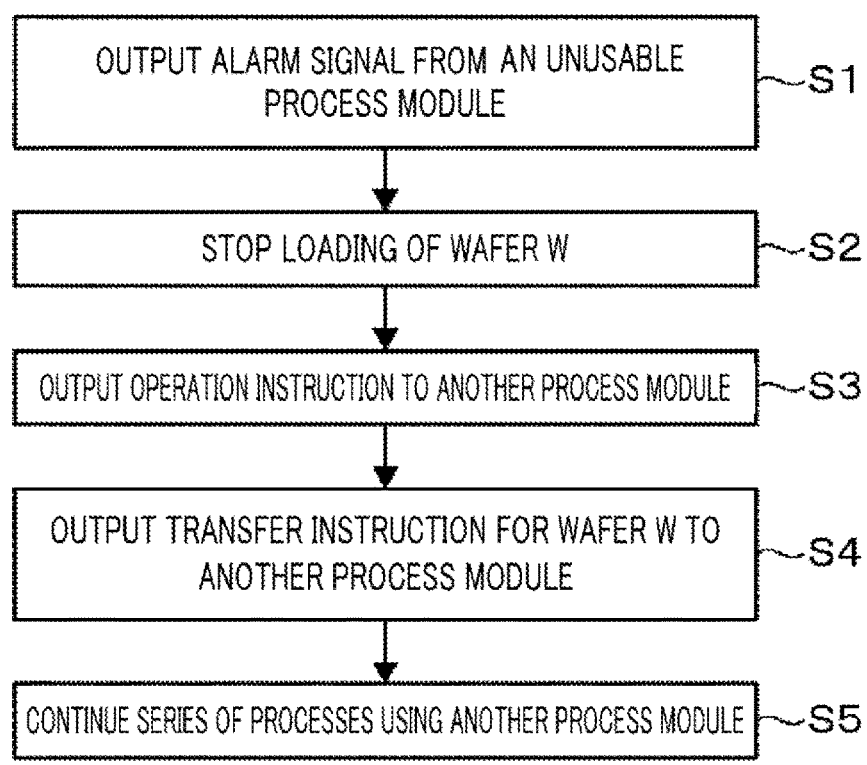
FIG. 17 is a process diagram illustrating an operation of the vacuum processing apparatus.

Further, when a process module included in the row of the process modules PM cannot be used, the control unit 100 is configured to output a control signal to continue the process which is performed in the process module to the wafer W, in another process module that can perform the same process as performed in the corresponding process module. By way of example, as depicted in FIG. 17, when a process module included in the row of the process modules cannot be used, an alarm signal is outputted from the corresponding process module which cannot be used (process S1). When the control unit 100 receives the alarm signal, the loading of a new wafer W from the load lock chamber LL1 to the process module PM1 is stopped (process S2). Then, another process module that can perform the same process as performed in the corresponding process module is selected, and an operation instruction is outputted to the another process module (process S3). Further, a transfer instruction to transfer the wafer W not to the process module but to the another process module is outputted (process S4). As such, the series of processes are continued to the wafer W by the another process module (process S5).

Further, the control unit 100 outputs a control signal to preferentially unload the wafer W of which the processing result may be deteriorated if the wafer W processed in the process module is left in the corresponding process module. The term "preferentially" means that the wafer W of which the processing result may be deteriorated is unloaded from the process module before transferring a group of the wafers W of which processing result is not deteriorated even when the wafers W processed in the process modules are respectively left in the corresponding process modules. A detailed example of the preferential transfer will be explained later.

Figure 18:
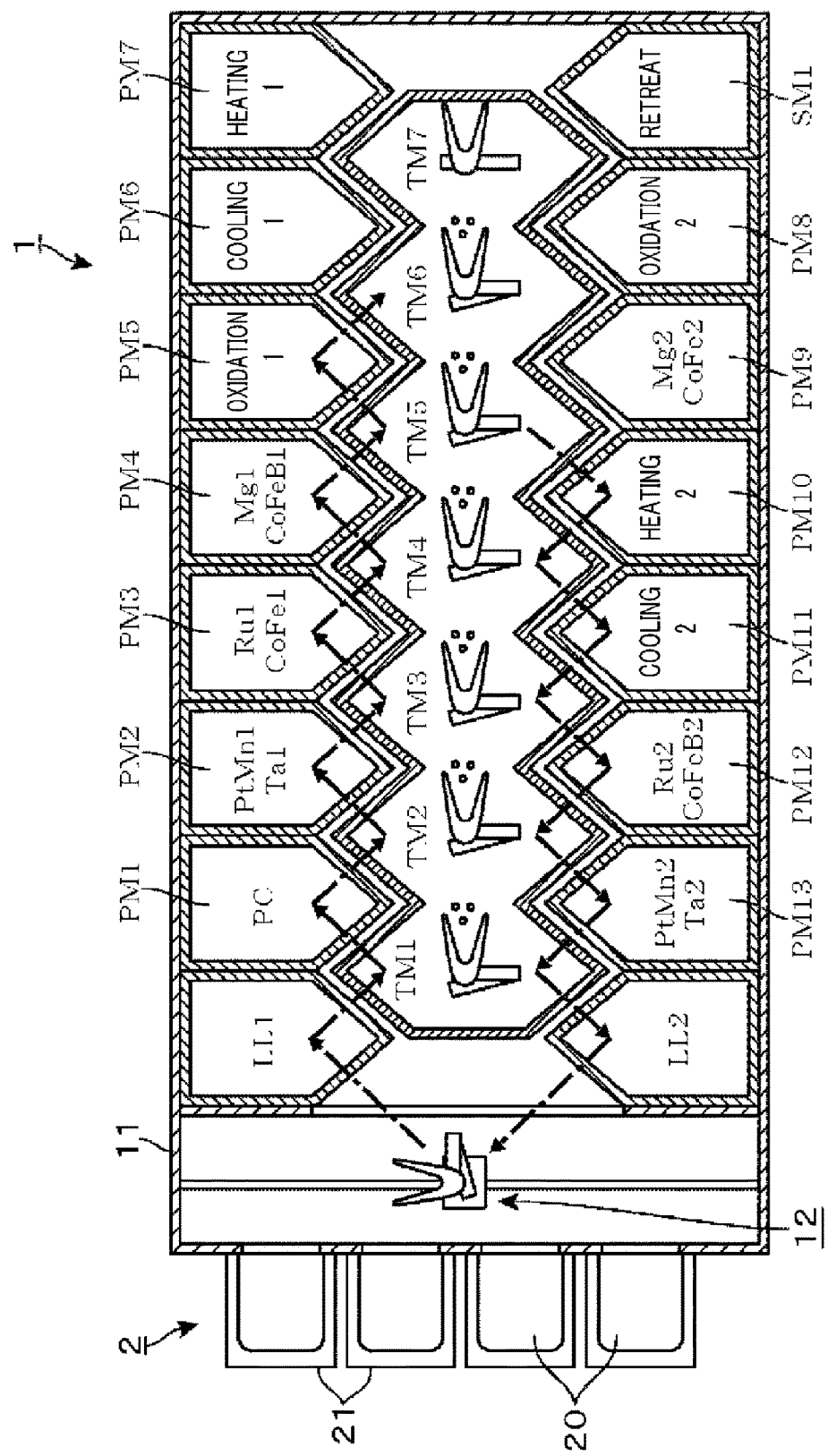
FIG. 18 is a plane view illustrating a transfer route for a wafer within the vacuum processing apparatus.

Hereinafter, an operation of the vacuum processing apparatus in a normal state will be explained with reference to FIG. 18 and FIG. 19. Herein, a series of operations are executed by the program, and a wafer W is transferred according to a transfer pattern as depicted in FIG. 18. The wafer W in the FOUP 20 mounted in the loading/unloading port 2 is received by the atmospheric transfer arm 12, and then, transferred into the first load lock chamber LL1 in a normal pressure atmosphere. Then, the inside of the first load lock chamber LL1 is set to a vacuum atmosphere, and then, the wafer W is received by the wafer transfer device 3 of the transfer module TM1 to be transferred into the process module PM1. In the process module PM1, the above-described pre-cleaning process is performed (process A).

Then, the wafer W in the process module PM1 is transferred to the process module PM2 by the wafer transfer device 3 in the transfer module TM2, and a Ta film forming process (process B) and a PtMn film forming process (process C) are performed to the surface of the wafer W. Then, the wafer W is transferred to the process module PM3 by the wafer transfer device 3 in the transfer module TM3, and a CoFe film forming process (process D) and a Ru film forming process (process E) are performed therein. Thereafter, the wafer W is transferred to the process module PM4 by the wafer transfer device 3 in the transfer module TM4, and a CoFe film forming process (process F) and a Mg film forming process (process G) are performed therein.

Then, the wafer W is transferred to the process module PM5 by the wafer transfer device 3 in the transfer module TM5, and an oxidation process (process H) of a Mg film is performed, so that a MgO film is formed. Then, the wafer W is received by the wafer transfer device 3 in the transfer module TM6 and transferred to the wafer transfer device 3 in the transfer module TM5 through the delivery stage 300. Then, the wafer W is transferred to the process module PM10 by the wafer transfer device 3, and a heating process (process I) of the MgO film is performed. Then, the wafer W is transferred to the process module PM11 by the wafer transfer device 3 in the transfer module TM4, and a cooling process (process J) of the MgO film is performed. Then, the wafer W is transferred to the process module PM12 by the wafer transfer device 3 of the transfer module TM3, and a CoFeB film forming process (process K) and a Ru film forming process (process L) are performed. Then, the wafer W is transferred to the process module PM13 by the wafer transfer device 3 in the transfer module TM2, and a Ta film forming process (process M) is performed. As such, the laminated film 200 is manufactured.

The wafer W in the process module PM13 is transferred into the second load lock chamber LL2 set to a vacuum atmosphere by the wafer transfer device 3 in the transfer module TM1. Then, if the atmosphere within the load lock chamber LL2 is set to a normal pressure atmosphere, a downstream gate valve GV is opened to return the wafer W to, for example, the FOUP 20 by the atmospheric transfer arm 12. Herein, when a load lock chamber is referred to as "LL" and a process module is referred to as "PM", in the processing station 1, the wafer W is transferred through a route of LL1→PM1→PM2→PM3→PM4→PM5→PM10→ PM11→PM12→PM13→LL2.

At this time, a first wafer W1 of the lot is loaded into the processing station 1. By way of example, after the first wafer W1 in the lot is unloaded from the FOUP 20 and delivered to the load lock chamber LL1, the atmospheric transfer arm 12 moves to receive the second wafer W2 in the lot within the FOUP 20. Then, after the wafer W1 is transferred to the process module PM1 from the load lock chamber LL1, the wafer W2 is transferred to the load lock chamber LL1. As such, if the first wafer W1 in the lot is transferred from the upstream process module PM1 to the process module PM2 at the one lower downstream side, the second wafer W is transferred to the upstream process module PM1. As such, if previous wafers W are delivered from an upstream process module PM to a downstream process module PM in sequence from the first wafer W of the lot and the upstream process module PM is empty, the next wafer W is transferred to the upstream process module PM.

In this example, the single wafer transfer device 3 delivers the wafers W between two process modules PMs in the first row and between two process modules PMs in the second row. Thus, if the wafers W are present in both of the first row and the second row, for example, the wafer W in the second row is transferred first and then the wafer W in the first row is transferred. In this case, in the first row and the second row, for example, the wafers W are transferred from the upstream to the downstream in the lump (at the same time). By way of example, if the respective vacuum processes are ended in the process modules PM10 to PM13 in the second row, gas supply into the decompression container 5 and plasma generation are stopped. Then, the delivery pins 49 are raised, so that the wafer W is lifted up above the mounting unit 45 by the delivery pins 49. Thereafter, the upstream and downstream gate valves GV of the respective process modules PM10 to PM13 are opened. Further, the wafer transfer devices 3 of the transfer modules TM1 to TM4 receive the wafers W from the upstream process modules PM10 to PM13, and then, the wafer transfer devices 3 are retreated (retracted) in the lump at the same time to transfer the wafers W to the transfer modules TM1 to TM4. Then, the wafer transfer devices 3 are respectively extended toward their downstream sides, and deliver the wafers W into the process modules PM11 to PM13 and the load lock chamber LL2 on their downstream sides.

Thereafter, the gate valves GV between the process modules PM10 to PM13 and the transfer modules TM1 to TM4, respectively, and between the transfer module TM1 and the load lock chamber LL2 are airtightly closed. Meanwhile, the gate valve GV at the downstream side of the load lock chamber LL2 is opened. Then, wafers W are loaded into the process modules PM10 to PM13 and the load lock chamber LL2 in the second row at the same time. Thereafter, likewise, wafers W are transferred from the process modules PM1 to PM5 and the load lock chamber LL1 in the first row to the transfer modules TM1 to TM6 at the same time when a wafer W is transferred from the atmospheric transfer arm 12 to the load lock chamber LL1. Then, wafers W are transferred from the transfer modules TM1 to TM5 to the process modules PM1 to PM5 at the same time when a wafer W is transferred to the delivery stage 300 between the transfer modules TM6 and TM5. As such, the wafers W are transferred with respect to the load lock chamber LL1 and the process modules PM1 to PM5 in the first row and the delivery stage 300. Then, the wafers W in the second row are transferred. Herein, when the wafer transfer devices 3 transfer the wafers W to the process modules PM11 to PM13 and the load lock chamber LL2, the wafer W is transferred from the delivery stage 300 to the process module PM10. As such, wafers W are delivered in sequence from the upstream process module PM to the downstream process module PM, and the above-described laminated film 200 is formed.

Hereinafter, transfer of a wafer W at the time when one of the process modules PM cannot be used will be explained. When one of process modules included in a row of process modules cannot be used, as described above, transfer of a wafer W is controlled such that processes to substrates are continuously performed by using another process module that can perform the same process as performed in the corresponding process module.

Herein, if the same processes are included in the series of processes and these same processes are respectively performed in different process modules, the different process modules respectively correspond to the single process module and the another process module. In this example, the series of processes refer to the process B to the process M among the processes depicted in FIG. 19 except the process A. The reason why the pre-cleaning process as the process A is excluded is that this process is the first process performed in the processing station 1. That is, even if the process module PM1 that performs the corresponding process cannot be used, it is possible to continue a process to a wafer W loaded in a process module at the downstream side of the process module PM1 and thus possible to collect the wafer W through the load lock chamber LL2.

Further, in this example, the same processes among the series of processes refer to the process B and the process M (Ta film forming process), the process E and the process L (Ru film forming process), and the process F and the process K (CoFeB film forming process). These same processes are performed in different process modules, which means that, for example, the Ta film process is performed in the process module PM2 and the process module PM13. In this case, if the process module PM2 cannot be used, the process module PM13 is used as another process module.

Furthermore, in this example, the multiple process modules arranged to perform the series of processes refer to the process modules PM2, PM3, PM4, PM5, PM10, PM11, PM12, and PM13, and the process modules PM6, PM7, PM8, and PM9 serve as standby process modules.

Moreover, the wafer W of which a processing result is deteriorated is controlled to be preferentially unloaded from the process module when the wafer W processed in the process module is left in the corresponding process module, as described above. In this example, the priority of a process (priority of the next process) subsequent to the corresponding process performed in the process module where the corresponding wafer W is left is set depending on a degree of deterioration in processing result. The first priority of the next process is the process F (CoFeB film forming process), the second priority of the next process is the process H (oxidation process), the third priority of the next process is the process I (heating process), and the fourth priority of the next process is the process C (PtMn film forming process), as depicted in FIG. 19.

The reason why the process F is given the first priority is that if unloading of a wafer W from the process module that performs the process F is delayed, an interface of a CoFeB film formed on a surface of the wafer W is oxidized and a change rate of MR (magnetic resistance)/RA (resistance) increases accordingly. Further, the reason why the process H is given the second priority is that if unloading of a wafer W from the process module that performs the process H is delayed, residual oxygen on a surface of the wafer W increases and RA increases accordingly. Furthermore, the reason why the process I is given the third priority is that if unloading of a wafer W from the process module that performs the process I is delayed, the wafer W is heated and RA increases accordingly. Moreover, the reason why the process C is given the fourth priority is that if unloading of a wafer W from the process module that performs the process C is delayed, an interface of a PtMn film formed on a surface of the wafer W is oxidized and antiferromagnetic coupling deteriorates accordingly.

Figure 20:
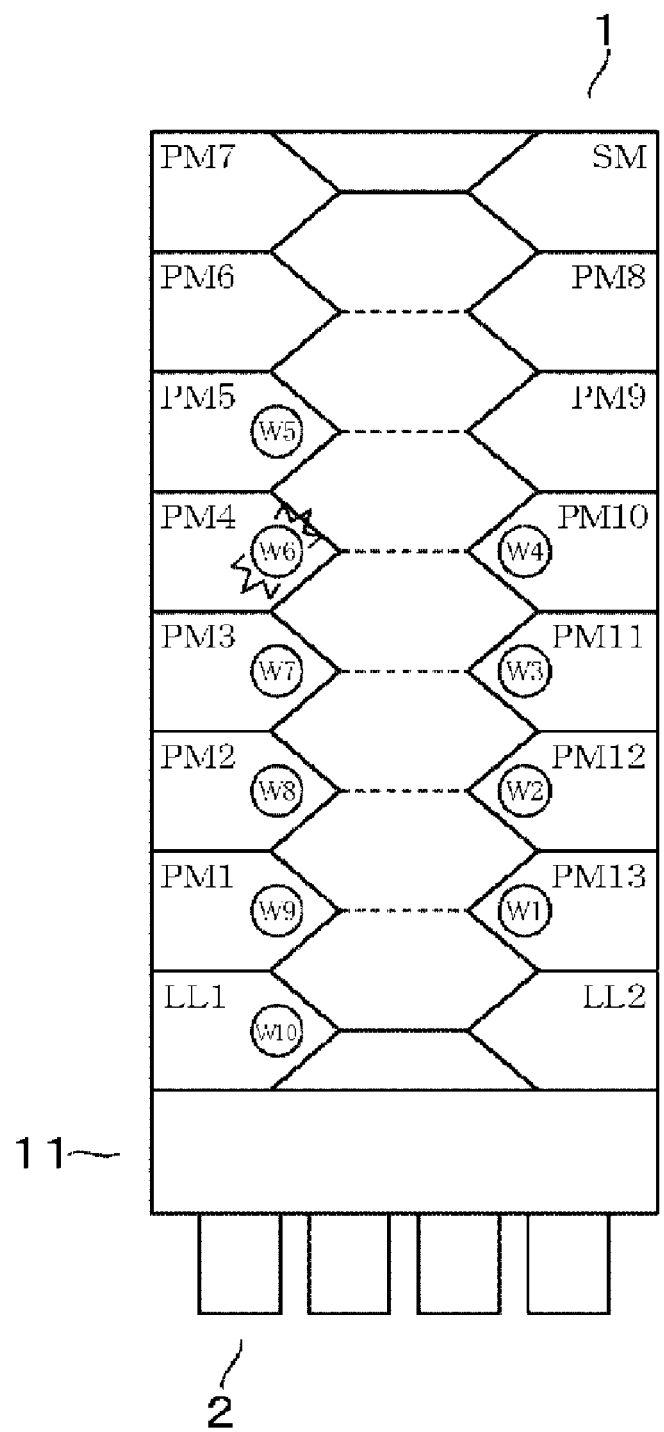
FIG. 20 is a plane view illustrating an operation of the vacuum processing apparatus.

Hereinafter, an example where the process module PM4 cannot be used will be explained in detail with reference to FIG. 20 to FIG. 27. Referring to FIG. 20, in the second row, a first wafer W1 of a lot is placed in the process module PM13, a second wafer W2 of the lot is placed in the process module PM12, a third wafer W3 is placed in the process module PM11, and a fourth wafer W4 is placed in the process module PM10. Further, in the first row, a fifth wafer W5 of the lot is placed in the process module PM5, a sixth wafer W6 is placed in the process module PM4, a seventh wafer W7 is placed in the process module PM3, and an eighth wafer W8 is placed in the process module PM2, and a ninth wafer W9 is placed in the process module PM1.

In this state, if a trouble occurs in the process module PM4, an alarm signal is outputted from the process module PM4 and transfer of a wafer W from the load lock chamber LL1 to the process module PM1 is stopped by the control unit 100. Further, another process module that can perform the same process as the process module PM4 is selected, and an operation instruction is outputted to the selected process module. In this example, the process module PM4 performs film forming processes of forming a CoFeB film and a Mg film, so that the process module PM12 that performs a film forming process of forming a CoFeB film and the process module PM9 that performs a film forming process of forming a Mg film are selected. Further, a transfer instruction to transfer the wafer W not to the process module PM4 but to the process module PM12 and the process module PM9 is outputted. As such, the series of processes are continuously performed to the wafer W by the other process modules PM12 and PM9. When the order of transfer of wafers W can be selected, the wafers W are transferred preferentially to those with a high priority of the next process, as described above.

Figure 21:
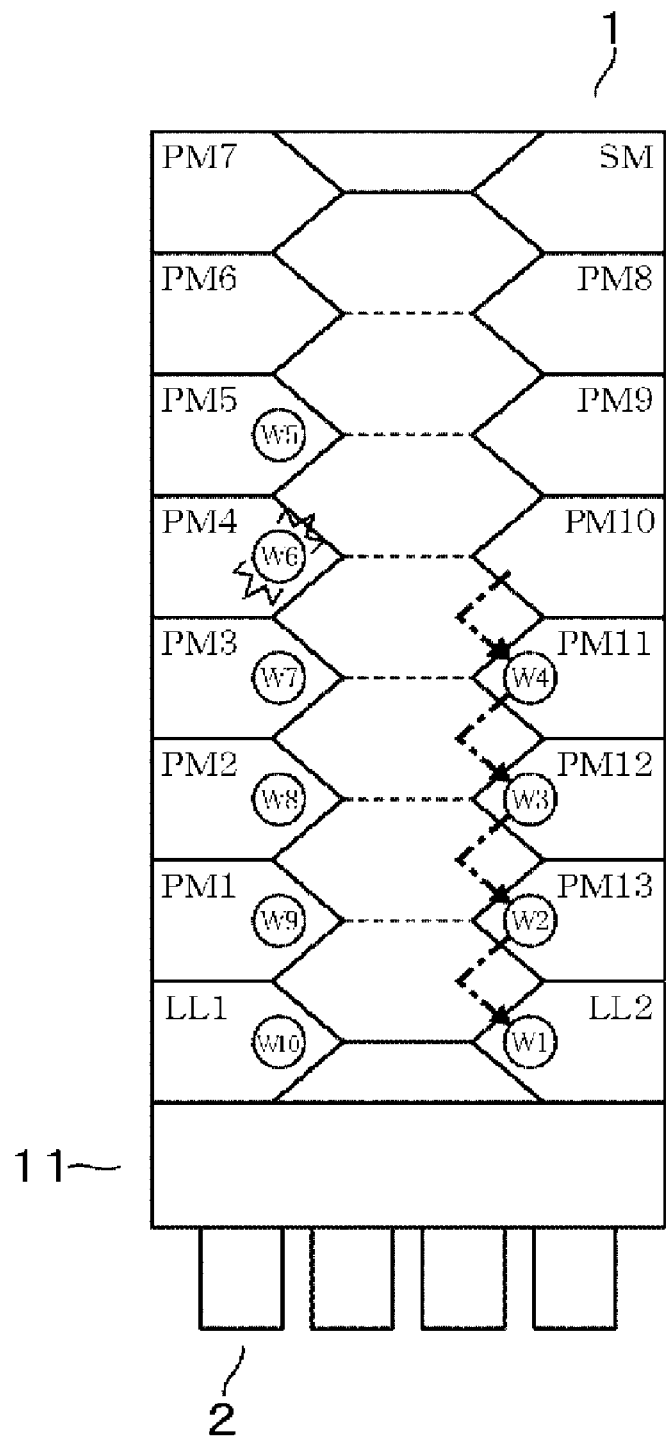
FIG. 21 is a plane view illustrating an operation of the vacuum processing apparatus.

By way of example, when the first row in which the process module PM4 is provided is referred to as "abnormality generation row" and the second row is referred to as "normal row", as depicted in FIG. 21, wafers W are transferred, for example, in the lump from an upstream process module to a process module at the one lower downstream side in the normal row. To be specific, the wafer W1 in the process module PM13 is transferred to the load lock chamber LL2, the wafer W2 in the process module PM12 is transferred to the process module PM13, the wafer W3 in the process module PM11 is transferred to the process module PM12, and the wafer W4 in the process module PM10 is transferred to the process module PM11.

Figure 22:
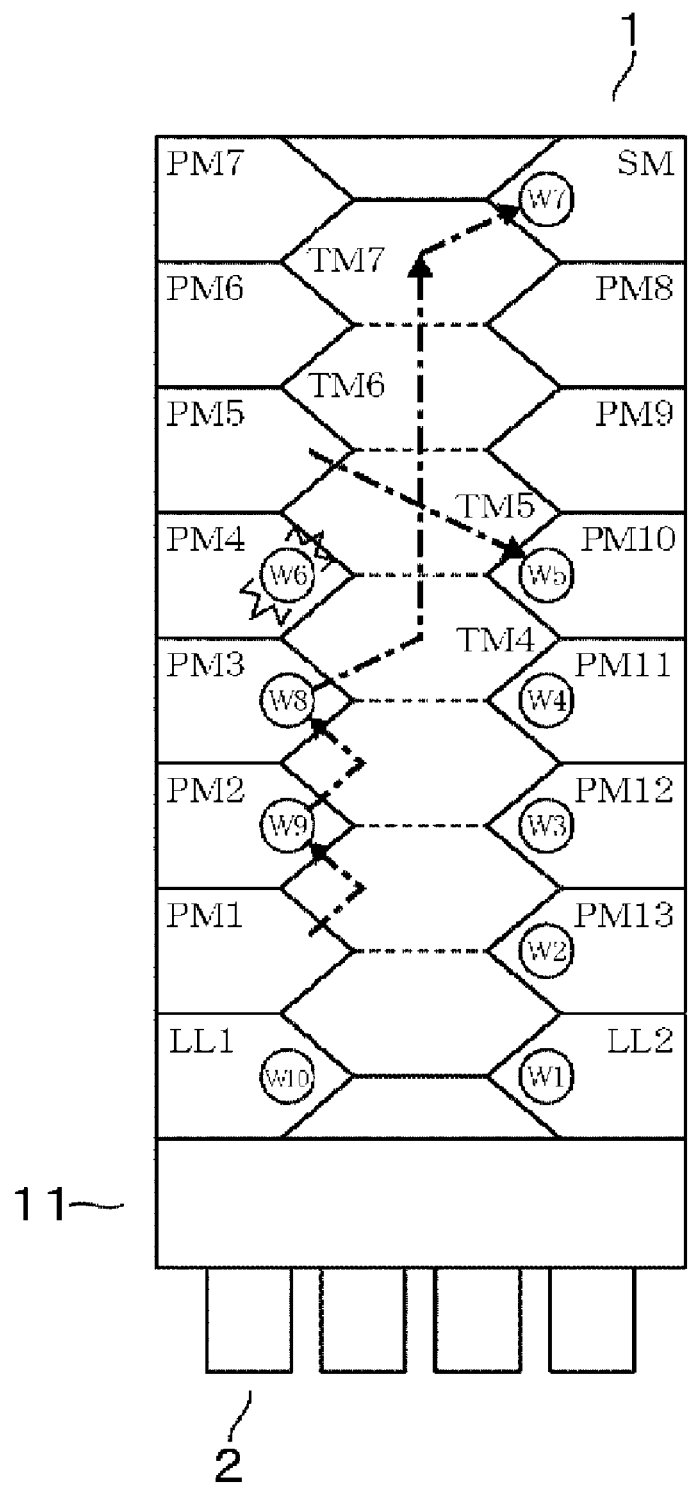
FIG. 22 is a plane view illustrating an operation of the vacuum processing apparatus.

Then, as depicted in FIG. 22, the wafer W5 oxidized in the process module PM5 in the abnormality generation row (first row) is transferred to the process module PM10. Then, in the abnormality generation row, the wafer W7 to the wafer W9 transferred to the processing station 1 after the wafer W6 in the process module PM4 are transferred. That is, the wafer W7 in the process module PM3 is received by the wafer transfer device 3 of the transfer module TM4 and delivered to the wafer transfer device 3 of the transfer module TM7 through the transfer modules TM5 and TM6, and then transferred to the retreat module SM1 by the corresponding wafer transfer device 3. Further, if the wafer W7 of the process module PM3 is transferred to the retreat module SM1, the wafer W8 of the process module PM2 is transferred to the process module PM3 and the wafer W9 of the process module PM1 is transferred to the process module PM2.

Herein, delivery of a wafer W between the wafer transfer device 3 of the transfer module TM7 and the retreat module SM1 is performed as follows. When the wafer transfer device 3 delivers a wafer W with respect to one holder 71 (71a to 71c) of the retreat module SM1, the shelf 7 is set at a height position where the pick 36 holding the wafer W can enter toward an upper portion of the holder 71. Then, the pick 36 is positioned at the upper portion of the holder and then, the shelf 7 is raised, and, thus, the wafer W on the pick 36 is received by the holder 71. Then, the shelf 7 is set at a height position where the pick 36 can retreat and the pick 36 are retreated, so that the wafer W is delivered to the holder 71. Meanwhile, when the wafer transfer device 3 receives a wafer W from the retreat module SM1, the wafer transfer device 3 and the shelf 7 are operated in reverse order to the order in which the wafer W is mounted on the holder 71 of the retreat module SM1.

Figure 23:
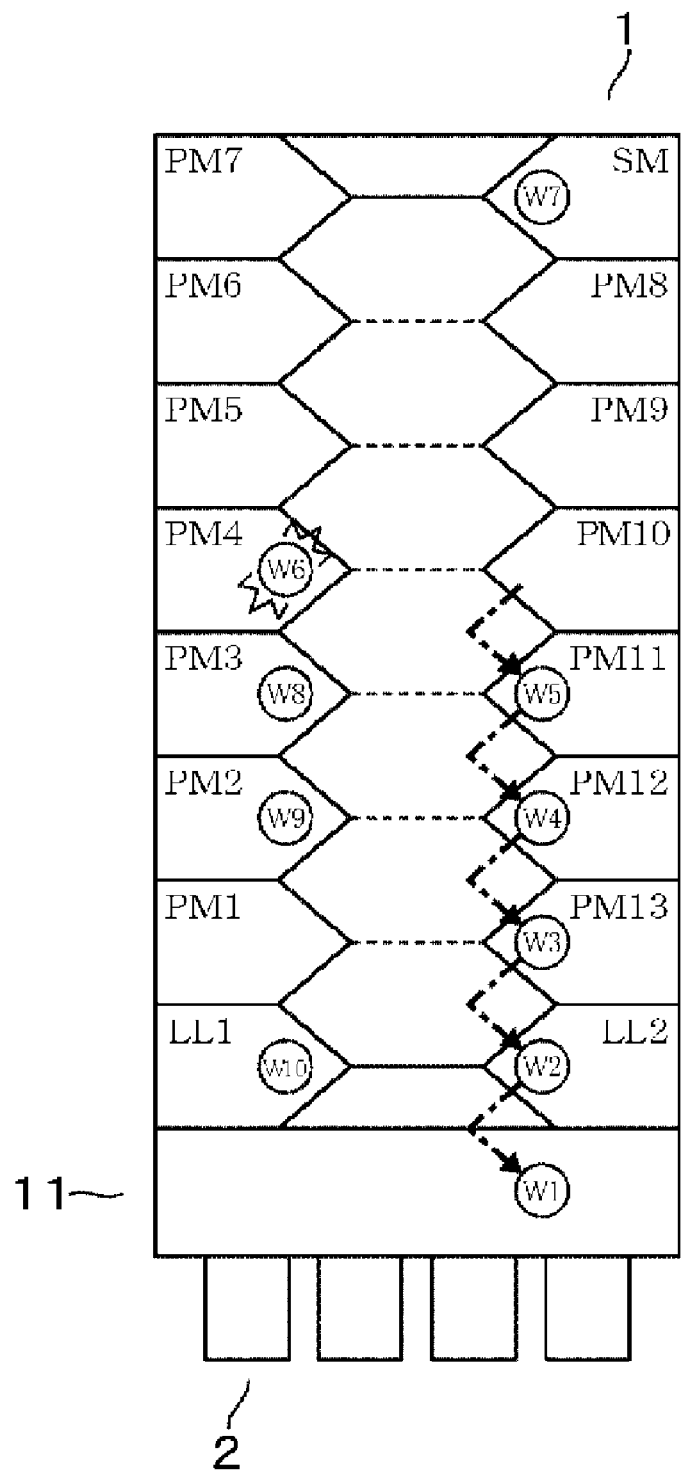
FIG. 23 is a plane view illustrating an operation of the vacuum processing apparatus.
Figure 24:
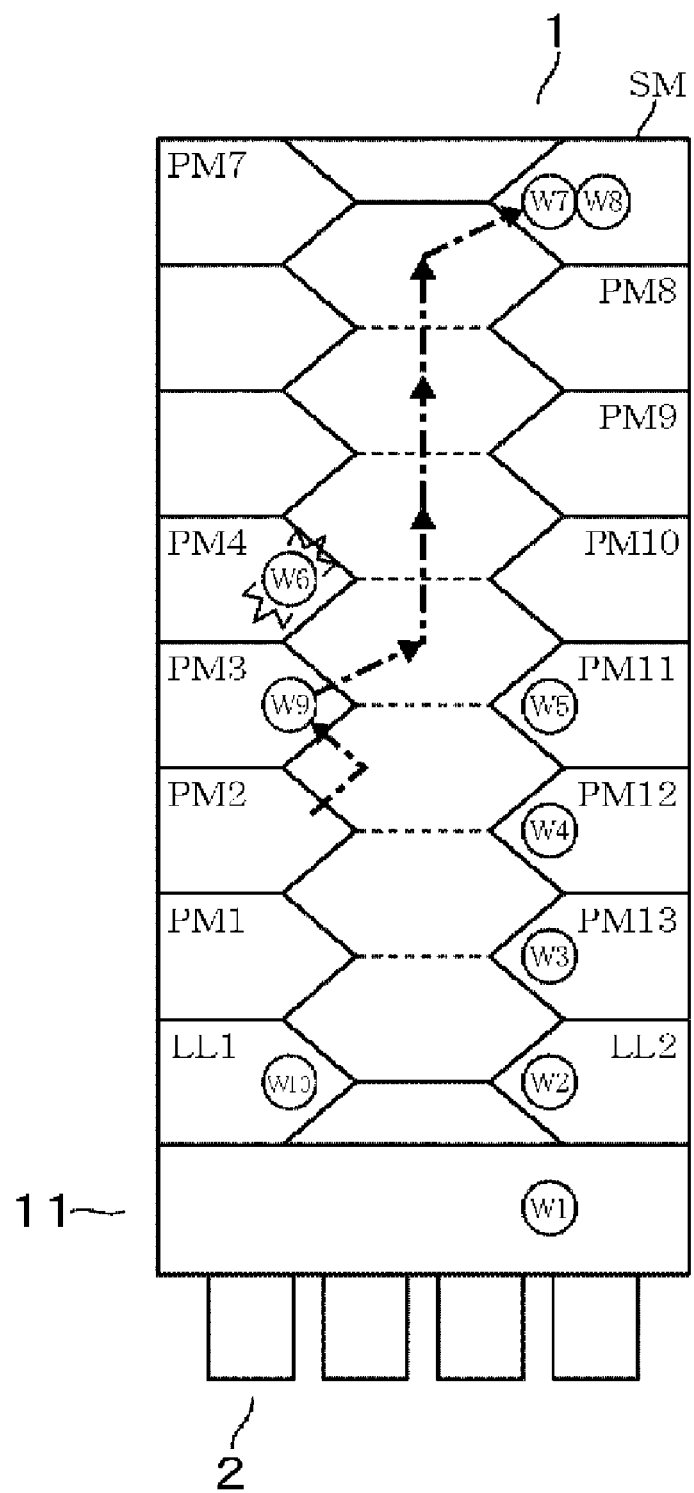
FIG. 24 is a plane view illustrating an operation of the vacuum processing apparatus.
Figure 25:
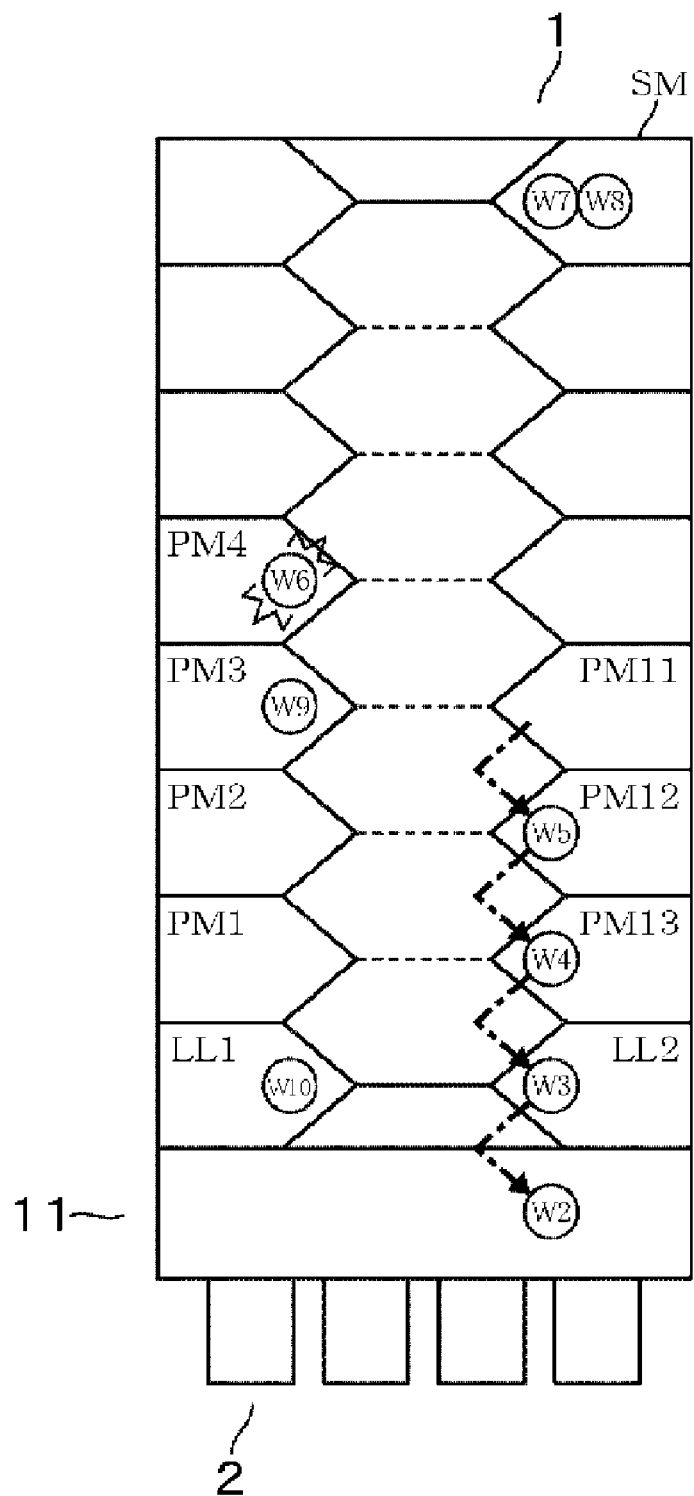
FIG. 25 is a plane view illustrating an operation of the vacuum processing apparatus.

Then, as depicted in FIG. 23, the wafers W1 to W5 in the normal row are transferred from an upstream process module to a process module at the one lower downstream side. Then, as depicted in FIG. 24, in the abnormality generation row, the wafer W8 in the process module PM3 is transferred to the retreat module SM1. Thereafter, as depicted in FIG. 25, the wafer W2 to the wafer W5 in the normal row are transferred from upstream process modules to process modules at their one lower downstream sides, respectively.

Figure 26:
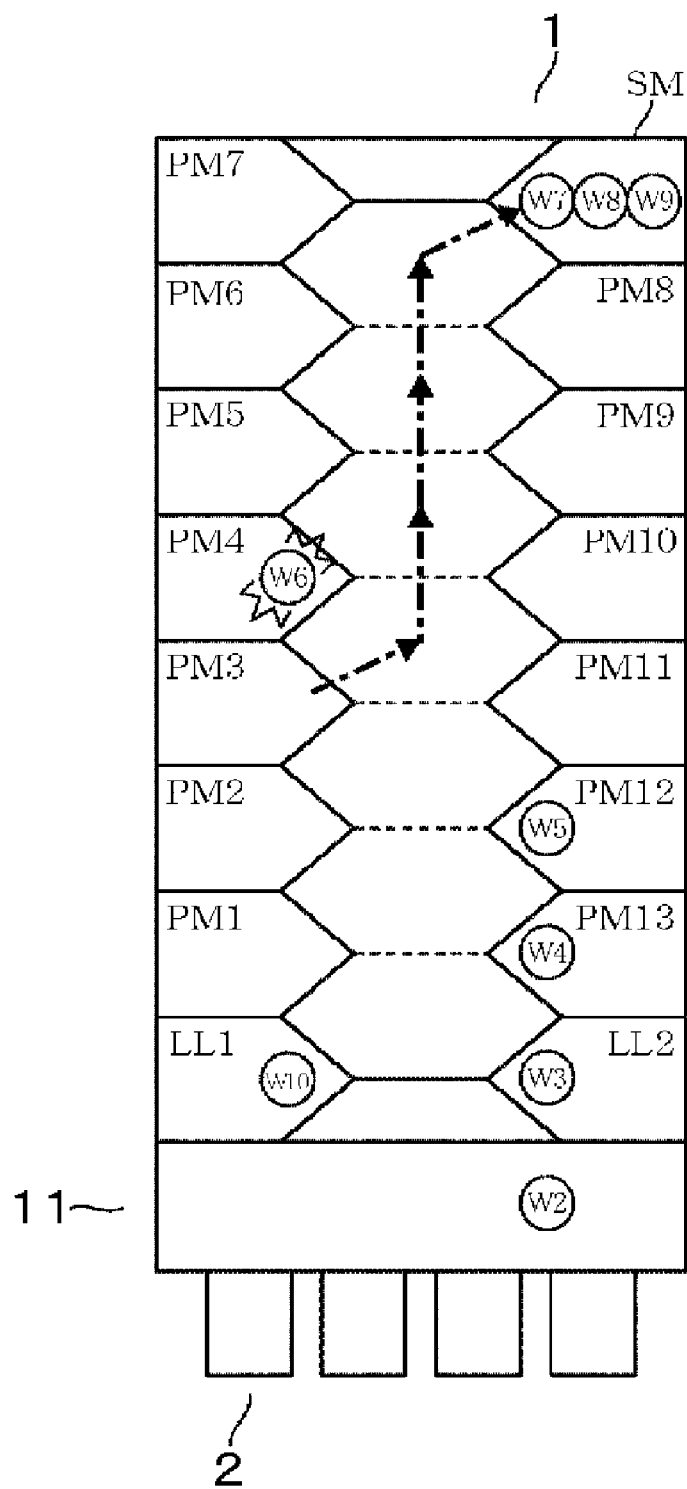
FIG. 26 is a plane view illustrating an operation of the vacuum processing apparatus.
Figure 27:
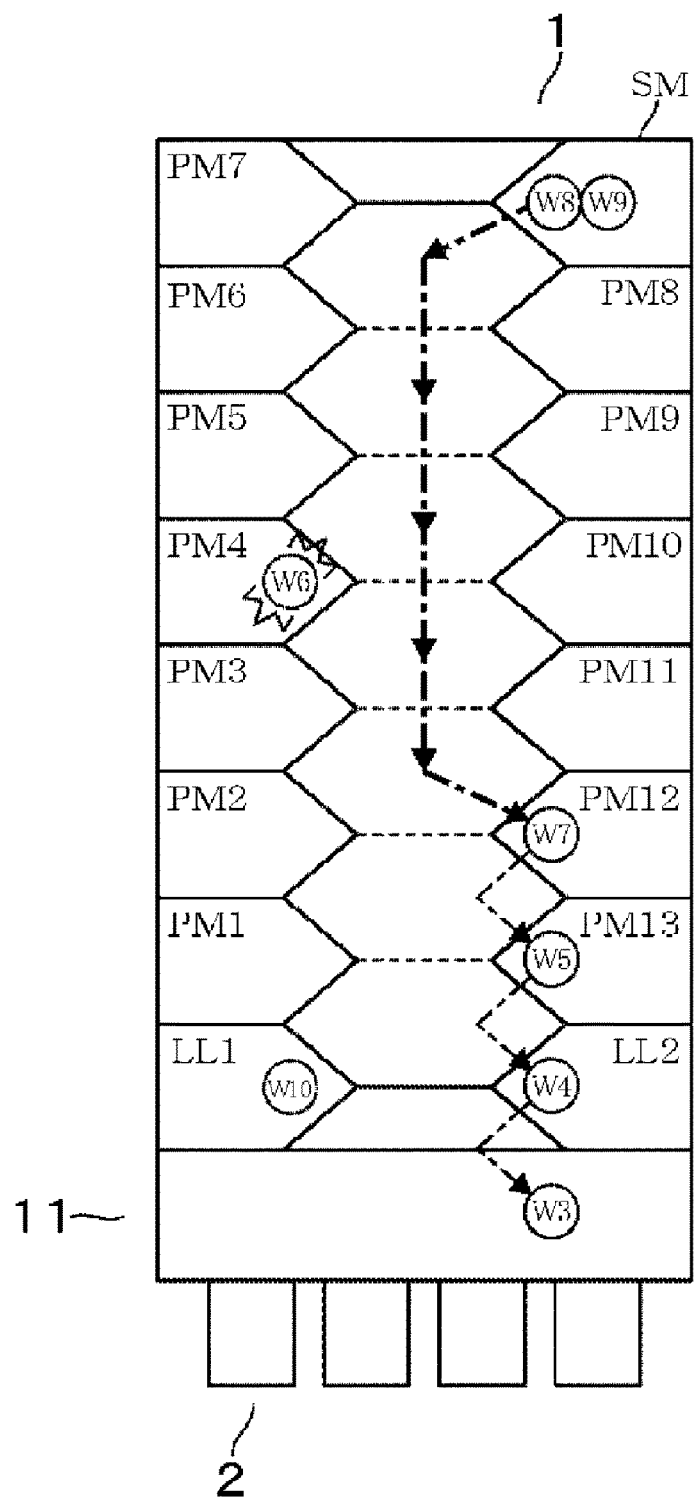
FIG. 27 is a plane view illustrating an operation of the vacuum processing apparatus.
Figure 28:
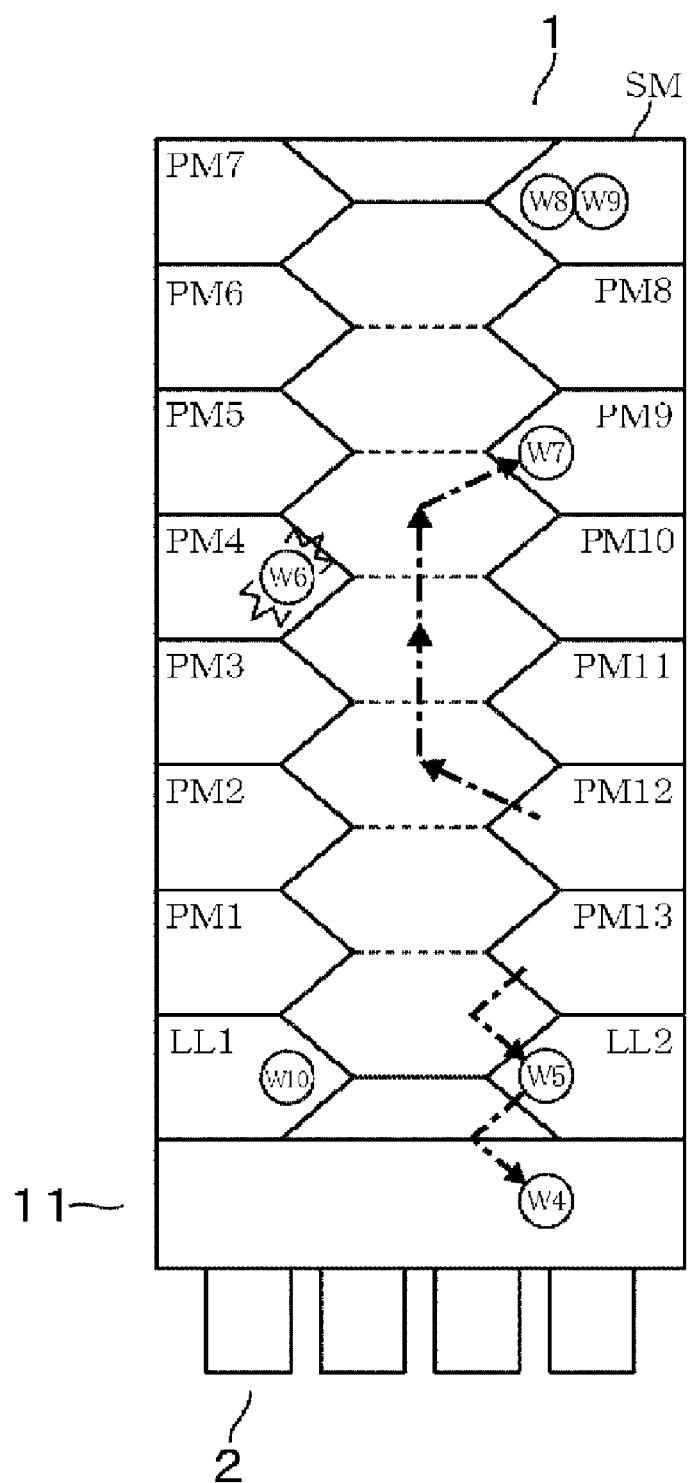
FIG. 28 is a plane view illustrating an operation of the vacuum processing apparatus.

Then, as depicted in FIG. 26, in the abnormality generation row, the wafer W9 in the process module PM3 is transferred to the retreat module SM1. Thereafter, as depicted in FIG. 27, the wafer W3 to the wafer W5 in the normal row are transferred from upstream process modules to process modules at their one lower downstream sides, respectively, and then, the wafer W7 in the retreat module SM1 is transferred to the process module PM12 as the another module, in which a film forming process of forming a CoFeB film can be performed. Then, as depicted in FIG. 28, in the normal row, according to the first priority of the next process, the wafer W7 in the process module PM12 is transferred to the process module PM9 as the another process module, in which a film forming process of forming a Mg film can be performed. Then, the wafer W4 and the wafer W5 are transferred from upstream process modules to process modules at their one lower downstream sides, respectively.

Figure 29:
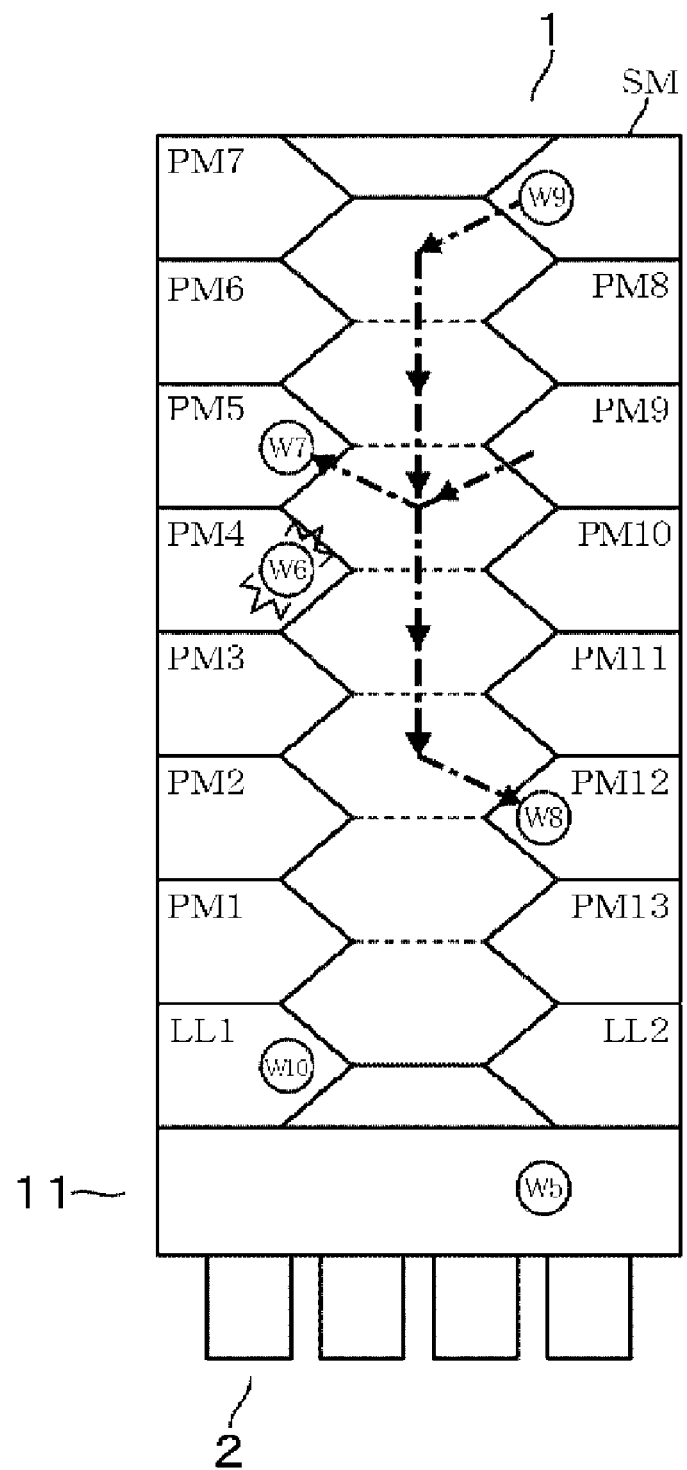
FIG. 29 is a plane view illustrating an operation of the vacuum processing apparatus.
Figure 30:
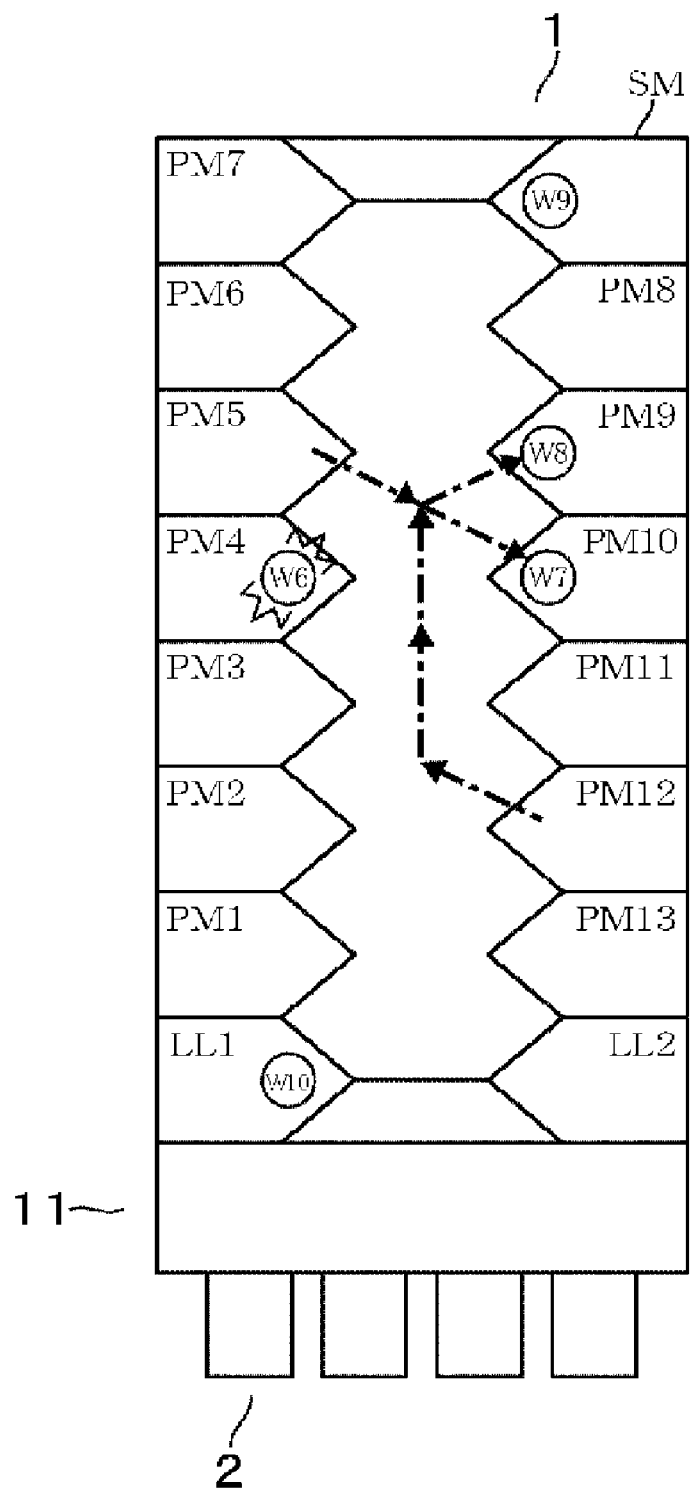
FIG. 30 is a plane view illustrating an operation of the vacuum processing apparatus.
Figure 31:
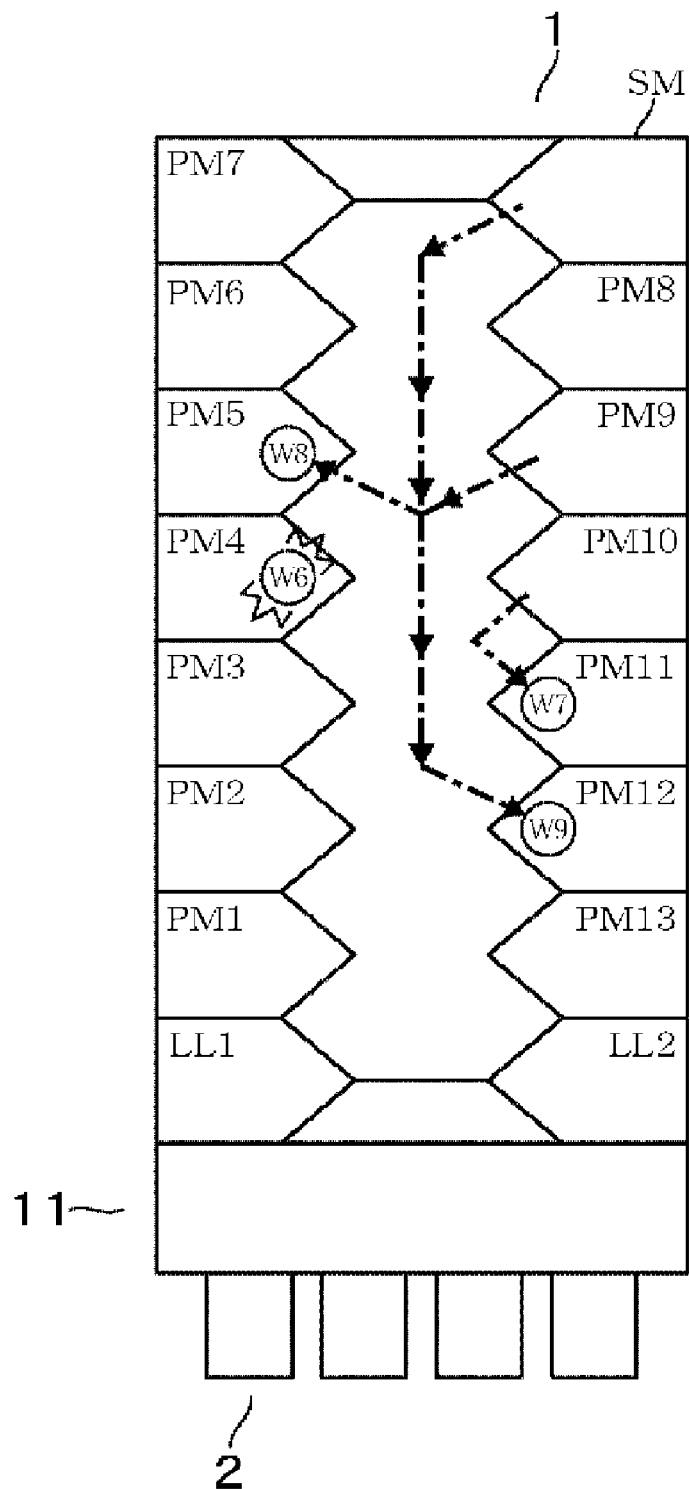
FIG. 31 is a plane view illustrating an operation of the vacuum processing apparatus.

Then, as depicted in FIG. 29, the wafer W7 in the process module PM9 is transferred to the process module PM5, and the wafer W8 in the retreat module SM1 is transferred to the process module PM12. Thereafter, as depicted in FIG. 30, the wafer W7 in the process module PM5 is transferred to the process module PM10, and the wafer W8 in the process module PM12 is transferred to the process module PM9. At this time, in the process module PM12, the process (process F) with the first priority of the next process is being performed, and, thus, the wafer W8 is transferred prior to the wafer W7. Then, as depicted in FIG. 31, the wafer W7 in the process module PM10 is transferred to the process module PM11, the wafer W8 in the process module PM9 is transferred to the process module PM5, and the wafer W9 in the retreat module SM1 is transferred to the process module PM12. At this time, in the process module PM10, the process (process I) with the third priority of the next process is being performed, so that the wafer W7 is transferred priorly.

Figure 32:
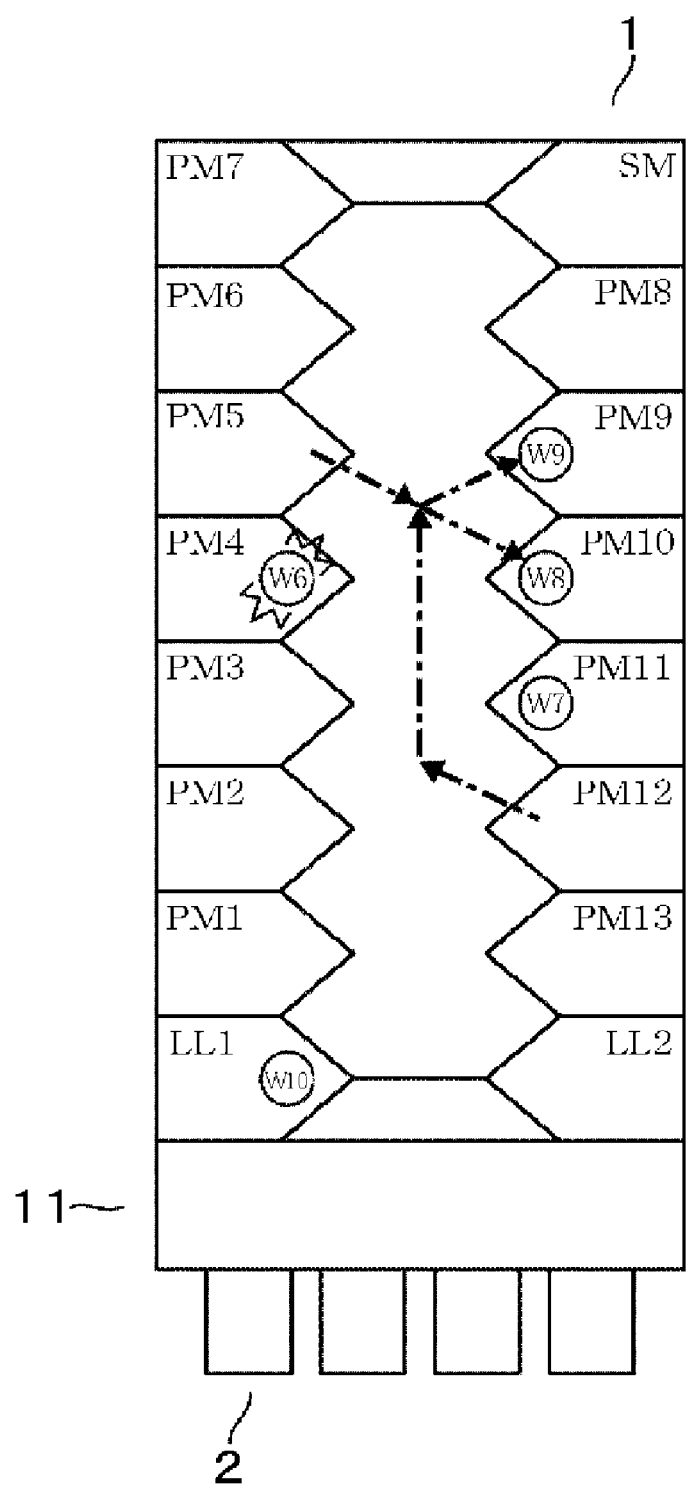
FIG. 32 is a plane view illustrating an operation of the vacuum processing apparatus.
Figure 33:
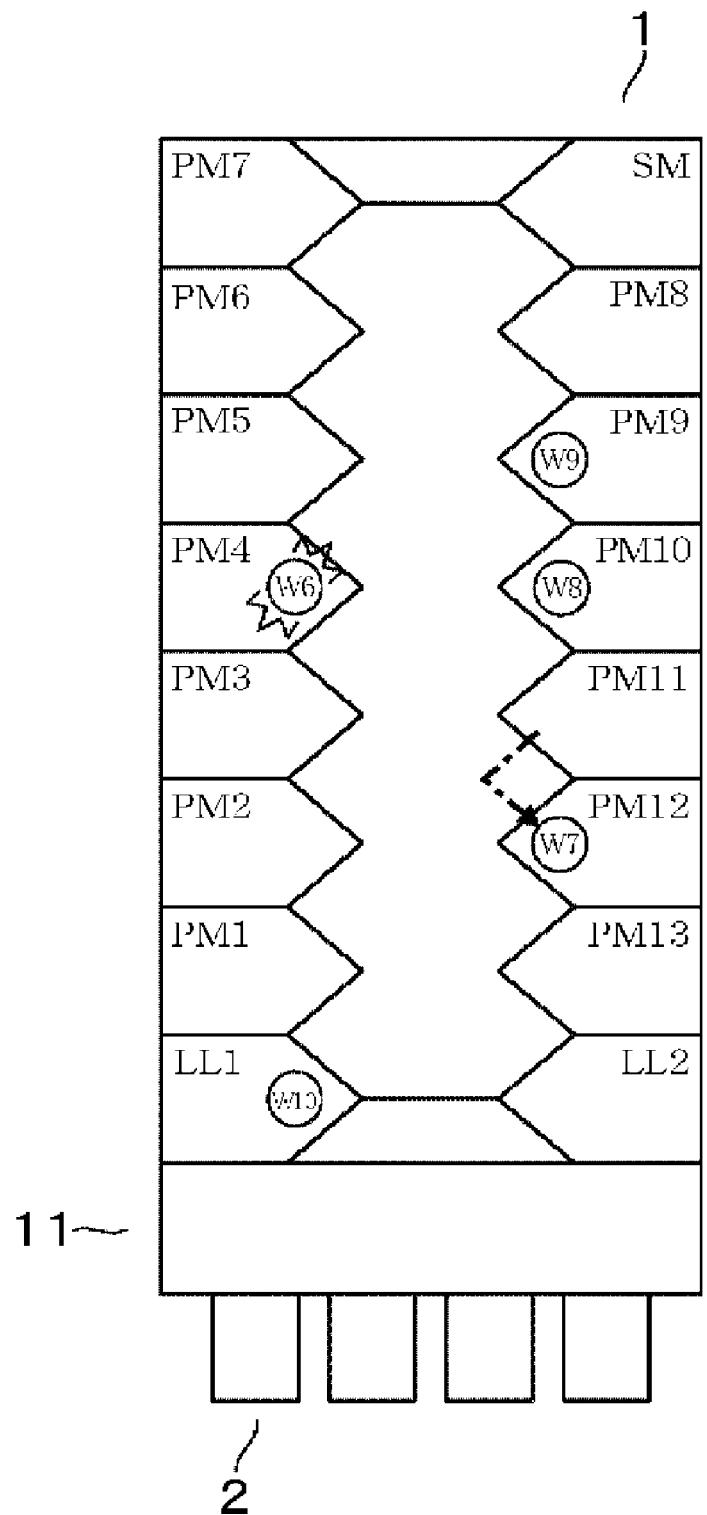
FIG. 33 is a plane view illustrating an operation of the vacuum processing apparatus.
Figure 34:
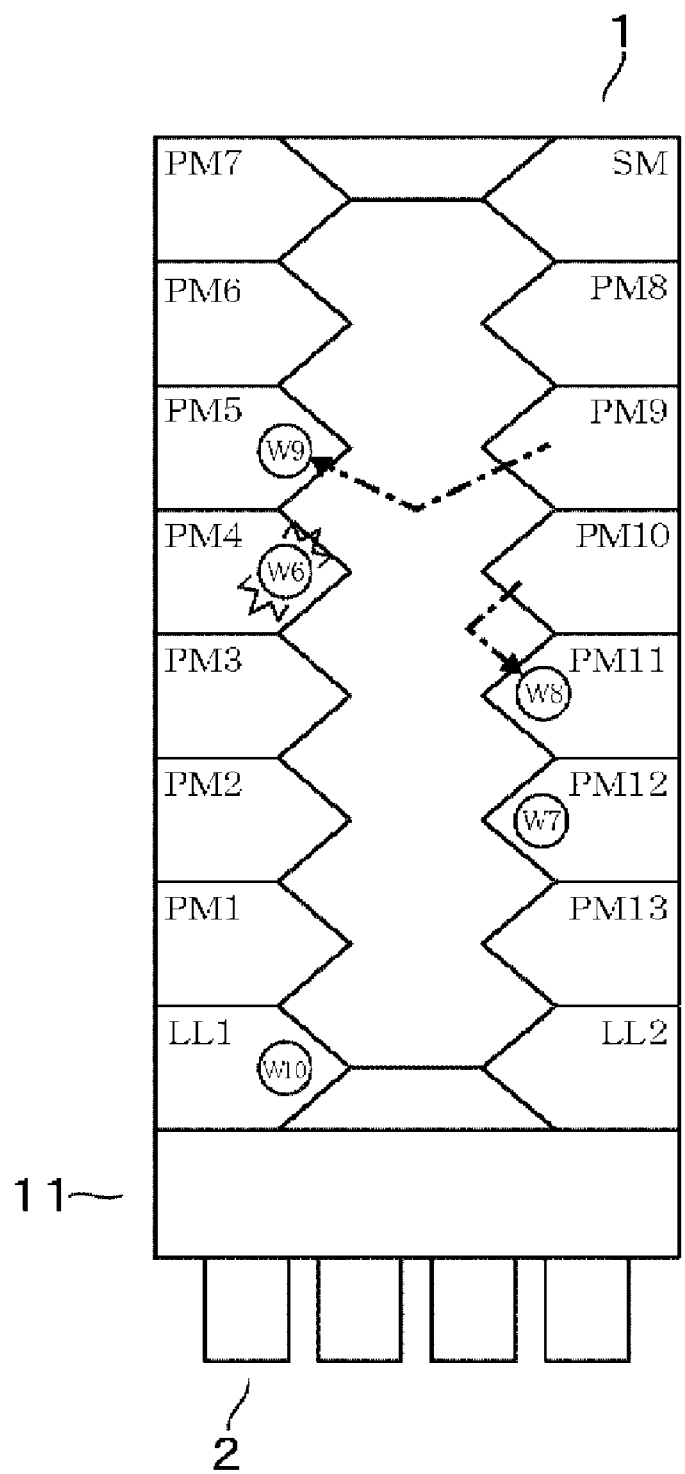
FIG. 34 is a plane view illustrating an operation of the vacuum processing apparatus.

Subsequently, as depicted in FIG. 32, the wafer W8 in the process module PM5 is transferred to the process module PM10, and the wafer W9 in the process module PM12 is transferred to the process module PM9. At this time, in the process module PM12, the process (process F) with the first priority of the next process is performed, and in the process PM15, the process (process H) with the second priority of the next process is performed. Therefore, the wafer W9 is transferred prior to the wafer W8. Then, as depicted in FIG. 33, the wafer W7 in the process module PM11 is transferred to the process module PM12, and as depicted in FIG. 34, the wafer W9 in the process module PM9 is transferred to the process module PM5, and the wafer W8 in the process module PM10 is transferred to the process module PM11. At this time, in the process module PM10, the process (process I) with the third priority of the next process is being performed, so that the wafer W8 is transferred preferentially.

Figure 35:
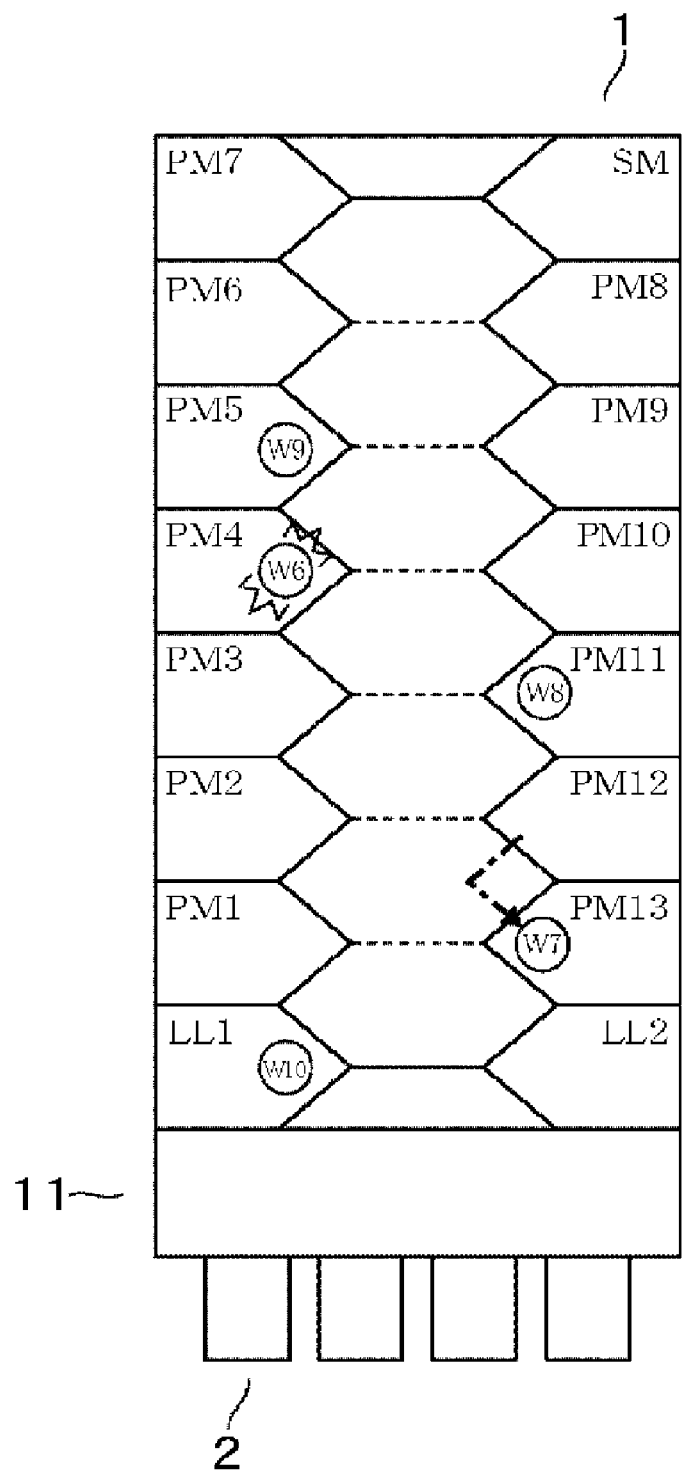
FIG. 35 is a plane view illustrating an operation of the vacuum processing apparatus.
Figure 36:
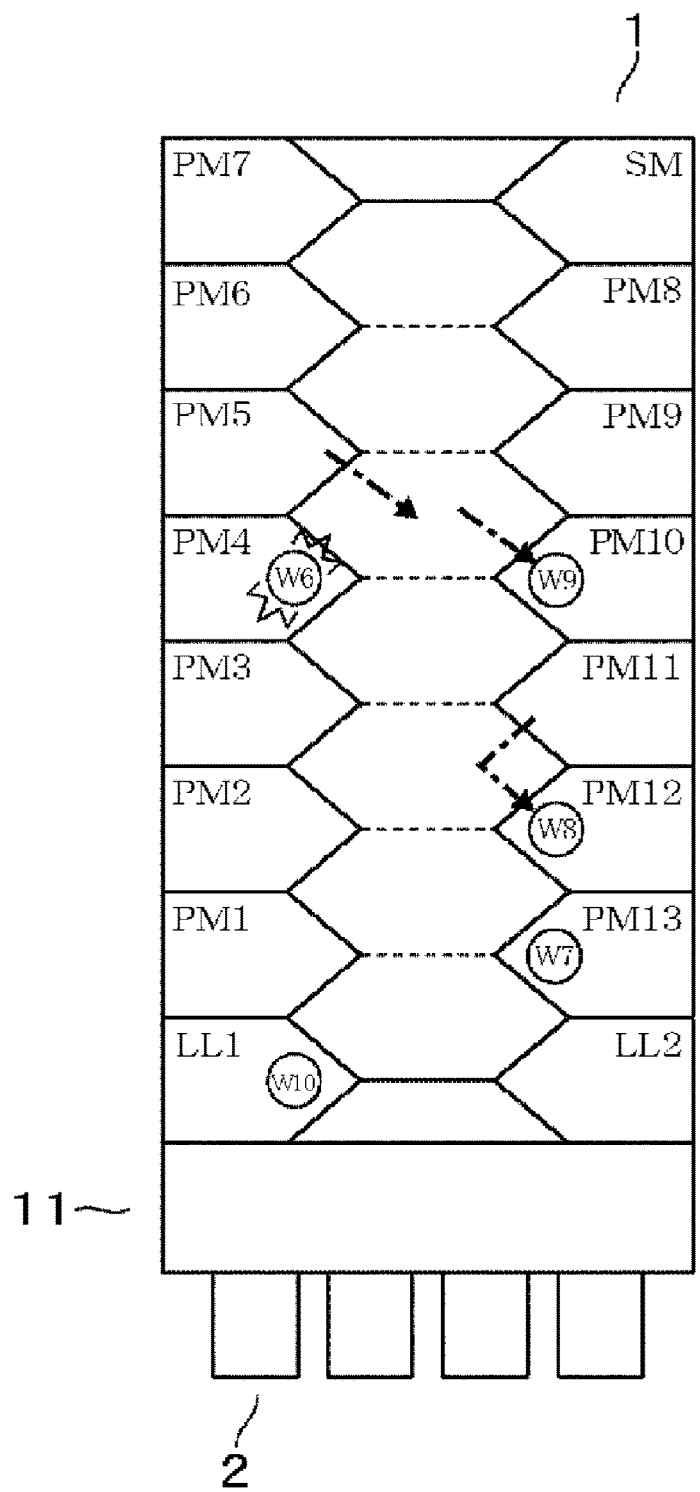
FIG. 36 is a plane view illustrating an operation of the vacuum processing apparatus.
Figure 37:
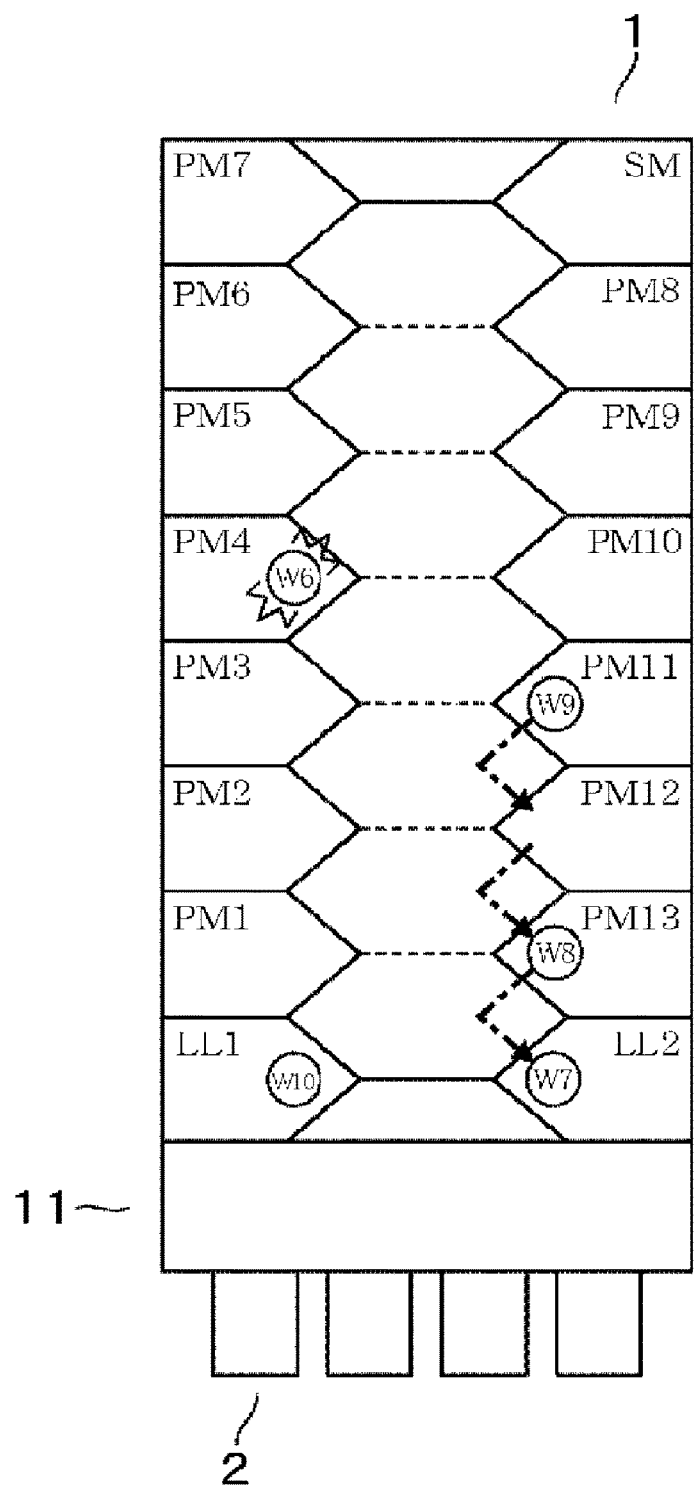
FIG. 37 is a plane view illustrating an operation of the vacuum processing apparatus.

Then, as depicted in FIG. 35, the wafer W7 in the process module PM12 is transferred to the process module PM13. Then, as depicted in FIG. 36, the wafer W8 in the process module PM11 is transferred to the process module PM12, and the wafer W9 in the process module PM5 is transferred to the process module PM10. At this time, in the process module PM5, the process (process H) with the second priority is performed, so that the wafer W9 is transferred prior to the wafer W8. Then, as depicted in FIG. 37, the wafer W7 to the wafer W9 in the normal row are delivered in sequence from the upstream process modules to the downstream process modules. As such, the wafers W1 to W5 and W7 to W9 to which the series of processes are performed are collected into the FOUP 20 through the second load lock chamber LL2 by the atmospheric transfer arm 12.

In accordance with the above-described example embodiment, when a series of processes are performed to wafers W in a vacuum atmosphere by using multiple process modules in sequence, the process modules are arranged such that each of the series of processes can be performed by at least two process modules. Further, the adjacent wafer transfer devices 3 can deliver a wafer W with each other between the transfer chambers. Therefore, even when the single process module cannot be used, another process module that can perform the same process can be used, so that processes to substrates can be continued without stopping the operation of the apparatus. Thus, a situation in which the above-described series of processes are interrupted can be suppressed. Thus, it is possible to avoid waste of wafers W caused by interruption of the series of processes. Therefore, the number of wasted wafers W can be reduced.

As described above, since the adjacent wafer transfer devices 3 can deliver a wafer W with each other, the wafer W can be transferred through the inside of the transfer chamber configured as a transfer module without passing through a process module. For this reason, even if another process module is used instead of the corresponding process module which cannot be used, a wafer W can be rapidly transferred to the another module through the inside of the transfer chamber. Further, since a wafer W can be delivered from a process module in the first row to a process module in the second row through the transfer chamber, it is possible to suppress complication of a transfer route. Further, since it is not necessary to pass through a process module, it is not necessary to wait for the end of the process in the process module during the transfer, and even when the used process module is replaced with another process module, it does not take more time to transfer than needs, so that it is possible to suppress a decrease in throughput (productivity). Further, since the wafer W can be transferred passing through the inside of the transfer chamber, if the process modules are arranged such that each of the series of processes can be performed by at least two process modules, the degree of freedom in arrangement layout of the process modules is increased.

As such, in the above-described example embodiment, even when the single process module cannot be used, processes to substrates can be continued by using another process module. Thus, as explained in the specific example, a wafer W to be discarded is only the wafer W6 placed in the process module PM4 which cannot be used. That is, the wafers W1 to W5 loaded into the processing station 1 prior to the wafer W6 and the wafers W7 to W9 loaded into the processing station 1 after the wafer W6 undergo all of the series of processes and are collected. Therefore, it is possible to greatly reduce the number of discarded wafers W.

Herein, in the conventional configuration in which the adjacent wafer transfer devices 3 cannot deliver a wafer W with each other between the transfer chambers, if a single process module cannot be used, the number of discarded wafers W is increased. In this case, the wafers W placed in the process modules at the upstream side of the corresponding process module (referred to as "unusable module") which cannot be used according to the transfer order cannot be transferred to the downstream process modules without passing through the corresponding process module used in place of the unusable module. The transfer route via the substituted process module makes a detour route around the unusable module, so that the transfer route becomes complicated. Further, since the wafer W is transferred passing through the process module, when a process is performed in a process module on its way, the wafer W waits for the end of this process to be transferred. As such, in the configuration in which the wafer transfer devices 3 cannot deliver a wafer W with each other, if there is an unusable module, it takes time to transfer the wafer W to another process module that can perform the same process. Therefore, unloading of the wafer W from the process module may be delayed, or a time for waiting the starting of the next process increases. During this time period, a processing result of the wafer W may be deteriorated, so that the number of discarded wafers which cannot be used as products may be increased.

As a laminated film called MTJ device (MTJ film) or TMR device (TMR film) used in a MRAM as a storage device, there is a laminated film including eight or more metal films and metal oxide films in total. In the case of manufacturing such a MTJ device, there is a tendency to form a very expensive device on a wafer W. Thus, when a process module cannot be used, a process is continued using another process module, which has a great effect of reducing the number of discarded wafers W.

Further, in the above-described configuration, the adjacent wafer transfer devices 3 can deliver a wafer W between the transfer chambers and the degree of freedom in a transfer route for the wafer W is high. Thus, a wafer W of which a processing result may be deteriorated when left in a process module can be transferred preferentially. That is, the wafer W of which the processing result may be deteriorated is unloaded from the process module before transferring a group of wafers W of which the processing result is not deteriorated even when the wafers W processed in the process modules are respectively left in the corresponding process modules. For this reason, even when there is something abnormal with a process module, the wafer W is transferred to suppress deterioration in processing result, so that deterioration in electric characteristics of the device formed on the wafer W is suppressed. Therefore, it is possible to further reduce the number of discarded wafers W.

Further, since the retreat module that can accommodates multiple wafers W is provided, it is possible to temporarily retreat a wafer W placed in a process module. For this reason, if another process module is used instead of the unusable process module, the wafer W is transferred in a different pattern from the transfer route of the wafer W in the normal state. If a target process module as a transfer destination is not empty, the wafer W placed in the process module can be temporarily retreated. Thus, it is possible to suppress a wafer W from being left in a certain process module, and also possible to avoid deterioration in the processing result caused by being left in the process module. Further, the retreat module SM1 is set such that a vacuum degree is higher (a pressure is lower) than that of the transfer module TM (transfer chamber), so that even if the wafer W is retreated to the retreat module SM1, the surface of the wafer W is not oxidized and deterioration in the processing result can be suppressed.

Further, in the above-described example embodiment, as a film forming module, a sputtering module including two different kinds of targets 52a and 52b is used, so that two kinds of metal films can be formed in a single module. Accordingly, as compared with the case of using a process module including one kind of a target, the number of process modules can be reduced, and, thus, it is possible to suppress an increase in size of the apparatus. Further, since the number of process modules is reduced, a time required for the transfer is reduced. Thus, it is possible to improve throughput. Furthermore, since the number of process modules is reduced, the number of subsidiary facilities such as a transfer device that transfers a wafer W to a process module or a vacuum pump may be reduced. Thus, it is possible to reduce manufacturing costs. Moreover, since a region maintained in a vacuum atmosphere is reduced, a reduction in operational costs can be expected. Further, in accordance with the above-described example embodiment, the arrangement layout of the wafer transfer devices and the process modules is formed in zigzags, and, thus, even if many process modules are provided, it is possible to suppress an increase in a longitudinal dimension in the forward/backward direction of the apparatus. Thus, it is possible to reduce a foot print (occupation area).

Further, in the above-described configuration, since the adjacent transfer modules TMs can transfer a wafer W with each other, with respect to the arranged process modules, the order of transfer can be freely determined. By way of example, a wafer W can be transferred from a process module in the first row to a process module in the second row, or can be transferred from a downstream process module to an upstream process module (load lock chamber LL side) in the same row of process modules. For this reason, when a laminated film is formed, it is possible to readily respond to a change in the number of films in the laminated film or in the order of lamination, or a change in kinds of metal films constituting the laminated film.

Hereinafter, a second example embodiment of the vacuum processing apparatus will be explained with reference to FIG. 38 to FIG. 40. In this example embodiment, in the vacuum processing apparatus as described in the first example embodiment, ten transfer modules TM11 to TM20 are provided. Further, in the first row, nine process modules PM11 to PM19 and a single retreat module SM11 are arranged at a rear end side of the first load lock chamber LL1. Furthermore, in the second row, nine process modules PM21 to PM29 and a single retreat module SM21 are arranged at a rear end side of the second load lock chamber LL2.

In the first row and the second row, process modules PM configured to perform a series of processes of forming the laminated film 200 are provided. That is, the process modules PM11 and PM21 are configured as cleaning modules, the process modules PM12 and PM22 are configured as film forming modules of forming a PtMn film and a Ta film. Further, the process modules PM13 and PM23 are configured as film forming modules of forming a CoFe film and a Ru film, and the process modules PM14 and PM24 are configured as film forming modules of forming a CoFeB film and a Mg film. Furthermore, the process modules PM15 and PM25 are configured as oxidation modules, the process modules PM16 and PM26 are configured as heating modules, and the process modules PM17 and PM27 are configured as cooling modules. Moreover, the process modules PM18 and PM28 are configured as film forming modules of forming a CoFeB film and a Ru film, and the process modules PM19 and PM29 are configured as film forming modules of forming a Ta film.

As described above, the same process modules are arranged in the first row and the second row, respectively, and, thus, the process modules are arranged such that each of the series of processes of forming the laminated film 200 can be performed in both rows of the process modules. The film forming module of forming a Ta film is configured as a sputtering module having a single target without including a shutter, for example, in the film forming module depicted in FIG. 7. The other components are the same as those of the vacuum processing apparatus of the above-described first example embodiment. In FIG. 38, for the sake of convenience of illustration, illustration of the transfer opening 47, the partition wall 30a, and the gate valve GV is omitted.

Figure 39:
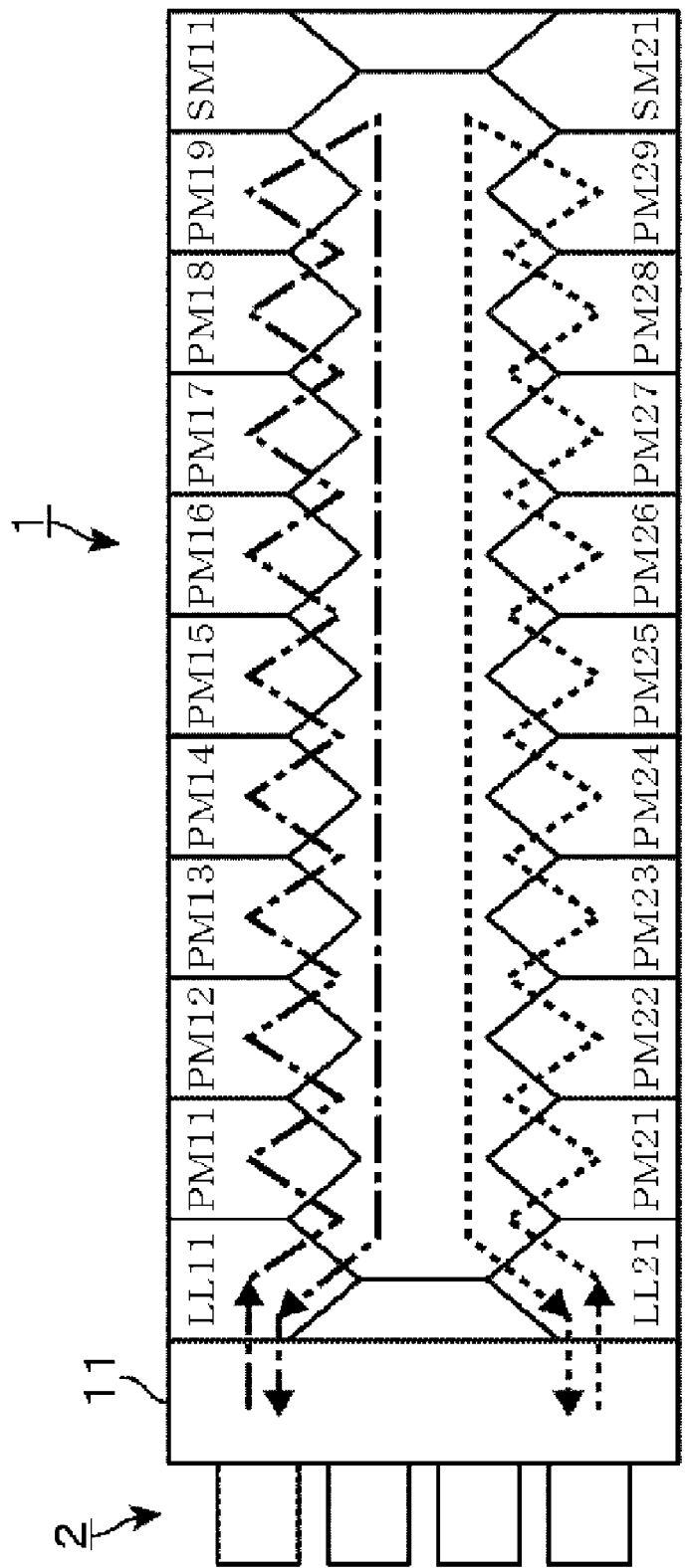
FIG. 39 is a plane view illustrating an operation of the vacuum processing apparatus.

In this configuration, when the vacuum processing apparatus is in a normal state, a wafer W is transferred according to a transfer pattern as depicted in FIG. 39. That is, the wafer W in the FOUP 20 mounted in the loading/unloading port 2 is received by the atmospheric transfer arm 12, and then, transferred into any one of the first load lock chamber LL1 and the second load lock chamber LL2. Then, when a process module PM is referred to as "PM" and a transfer module TM is referred to as "TM", the wafer W in the load lock chamber LL1 is transferred through a route of TM11→PM11 (process A)→TM12→PM12 (process B and process C)→TM13→PM13 (process D and process E). Then, the wafer W is transferred through a route of TM14→PM14 (process F and process G)→TM15→PM15 (process H)→TM16→PM16 (process I)→TM17→PM17 (process J)→TM18→PM18 (process K and process L)→TM19→PM19 (process M), and the series of processes are performed thereto, so that the laminated film 200 can be manufactured. Then, the wafer W is transferred to the first load lock chamber LL1 through a route of TM20→TM19→TM18→TM17→TM16→TM15→TM14→TM13→TM12→TM11→LL1, and returned back to, for example, the FOUP 20 by the atmospheric transfer arm 12.

Further, the wafer W in the second load lock chamber LL2 is transferred through a route of TM11→PM21 (process A)→TM12→PM22 (process B and process C)→TM13→PM23 (process D and process E). Then, the wafer is transferred through a route of TM14→PM24 (process F and process G)→TM15→PM25 (process H)→TM16→PM26 (process I)→TM17→PM27 (process J)→TM18→PM28 (process K and process L)→TM19→PM29 (process M), and the series of processes are performed thereto and the laminated film 200 is manufactured. Then, the wafer W is transferred to the second load lock chamber LL2 through a route of TM20→TM19→TM18→TM17→TM16→TM15→TM14→TM13→TM12→TM11→LL2, and returned to, for example, the FOUP 20 by the atmospheric transfer arm 12.

Further, when a process module included in the row of process modules cannot be used, the control unit 100 outputs a control signal to continue a process to a wafer W using another process module that can perform the same process as performed by the corresponding process module.

Herein, for example, when the process module PM14 cannot be used, for example, in the first row, loading of a wafer W from the load lock chamber LL1 to the process module PM11 is stopped and the process module PM24 is used as another process module to continuously perform the process to the wafer W. In this case, for example, as depicted in FIG. 40, the wafer W in the first row is controlled such that the wafer W can undergo a process in the process module PM24, and then, can be transferred again in sequence to the process modules PM15 to PM19 in the first row to undergo the respective processes therein.

Figure 41:
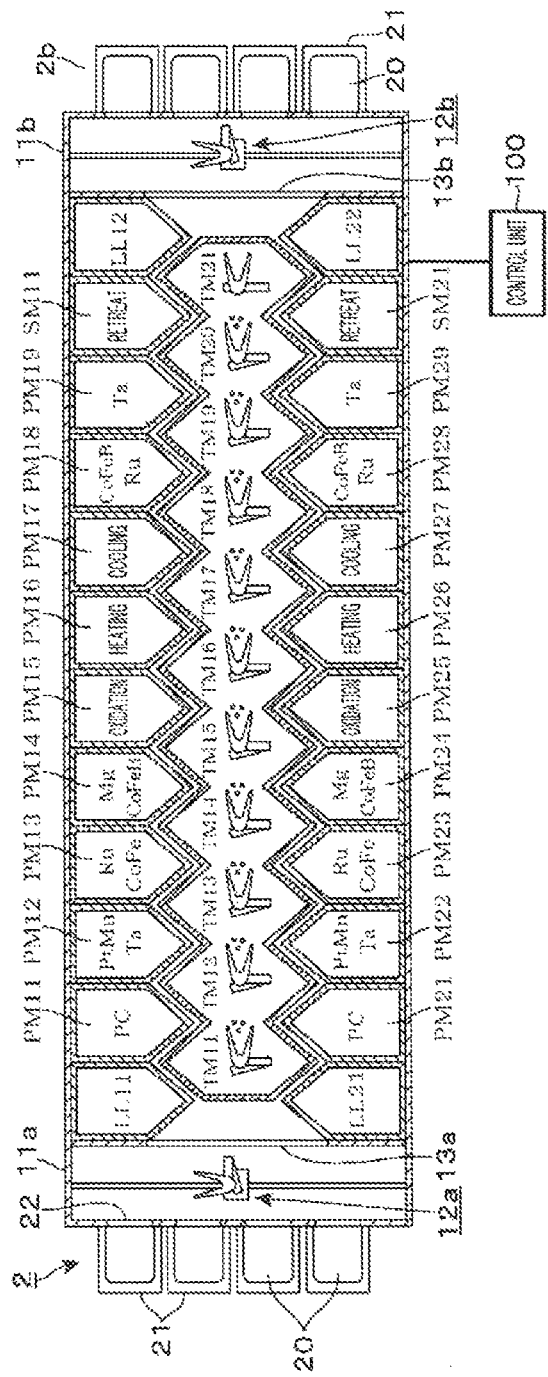
FIG. 41 is a plane view illustrating still another example of the vacuum processing apparatus.

Further, the vacuum processing apparatus may be configured as depicted in FIG. 41. In this example, a first atmospheric transfer module 11a is provided between a loading port 2a and the processing station 1, and a second atmospheric transfer module 11b is provided inside the processing station 1. An unloading port 2b is provided inside the second atmospheric transfer module 11b. The first and second atmospheric transfer modules 11a and 11b have the same configuration, and include atmospheric transfer arms 12a and 12b and openings 13a and 13b, respectively. Further, load lock chambers LL12 and LL22 configured to unload wafers are provided inside the first row and the second row, respectively. The atmospheric transfer arm 12b is configured to access the load lock chambers LL12 and LL22. In this example, wafers W are respectively transferred from the loading port 2a to first load lock chambers LL11 and LL21 in the first row and the second row through the first atmospheric transfer module 11a. Then, the wafer W is delivered in sequence from the upstream side to the downstream side in each of the first row and the second row, and unloaded from the second load lock chambers LL12 and LL22 to the unloading port 2b through the second atmospheric transfer module 11b.

Figure 40:
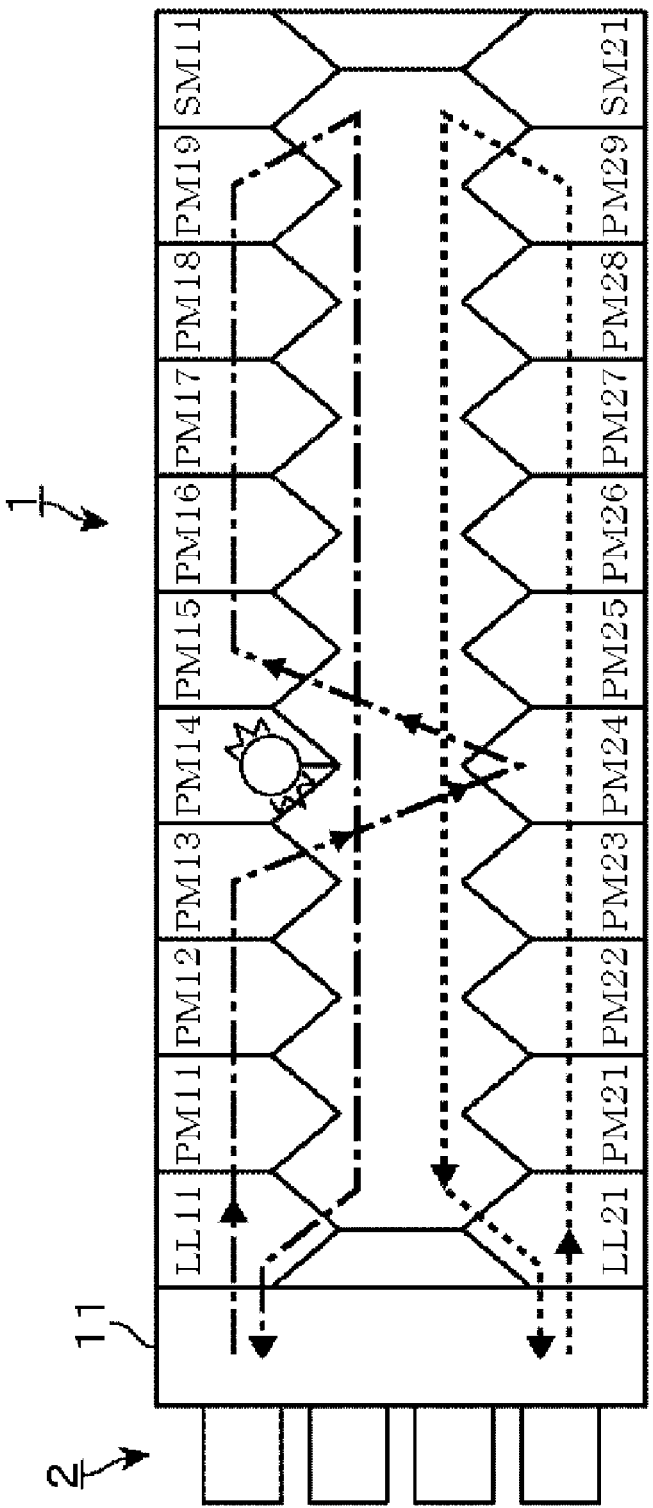
FIG. 40 is a plane view illustrating an operation of the vacuum processing apparatus.
Figure 42:
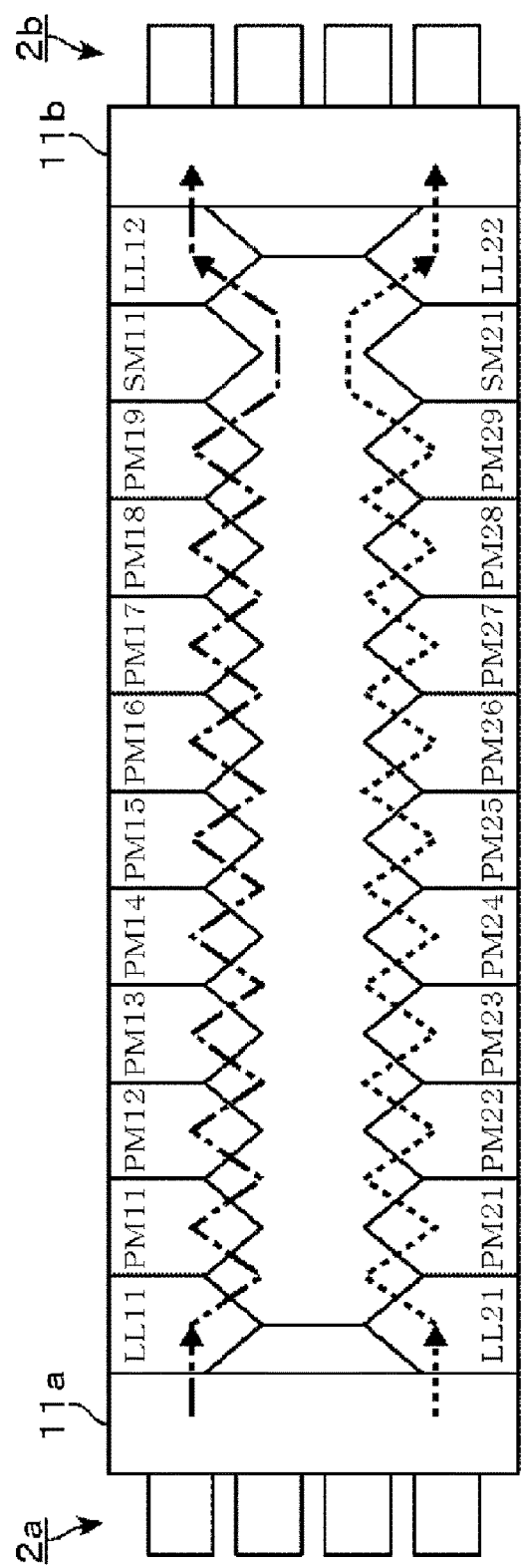
FIG. 42 is a plane view illustrating an operation of the vacuum processing apparatus.
Figure 43:
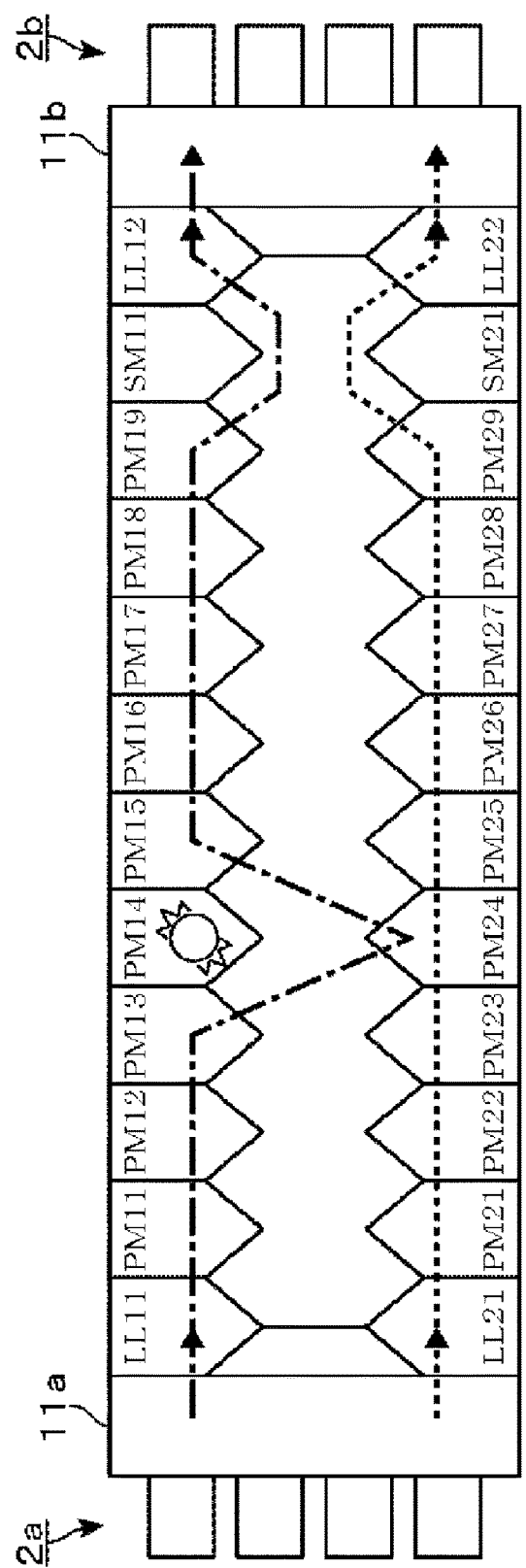
FIG. 43 is a plane view illustrating an operation of the vacuum processing apparatus.

In this configuration, for example, in the first row and the second row, there are provided the same process modules as provided in the vacuum processing apparatus depicted in FIG. 40, and in the first row and the second row, at regions adjacent to the second atmospheric transfer module 11b, the above-described load lock chambers LL12 and LL22 are provided respectively. When the vacuum processing apparatus is in a normal state, the wafer W is transferred according to a transfer pattern as depicted in FIG. 42. Details of the transfer are the same as shown in FIG. 39. Further, for example, when the process module PM14 cannot be used, for example, in the first row, loading of a wafer W from the load lock chamber LL11 to the process module PM11 is stopped and the control unit 100 outputs a control signal to continuously perform a process to a wafer W by using the process module PM24 as another process module. In this case, for example, as depicted in FIG. 43, the wafer W in the first row is controlled such that the wafer W can undergo a process in the process module PM24, and then, can be transferred again in sequence to the process modules PM15 to PM19 in the first row to undergo the respective processes therein.

Figure 38:
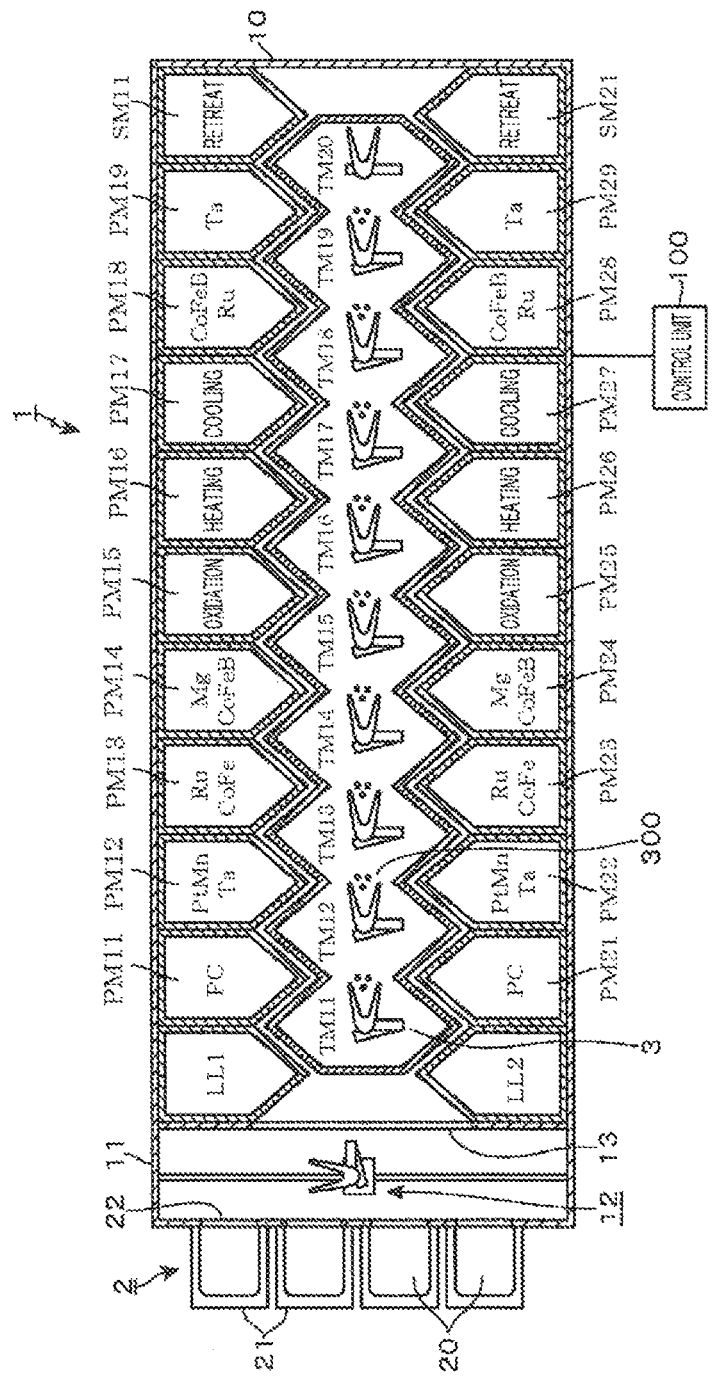
FIG. 38 is a plane view illustrating another example of the vacuum processing apparatus.
Figure 44:
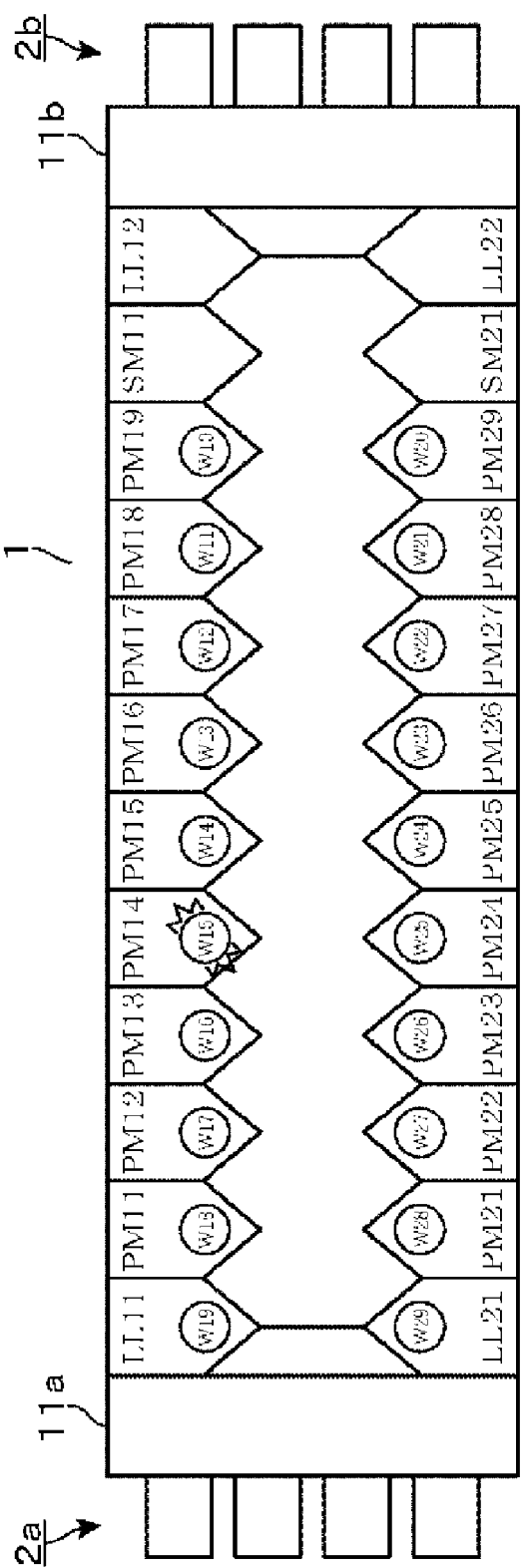
FIG. 44 is a plane view illustrating an operation of the vacuum processing apparatus.
Figure 45:
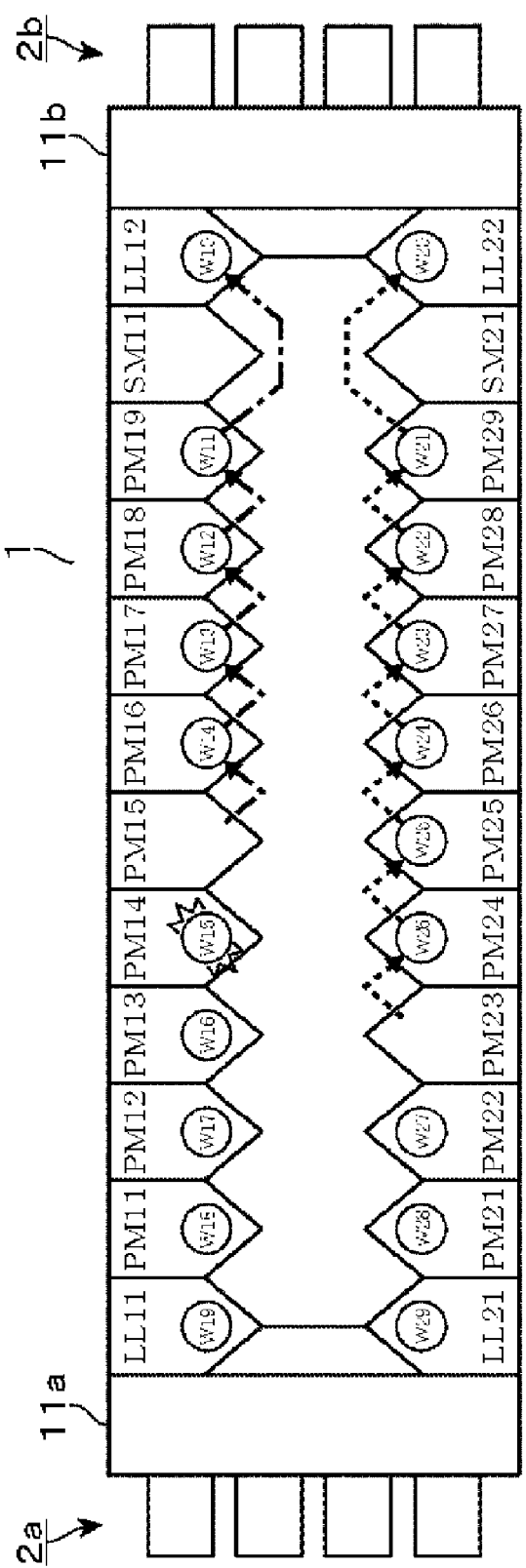
FIG. 45 is a plane view illustrating an operation of the vacuum processing apparatus.

In the configuration depicted in FIG. 38 and FIG. 41, the retreat modules SM11 and SM21 are provided, and the control unit 100 is configured to output a control signal to preferentially unload a wafer W, of which a processing result may be deteriorated when the wafer W processed in a process module is left in the process module, from the corresponding process module. Regarding the priority of the transfer, there will be explained the case where the process module PM14 cannot be used in the vacuum processing apparatus depicted in FIG. 41 with reference to FIG. 44 to FIG. 47. FIG. 44 illustrates a transfer status of a wafer W when the process module PM14 cannot be used. In this case, as depicted in FIG. 45, in the abnormality generation row (first row) and the normal row (second row), transfer of wafers W from the load lock chambers LL11 and LL21 to the process modules PM11 and PM12 is stopped. The process module PM24 that performs the same process as performed in the process module PM14 is a film forming module that performs a film forming process of forming a CoFeB film (process F) with the first priority of the next process and a film forming process of forming a Mg film (process G). Therefore, as depicted in FIG. 45, transfer of the wafers W27 and W28 loaded into the load lock chamber LL21 after the wafer W26 to be transferred to the process module PM24 in the normal row is stopped.

Figure 46:
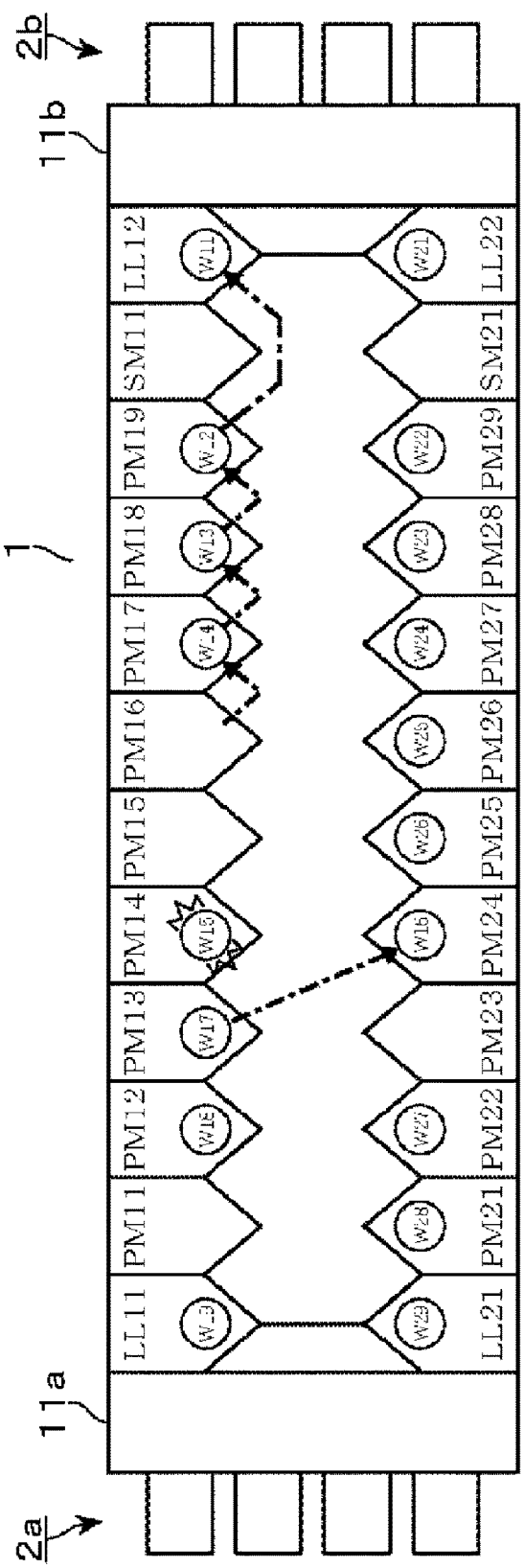
FIG. 46 is a plane view illustrating an operation of the vacuum processing apparatus.
Figure 47:
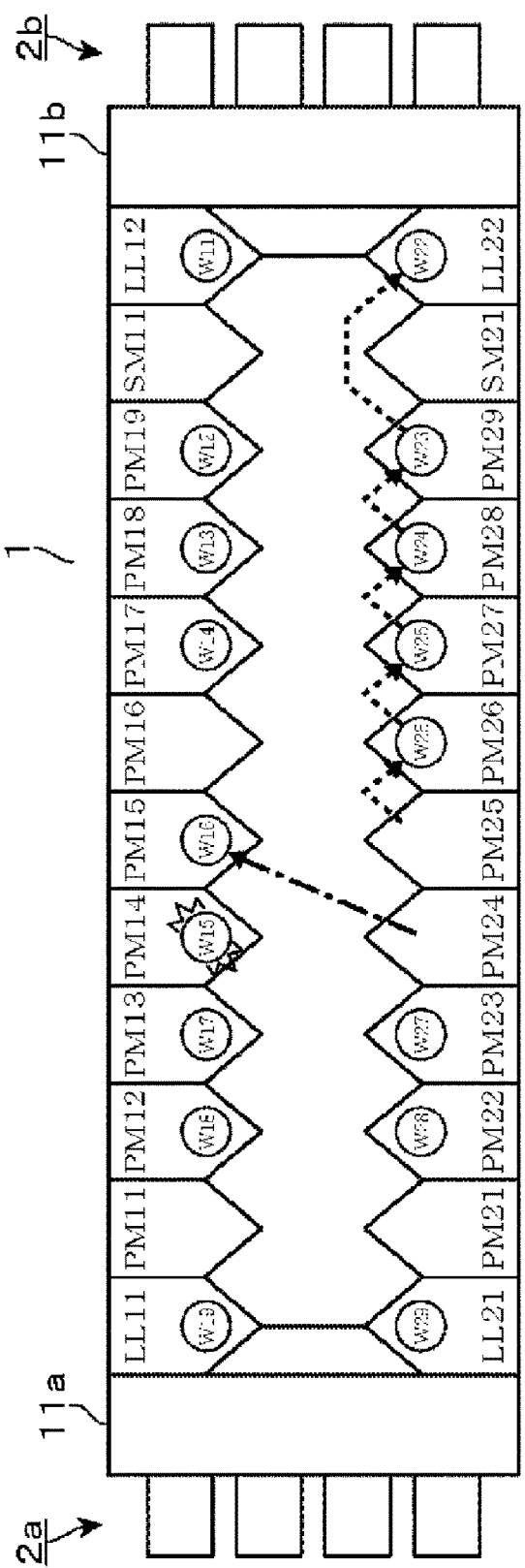
FIG. 47 is a plane view illustrating an operation of the vacuum processing apparatus.

Then, in the abnormality generation row, a wafer W is priorly transferred. That is, as depicted in FIG. 46, the wafer W16 in the process module PM13 is priorly transferred to the process module PM24 as another process module. Then, as depicted in FIG. 47, in the normal row, a wafer W is transferred in sequence from an upstream process module to a downstream process module. Further, in the normal row, the wafer W16 processed in the process module PM24 is returned to the abnormality generation row and a process is continued thereto.

As described above, in the vacuum processing apparatus depicted in FIG. 38 and FIG. 41, the process modules provided in the first row and the second row are the same. Further, since the transfer modules can transfer a wafer W with each other, even if a standby process module is not provided, when a certain process module cannot be used, it is possible to continue a series of processes using another process module. For this reason, it is possible to reduce the number of discarded wafers W while suppressing a decrease in throughput.

Further, when process modules constituting one of the first row and the second row cannot be used, in the other row, a wafer W may be loaded and a process may be continued thereto. In this case, it is possible to further suppress a decrease in throughput.

In the above-described example embodiment, when the process module PM14 cannot be used, the wafer W in the first row may undergo a process in the process module PM24 and then may be transferred in sequence to the process modules PM25 to PM29 in the second row to undergo the respective processes therein. Further, in order to perform a series of processes with respect to the wafer W in the same lot, the wafer W to be loaded into the load lock chamber LL11 may also be transferred to the process module PM21 through the load lock chamber LL21 to undergo the series of processes therein.

Figure 48:
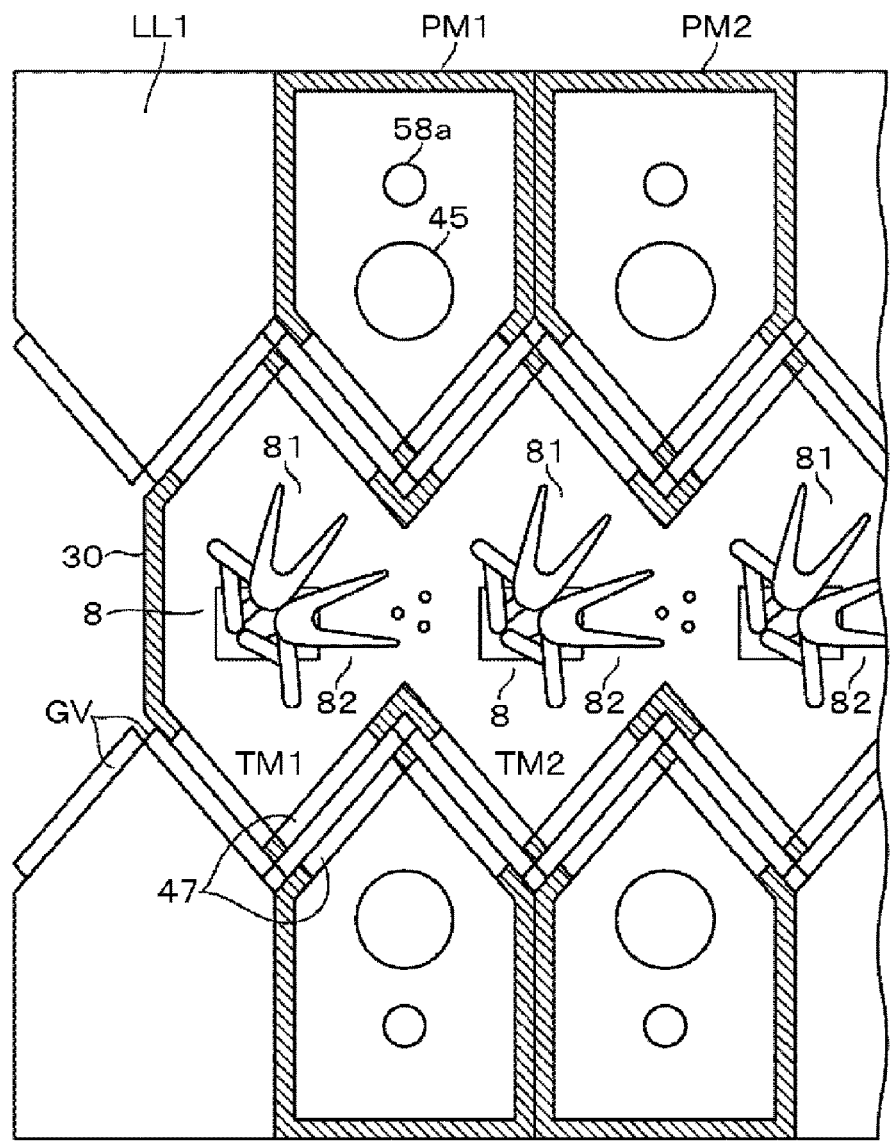
FIG. 48 is a plane view illustrating another example of a substrate transfer device provided in the vacuum processing apparatus.

A wafer transfer device 8 to be provided in the transfer module TM may be configured as depicted in FIG. 48. The wafer transfer device 8 includes two multi-joint arms 81 and 82. Each of the multi-joint arms 81 and 82 has the same configuration as the wafer transfer device 3 in the above-described example embodiment and is independently configured to be rotatable horizontally and movable back and forth. In the configuration including such two multi-joint arms 81 and 82, transfer efficiency can be improved, and, thus, it is possible to further improve the throughput. Further, one of these two multi-joint arms 81 and 82 may be used to deliver a wafer W with respect to a process module, and the other one may be used to deliver a wafer W between the adjacent wafer transfer devices 8.

Figure 49:
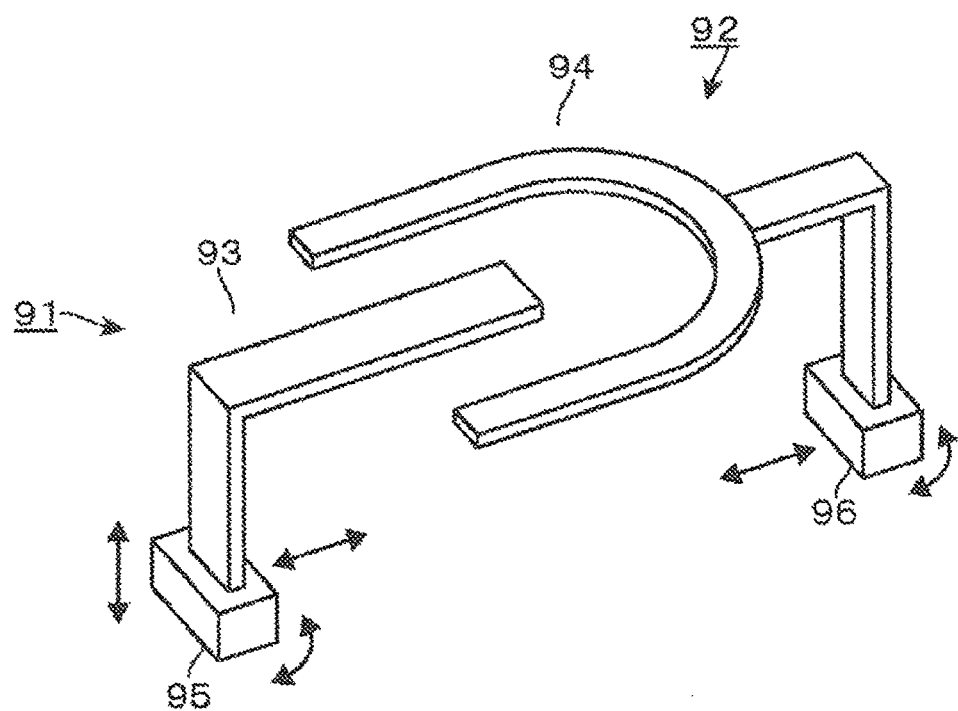
FIG. 49 is a schematic perspective view illustrating still another example of the substrate transfer device provided in the vacuum processing apparatus.

Further, in the example embodiments, as depicted in FIG. 49, a wafer W may be directly delivered between substrate transfer devices within a transfer chamber. In this case, substrate transfer devices 91 and 92 adjacent to each other have different shapes of holding parts 93 and 94, respectively, configured to hold wafers W. Furthermore, the substrate transfer device 91 is configured such that the holding part 93 can be rotated horizontally, moved back and forth, and moved up and down by a driving device 95, and the substrate transfer device 92 is configured such that the holding part 94 can be rotated horizontally and moved back and forth by a driving device 96. Shapes of the holding parts 93 and 94 are configured such that, for example, one of them holds a periphery of a wafer W and the other one holds a central portion of another wafer W, and also are configured not to interfere with each other when a wafer W is delivered between both the holding parts 93 and 94. Further, a wafer W is delivered between both the holding parts 93 and 94 by arranging the holding part 94 at a delivery position and moving the holding part 93 up and down with respect to the holding part 94.

The process module that forms a metal film by a sputtering method may include three different kinds of targets. In this case, for example, in the sputtering module depicted in FIG. 7, three targets are prepared, target electrodes are connected to a DC power supply unit via a switch, and a negative DC voltage is selectively applied to the target electrodes by switching the switch. Further, the process module that forms a metal film by a sputtering method may apply a high frequency power to the targets without using a magnet and perform the sputtering method by applying a bias power to a substrate (wafer W). Further, the metal film may be formed by, for example, CVD (Chemical Vapor Deposition) as well as, but not limited to, the sputtering method.

Further, a metal oxide film may be formed by forming a metal film and oxidizing the metal film within a common processing container. In this case, for example, the sputtering module depicted in FIG. 7 may be used, and one of the targets 52a and 52b may be made of a gettering material and the other one may be made of a material of forming the metal film. The gettering material is a material that absorbs oxygen and water, and may include, for example, titanium (Ti), chromium (Cr), Ta, Zr, hafnium (Hf), etc., and alloys thereof.

Furthermore, in the case of forming a metal oxide film, a wafer W is mounted on a mounting unit within a processing container (decompression container) and a shutter that covers the wafer W is positioned right above the wafer W to perform a gettering process. In the gettering process, a gettering material is deposited on an inner wall of the decompression container by, for example, a magnetron sputtering method. Thus, oxygen and water within the decompression container are absorbed and removed by the gettering material. Then, the shutter that covers the wafer W is retreated, and then, a metal film is formed by the magnetron sputtering method. In the magnetron sputtering method, when the gettering process is performed, only the target made of the gettering material is exposed by the target shutter. Further, when the metal film is formed, only the target made of the material of the metal film is exposed by the target shutter. As such, within the processing container, the gettering process and the film forming process of forming the metal film are alternately repeated, so that the metal oxide film is formed. In the case of forming and oxidizing the metal film in the common processing container as described above, a process module for oxidation may not be needed, so that the apparatus can be reduced in size.

In the example embodiments, a wafer W is transferred through a route of, for example, a process module in the first row a process module in the second row a process module in the first row to perform a series of processes.

Further, in the example embodiments, a substrate can be transferred through the inside of the transfer chamber without passing through the process module, so that it is not necessary to arrange process modules according to the order of the series of processes. Further, since a substrate is transferred through a route of, for example, a process module in the first row→a process module in the second row→a process module in the first row, the process modules in the first row and the second row may be arranged to perform the series of processes. Further, in the case of continuing a process to a substrate by using another process module that can perform the same process as performed in a process module that cannot be used, it is not necessary to control a substrate, of which a processing result may be deteriorated when it is left in a process module, to be priorly transferred. By way of example, even if a process is continued by using another process module, a substrate is controlled to be unloaded from a process module according to the order of substrates loaded into the processing station and then delivered to the next process module.

In the vacuum processing apparatus depicted in FIG. 38 and FIG. 41, process modules in the first row and the second row are arranged such that each of the series of processes can be independently performed. In this case, each of the first row and the second row may be configured such that each of the series of processes can be performed by all of at least two process modules. By way of example, in the apparatus depicted in FIG. 38 and FIG. 41, the first row and the second row are configured such that thirteen process modules and a single retreat module are provided between the first load lock chamber and the second load lock chamber. Further, the thirteen process modules may be respectively configured to perform the same processes as, for example, the thirteen process modules depicted in FIG. 6. Thus, the first row and the second row include, respectively, two process modules configured to perform each of the series of processes. In this configuration, if there is an unusable process module in any one of the first row and the second row, a process to a substrate can be continued using another process module in the corresponding row, and, thus, there is little effect on a process to a substrate in the other row. Further, the vacuum processing apparatus in accordance with the example embodiments may be configured such that any one of the series of processes can be performed by all of three or more process modules.

Figure 50:
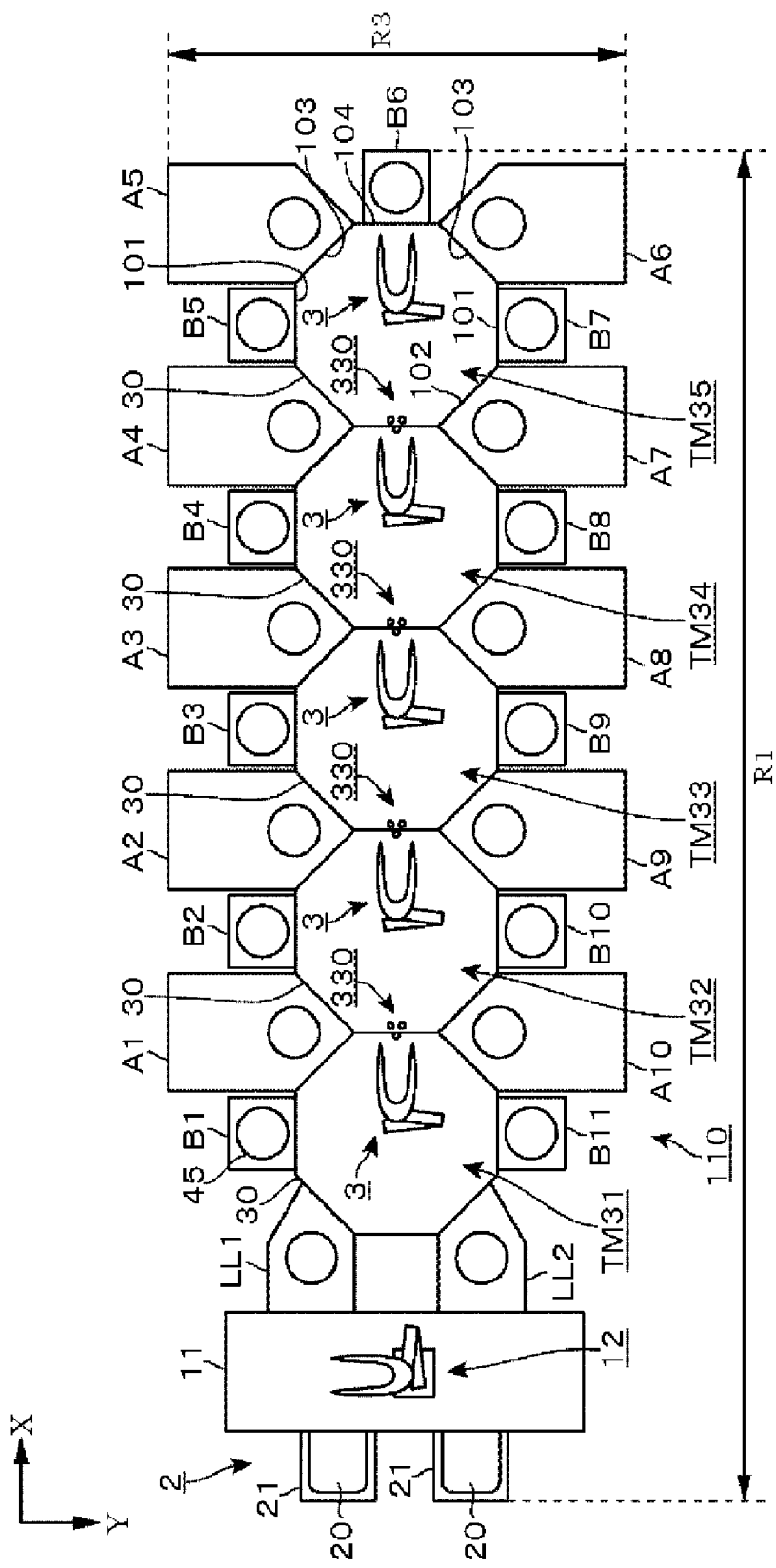
FIG. 50 is a schematic diagram of a vacuum processing apparatus in accordance with a third example embodiment.

Hereinafter, a third example embodiment will be explained focusing on differences with respect to the first example embodiment with reference to FIG. 50. A vacuum processing apparatus 110 in the third example embodiment includes five transfer modules TM continuously connected in a straight line in the forward/backward direction (X direction in the drawing). Transfer modules as viewed from the atmospheric transfer module 11 side (front side) to the rear side will be referred to as TM31, TM32, TM33, TM34, and TM35 in sequence. The decompression container 30 constituting each of these transfer modules TM31 to TM35 has an octagonal shape in a plane view. Further, the adjacent transfer modules TM among the transfer modules TM31 to TM35 are arranged to share one side of the octagonal shape.

Figure 51:
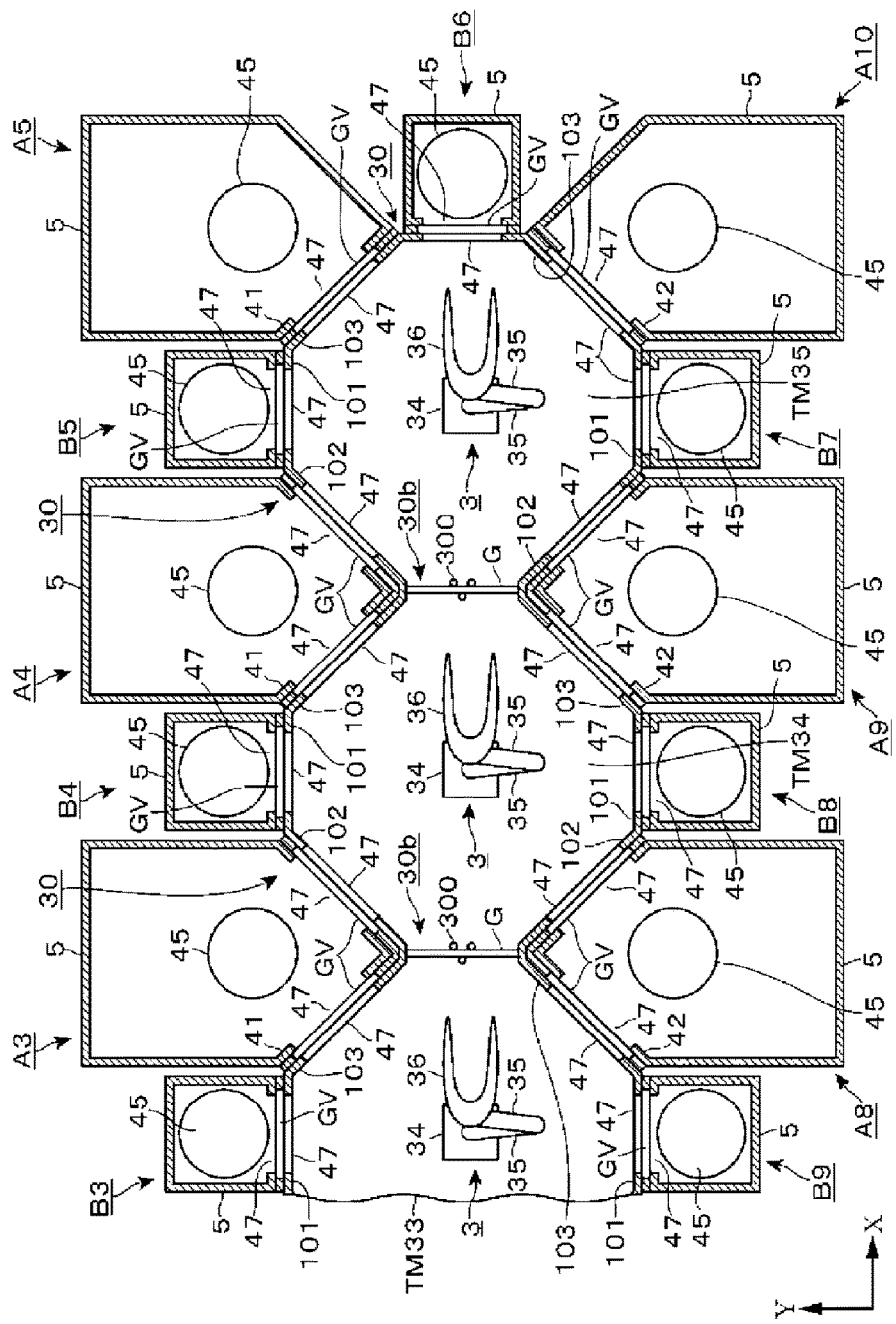
FIG. 51 is a transversal plane view of the vacuum processing apparatus.

Among the transfer modules TM31 to TM35, representatively, the transfer modules TM34 and TM35 will be further explained in detail with reference to FIG. 51. The decompression container 30 constituting each of the transfer modules TM includes sidewalls 101 and 101 formed at both sides thereof along the forward/backward direction. In the decompression container 30, sidewalls formed at the front side from the sidewalls 101 and toward the central portion of the both sides of the decompression container 30 are denoted by reference numeral 102, and sidewalls formed at the rear side from the sidewalls 101 and toward the central portion of the both sides of the decompression container 30 are denoted by reference numeral 103. Further, in the rearmost transfer module TM (TM35 in this example embodiment), a sidewall adjacent to the sidewalls 103 and 103 at the rear side is denoted by reference numeral 104. In these sidewalls 101 to 104, the transfer openings 47 are opened, and in the same manner as the first example embodiment, a wafer W can be delivered between the transfer module TM and a module adjacent thereto.

The transfer modules TM31 to TM35 have the same configuration as each of the transfer modules TM in the first example embodiment except a difference in shape of the decompression container 30. That is, the openings 30b are formed between the transfer modules TM31 to TM35, respectively, and can be opened and closed by the gate valve G. Further, the stages 300 are provided between the transfer modules TM31 to TM35, respectively, and each of the transfer modules TM31 to TM35 includes the wafer transfer device 3.

In this vacuum processing apparatus 110, two kinds of process modules, which are different in shapes, are provided. One of them is a process module having a pentagonal shape in a plane view in the same manner as the first example embodiment and including the sidewalls 41 or 42 protruding toward the central portion of the both sides of the apparatus 110. Such a process module will be described as a "pentagonal module". The other one is a process module having a square shape in a plane view. Such a process module will be described as a "square module". Further, a retreat module to be provided in the vacuum processing apparatus 110 has the same configuration as the square module of the above-described process modules. This retreat module will be described as the square module. The pentagonal module corresponds to a main process module, and the square module corresponds to a subordinate process module. The pentagonal module is larger than the square module. When an area of the square module in a plane view is 1, an area of the pentagonal module in a plane view is 1.3 or more.

There are provided ten pentagonal modules A1 to A10. As viewed from the front side of the apparatus 110 to the rear side, the pentagonal modules A1, A2, A3, A4, and A5 are arranged in sequence in a row on the left, and the pentagonal modules A10, A9, A8, A7, and A6 are arranged in sequence in a row on the right. As for the pentagonal modules A1 to A4, the sidewall 41 constituting the decompression container 5 enters between the sidewalls 103 and 102 of the adjacent transfer modules TM and is arranged to face these sidewalls 103 and 102. As for the pentagonal modules A10 to A7, the sidewall 42 constituting the decompression container 5 enters between the sidewalls 103 and 102 of the adjacent transfer module TM and is arranged to face these sidewalls 103 and 102. As for the pentagonal module A5, one surface of the sidewall 41 is arranged to face the sidewall 103 of the transfer module TM35. As for the pentagonal module A6, one surface of the sidewall 42 is arranged to face the sidewall 103 of the transfer module TM35.

There are provided eleven square modules B1 to B11. The square modules B1, B2, B3, B4, and B5 are arranged in sequence toward the rear side to form a row (first row) together with the pentagonal modules A1 to A5. Sidewalls constituting the respective decompression containers 5 of the square modules B1 to B5 face the sidewalls 101 of the transfer modules TM31 to TM35. Further, the square modules B11, B10, B9, B8, and B7 are arranged in sequence toward the rear side to form a row (second row) together with the pentagonal modules A6 to A10. Sidewalls constituting the respective decompression containers 5 of the square modules B11 to B7 face the sidewalls 101 of the transfer modules TM31 to TM35. That is, in both of the first row and the second row, the square modules and the pentagonal modules are alternately arranged in the forward/backward direction. Further, when the apparatus 110 is viewed from the front side toward the rear side, the pentagonal modules A1 to A5 are further protruded to the left than the square modules B1 to B5, and the pentagonal modules A6 to A10 are further protruded to the right than the square modules B7 to B11. The square module B6 is arranged behind the transfer module TM35 such that a sidewall constituting the decompression container 5 faces the sidewall 104 of the transfer module TM35. The sidewalls 102 and 102 of the transfer module TM31 face the sidewalls of the load lock chamber LL1 and LL2, respectively.

Since the sidewalls of the modules face each other as such, the transfer opening 47 formed at the respective modules are overlapped in the same manner as the first example embodiment. Accordingly, a wafer W can be delivered between the modules. In the same manner as the first example embodiment, the transfer opening 47 is opened and closed by the gate valve GV provided between the modules.

The pentagonal module A1 corresponds to the process module PM1 that performs the above-described surface cleaning process. The pentagonal modules A2 to A10 correspond to the process module PM2 in the first example embodiment as depicted in FIG. 7, and are configured to form various films by the sputtering method. As materials of the targets 52 (52a and 52b) included in the pentagonal modules A2 to A10, Ta and Ru are used for the module A2, Co and Pd are used for the module A3, Ta and CoFeB are used for the module A4, CoFe and Mg are used for the module A5, Mg is used for the modules A6 and A7, CoFe and CoFeB are used for the module A8, Ta is used for the module A9, and Ru is used for the module A10.

The square modules B1 and B3 are heating modules and correspond to the process module PM7 illustrated in FIG. 13. The square modules B2 and B10 correspond to the retreat modules SM1 and SM2. The square modules B8 and B9 correspond to the heating module illustrated in FIG. 13. However, these modules B8 and B9 can supply a coolant to the mounting unit 45 as explained with the process module PM6 depicted in FIG. 14, and can cool the heated wafer W. The square module B4 is a cooling module and corresponds to the process module PM6. The square modules B6 and B7 are oxidation modules and correspond to the process module PM5 illustrated in FIG. 12. The square module B has the same configuration as the corresponding process module PM or retreat module SM except a shape of the decompression container 5. Further, at the pentagonal module A and the square module B, the exhaust opening 58a configured to exhaust the inside of the decompression container 5 of each of these modules is formed, but illustration thereof is omitted.

Further, the square modules B8 and B9 and the retreat modules SM in each of the example embodiments will be additionally explained. Dummy wafers are held in advance in the shelves 7 of these modules, respectively. The dummy wafer is transferred to each process module through the wafer transfer devices 3 and the stages 300. When the dummy wafer is loaded into the process module, the process module performs a preset process and processing conditions within the decompression container 5 are adjusted. After adjustment, a wafer W unloaded from the FOUP 20 is loaded into the process module and undergoes a process.

The square module B5 is configured as an alignment module that adjusts a direction of a wafer W. On the mounting unit 45 of the module B5, a central portion of a wafer W is horizontally mounted, and the mounting unit 45 is rotated around a vertical axis. Further, the module B5 includes light transmitting parts provided at both upper and lower parts with a periphery of the rotating wafer W therebetween; and a light receiving part configured to receive a light by the light transmitting parts. In this module B5, a notch formed along a circumference of the wafer W is detected due to a change in a range of incident light on the light receiving part from the light transmitting part, and the notch is formed toward a preset direction.

The reason why such an alignment module is provided is that before a magnetic film is formed on a wafer, a direction of a magnetic field of the magnetic film on the wafer W needs to be toward a preset direction. In the third example embodiment, the magnetic film is a CoFe film. However, for example, a direction of the wafer W is adjusted before the wafer W is loaded into the vacuum processing apparatus and a transfer rate of the wafer W in the vacuum processing apparatus is controlled such that the direction of the wafer W is not changed. Thus, a direction of the wafer W at the time of forming the magnetic film can be controlled. That is, the alignment module is not necessary for each vacuum processing apparatus.

Figure 52:
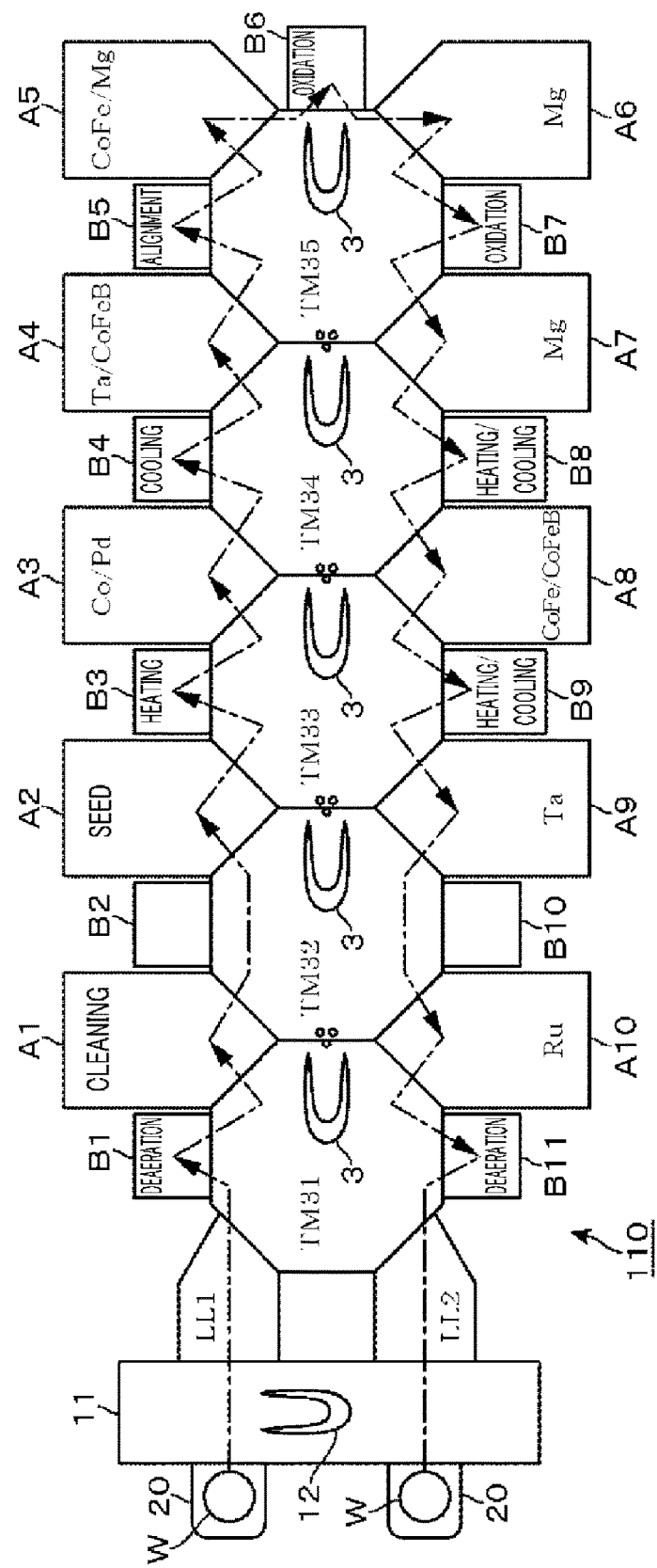
FIG. 52 is an operation diagram illustrating a transfer route for a wafer in the vacuum processing apparatus.

A transfer route for a wafer W in the vacuum processing apparatus 110 will be explained with reference to FIG. 52. The wafer W transferred to the atmospheric transfer module 11 from the FOUP 20 is delivered through a route of the first load lock chamber LL1→the transfer module TM31→the square module B1 or B11 in sequence. FIG. 52 illustrates that the wafer W is transferred to B1 of the square modules B1 and B11.

Then, the wafer W is delivered through a route of the transfer module TM31→the pentagonal module A1→the transfer module TM32→the pentagonal module A2→the transfer module TM33→the square module B3 the transfer module TM33→the pentagonal module A3→the transfer module TM34→the square module B4→the transfer module TM34→the pentagonal module A4→the transfer module TM35→the square module B5→the transfer module TM35→the pentagonal module A5→the transfer module TM35→the square module B6→the transfer module TM35→the pentagonal module A6→the transfer module TM35→the square module B7→the transfer module TM35→the pentagonal module A7→the transfer module TM34→the square module B8→the transfer module TM34→the pentagonal module A8→the transfer module TM33→the square module B9→the transfer module TM33→the pentagonal module A9→the transfer module TM32→the pentagonal module A10→the transfer module TM31→the second load lock chamber LL2→the atmospheric transfer module 11→the FOUP 20 in sequence.

Figure 53:
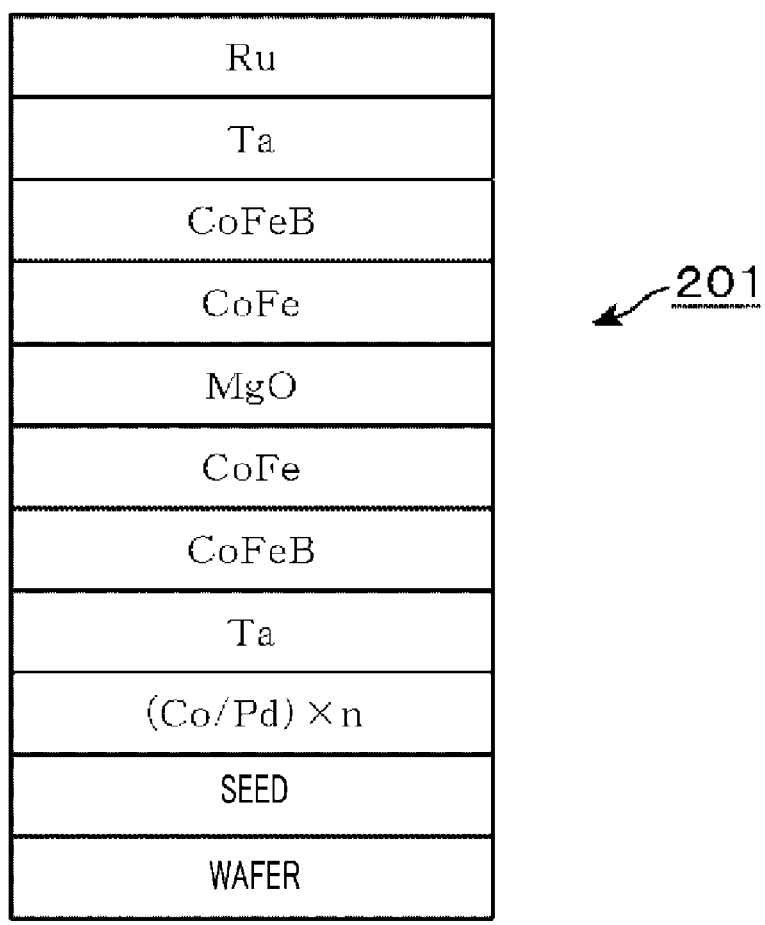
FIG. 53 is a configuration view illustrating an example of a laminated film formed in the vacuum processing apparatus.

FIG. 53 illustrates a laminated film 201 to be formed on the wafer W transferred as described above. The laminated film 201 constitutes a MTJ film to be used for the MRAM. A process to be performed to the wafer W in each module will be explained in the order of transfer of the wafer W with reference to FIG. 53.

The wafer W is heated and deaerated in the square modules B1 and B10. In the pentagonal module A1, a surface of the wafer W is sputtered and etched, and the surface is cleaned. In the pentagonal module A2, a seed layer made of Ta is formed on the surface of the wafer W. The seed layer may be made of Ru instead of Ta. In the square module B3, the wafer W is heated. In the pentagonal module A3, a Co film and a Pd film are formed alternately and repeatedly n times. The repetition number n is an integer from 4 to 20. In the square module B4, the wafer W is cooled. In the pentagonal module A4, a Ta film and a CoFeB film are formed in sequence. In the square module B5, a direction of the wafer W is adjusted.

In the pentagonal module A5, a CoFe film and a Mg film are formed in sequence. In the square module B6, an oxidation process is performed. In the pentagonal module A6, a Mg film is formed. In the square module B7, an oxidation process is performed. In the pentagonal module A7, a Mg film is formed. A MgO film is formed on the CoFe film by forming the Mg films in the pentagonal modules A5, A6, and A7 and performing the oxidation processes in the square module B6 and B7. In the square module B8, a heating process and a cooling process are performed in sequence. In the pentagonal module A8, a CoFe film and a CoFeB film are formed in sequence. In the square module B9, a heating process and a cooling process are performed in sequence. In the pentagonal module A9, a Ta film is formed. In the pentagonal module A10, a Ru film is formed.

Figure 54:
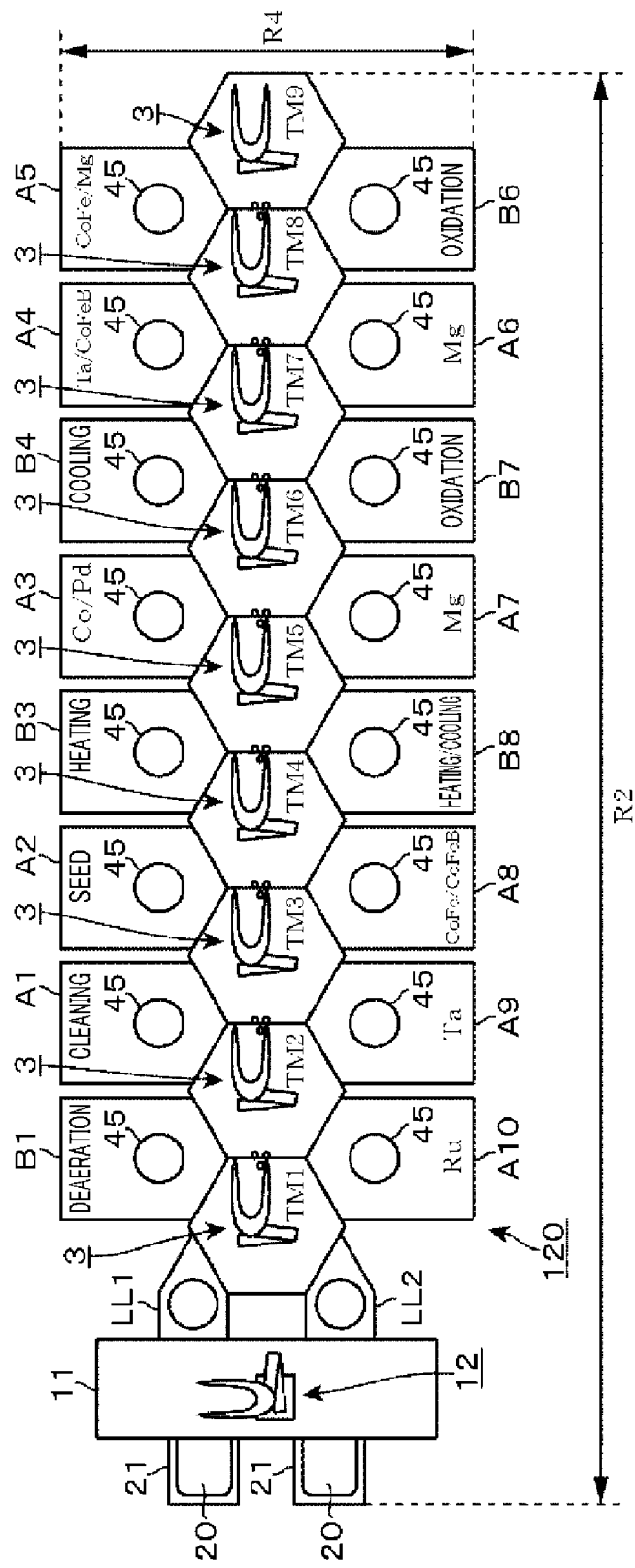
FIG. 54 is a schematic diagram of a vacuum processing apparatus as a comparative example of the vacuum processing apparatus in accordance with the third example embodiment.

To explain advantages of the vacuum processing apparatus 110, a configuration of a vacuum processing apparatus 120 as a comparative example is illustrated in FIG. 54. The vacuum processing apparatus 120 forms the laminated film 201 in the same manner as the vacuum processing apparatus 110. The vacuum processing apparatus 120 is different from the apparatus 110 in that a shape of a transfer module TM in a plane view is a hexagonal shape in the same manner as the first example embodiment and all process modules are configured as pentagonal modules. Each pentagonal module is connected to the transfer module TM in the same manner as the first example embodiment.

In FIG. 54, a pentagonal module that performs the same process to a wafer W as the square module B of the vacuum processing apparatus 110 is denoted by the same reference numeral as the square module B. In the vacuum processing apparatus 120, modules corresponding to the square module B2, B7, B9, B10, and B11 of the vacuum processing apparatus 110 are not provided. Further, nine transfer modules TM1 to TM9 are provided to transfer a wafer W between the pentagonal modules. A wafer W is transferred between the pentagonal modules through a route of B1→A1→A2→B3→A3→B4→A4→A5→B6→A6→B7→A7→B8→A8→A9→A10. In the vacuum processing apparatus 110, a heating process and a cooling process to be performed by the square module B9 to a wafer W before being loaded into the pentagonal module A9 are performed by, for example, the pentagonal module A9 in the vacuum processing apparatus 120.

The pentagonal modules of the vacuum processing apparatus 110 have the same sizes as the pentagonal modules of the vacuum processing apparatus 120. A length of the vacuum processing apparatus 110 in the forward/backward direction as denoted by R1 in FIG. 50 is shorter than a length of the vacuum processing apparatus 120 in the forward/backward direction as denoted by R2 in FIG. 54, and for example, R1 is 12.6 m and R2 is 13.8 m. Further, a length of the vacuum processing apparatus 110 in the right and left direction as denoted by R3 in FIG. 50 is the same as a length of the vacuum processing apparatus 120 in the right and left direction as denoted by R4 in FIG. 54, and for example, it is 4.1 m.

A module that performs a sputtering process is relatively large due to an arrangement space of each target 52, a movement space of each magnet arrangement unit 61, an arrangement space of the driving devices 63, and an arrangement space of the gas supply unit 59a that supplies a gas from a sidewall of the decompression container 5. A module that heats or cools a wafer W without performing a sputtering process or a retreat module does not need the spaces required to perform the sputtering process. Therefore, in the vacuum processing apparatus 110, a size of the decompression container 5 varies depending on a kind of a process and whether a module is a process module or a retreat module. Further, in the vacuum processing apparatus 110, the transfer module TM has an octagonal shape, and the square modules B and the pentagonal modules A are alternately arranged in the forward/backward direction to be connected to the transfer module TM.

In the vacuum processing apparatus 110 configured as such, the length in the forward/backward direction is suppressed as compared with the vacuum processing apparatus 120. That is, a foot print (bottom area occupied by the apparatus) can be reduced. Further, in the vacuum processing apparatus 110, as compared with the vacuum processing apparatus 120, more modules can be provided while an occupied bottom area is reduced, so that it is possible to obtain an effect caused by these modules. To be specific, a heating process and a cooling process performed by the pentagonal module A9 of the vacuum processing apparatus 120 are assigned to the square module B9 of the vacuum processing apparatus 110 different from the pentagonal module A9. Therefore, a film forming process in the pentagonal module A9 and the heating process and the cooling process in the square module B9 can be performed in parallel. Thus, it is possible to improve throughput. Further, by the square module B5 as an alignment module, magnetism of a magnetic film can be set toward a preset direction more clearly. Furthermore, since the square modules B2 and B10 as retreat modules are provided, it is possible to reduce the trouble of transferring a dummy wafer from the outside of the apparatus 110.

Figure 55:
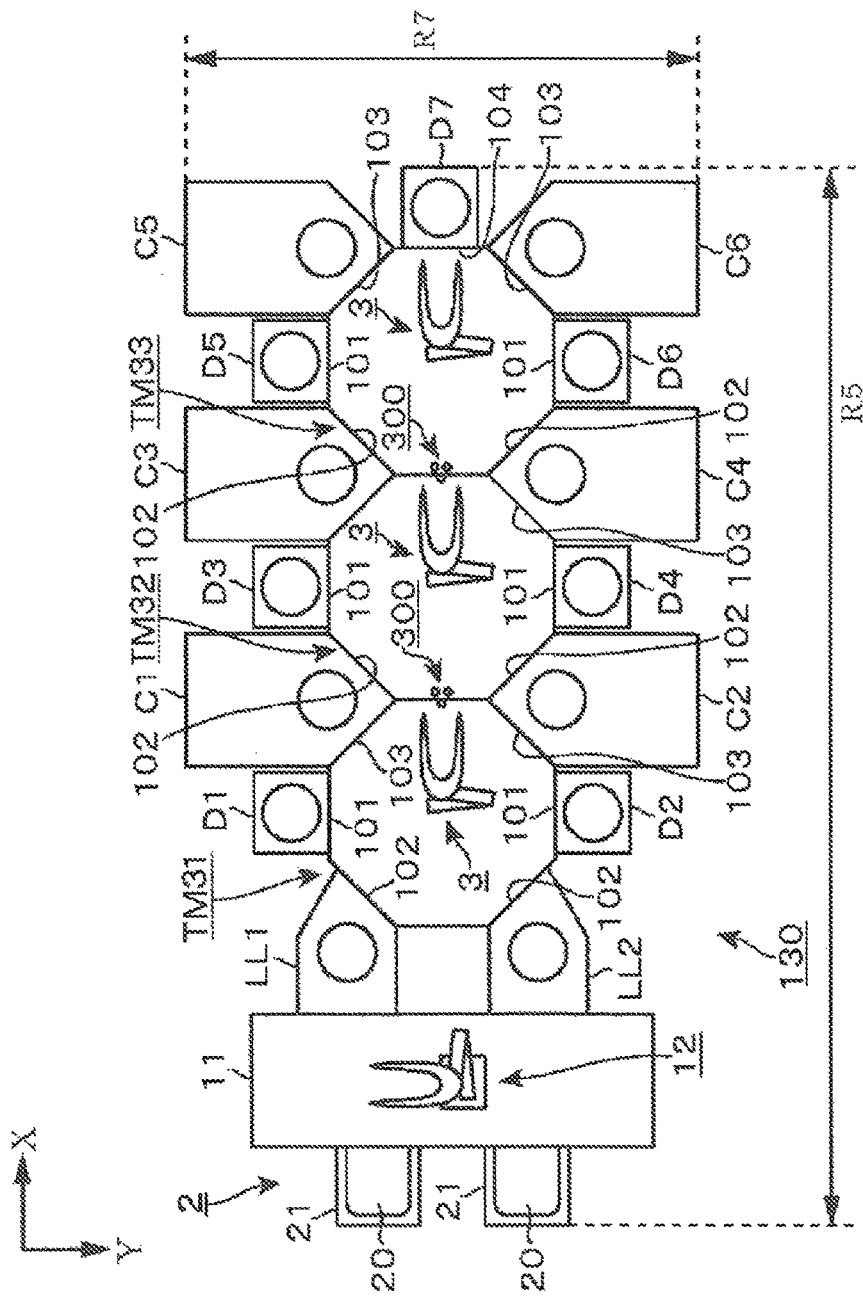
FIG. 55 is a schematic diagram of a vacuum processing apparatus in accordance with a fourth example embodiment.

Hereinafter, a vacuum processing apparatus 130 in accordance with a fourth example embodiment will be explained focusing on differences with respect to the vacuum processing apparatus 110 with reference to FIG. 55. The vacuum processing apparatus 130 processes a wafer W including an interlayer insulating film having a recess on its surface and fills Cu forming a wiring in the recess. In the vacuum processing apparatus 130, seven square modules and six pentagonal modules are provided, and three transfer modules TM31 to TM33 corresponding to the number of the modules are provided.

The pentagonal modules are denoted by C1 to C6, respectively, and the square modules are denoted by D1 to D7, respectively. When viewed from the front side of the apparatus 130 toward the rear side, the modules D1, C1, D3, C3, D5, and C5 are arranged in sequence on the left to form the first row and the modules D2, C2, D4, C4, D6, and C6 are arranged in sequence on the right to form the second row. On the rear side of the transfer module TM33, the module D7 is arranged.

The pentagonal modules C1, C2, C5, and C6 are configured to form a film by the sputtering method. The modules C1 and C2 include the targets 52 made of TaN, and the modules C5 and C6 include the targets 52 made of Cu. The pentagonal modules C3 and C4 include gas shower heads facing the mounting units 45, respectively. With a film forming gas to be supplied from these gas shower head, CVD is performed, and a Ru film is formed. In order to form a film with high uniformity on the entire surface of the wafer W, the facing gas shower head is formed to be relatively large. For this reason, a module that performs CVD is a relatively large module and thus configured as a pentagonal module. Further, in the third example embodiment, the MgO film may be formed by providing a pentagonal module that performs ALD (Atomic Layer Deposition). The module that performs ALD is also configured as, for example, a pentagonal module.

The square modules D1 and D2 are configured as cleaning modules that perform the hydrogen radical process. To be specific, the square modules D1 and D2 are configured in the same manner as the above-described heating module except that an antenna to supply a microwave is provided in, for example, the decompression container 5. With a microwave radiated from the antenna into the decompression container 5, hydrogen radicals are generated from hydrogen supplied to a surface of a wafer W, and, thus, oxides on the surface of the wafer W are reduced. Further, it does not matter if hydrogen radicals are supplied onto the wafer W using a remote plasma source as a radical generation source. The square modules D3 and D4 are the above-described heating modules. The square modules D5 and D6 are modules that perform the above-described high-temperature hydrogen reduction process and annealing process, and have the same configuration as the above-described heating module except that hydrogen is supplied to the wafer W. The square module D7 is the above-described cooling module.

Figure 56:
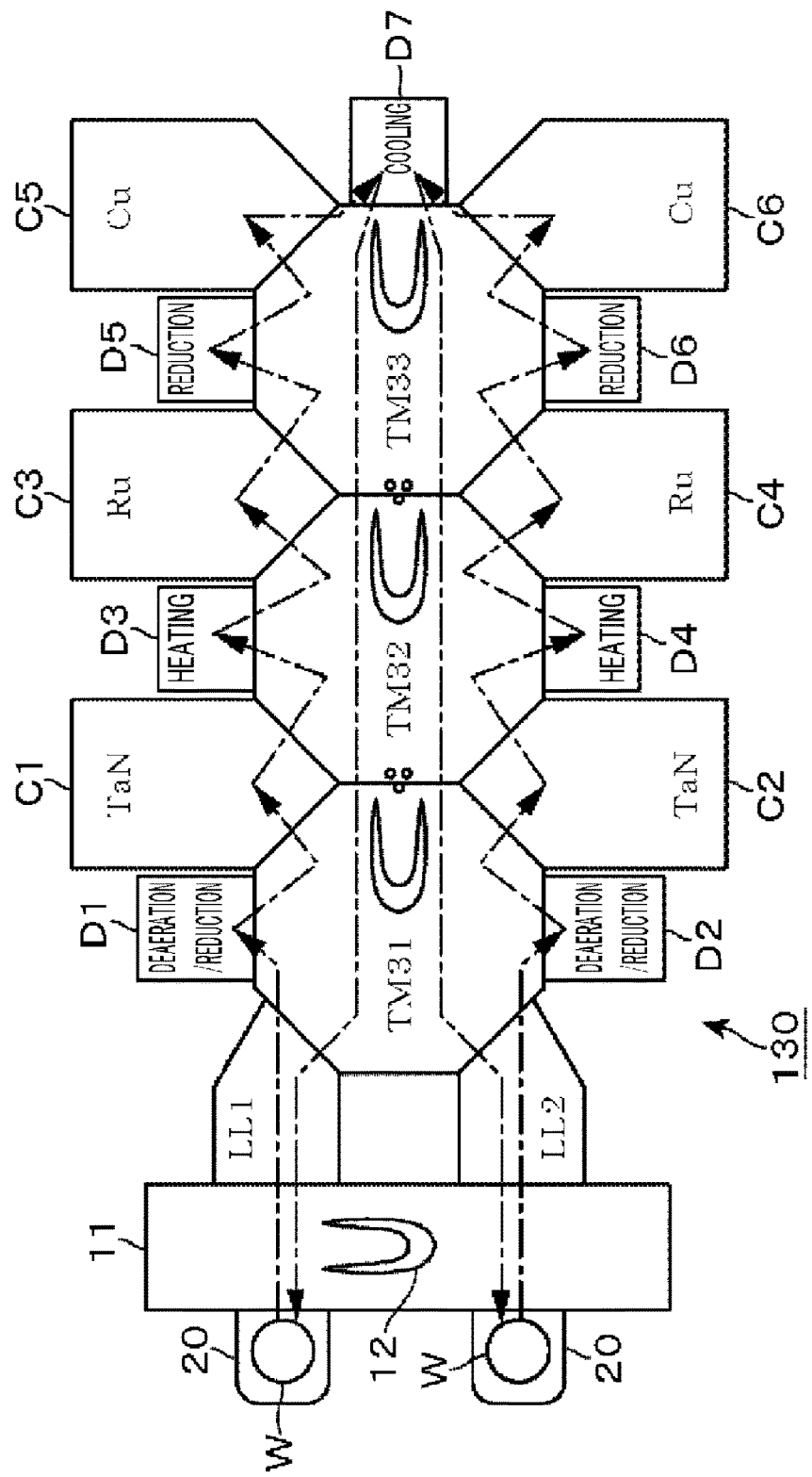
FIG. 56 is an operation diagram illustrating a transfer route for a wafer in the vacuum processing apparatus.

A transfer route for a wafer W in the vacuum processing apparatus 130 will be explained with reference to FIG. 56. A wafer W loaded into the load lock chamber LL1 from the FOUP 20 is transferred through a route of the transfer module TM31→the square module D1→the transfer module TM31→the pentagonal module C1→the transfer module TM32→the square module D3→the transfer module TM32→the pentagonal module C3→the transfer module TM33→the square module D5→the transfer module TM33→the pentagonal module C5→the transfer module TM33→the square module D7 in sequence. Then, the wafer W is returned to the load lock chamber LL1 through the transfer modules TM31 to TM33 and then returned to the FOUP 20.

The wafer W loaded into the load chamber LL2 from the FOUP 20 is transferred through a route of the transfer module TM31→the square module D2→the transfer module TM31→the pentagonal module C2→the transfer module TM32→the square module D4→the transfer module TM32→the pentagonal module C4→the transfer module TM33→the square module D6→the transfer module TM33→the pentagonal module C6→the transfer module TM33→the square module D7 in sequence. Then, the wafer W is returned to the load lock chamber LL2 through the transfer modules TM31 to TM33 and then returned to the FOUP 20.

A process to be performed to the wafer W in each module will be explained in the order of transfer of the wafer W. In the square modules D1 and D2, deaeration of the wafer W is performed by heating and reduction of oxides on the surface of the wafer W is performed with hydrogen radicals. In the pentagonal modules C1 and C2, a TaN film as a barrier film that suppresses diffusion of Cu in an interlayer insulting film is formed on a surface of a recess in the interlayer insulting film. In the square modules D3 and D4, the wafer W is heated. The heating is carried out to suppress a time for increasing a temperature of the wafer W to a temperature at which a film can be formed when the wafer W is transferred to the pentagonal modules C3 and C4. In the pentagonal modules C3 and C4, a Ru film as a barrier film is formed on the TaN film. In the square modules D5 and D6, a heating process and a reduction process with a hydrogen gas are performed. In the pentagonal modules C5 and C6, a Cu film is formed and the Cu film is filled in the recess. In the square module D7, the wafer W is cooled. The cooling is carried out to suppress a time required to reach a temperature at which the wafer W loaded into the load lock chambers LL1 and LL2 film can be transferred to the FOUP 20.

Figure 57:
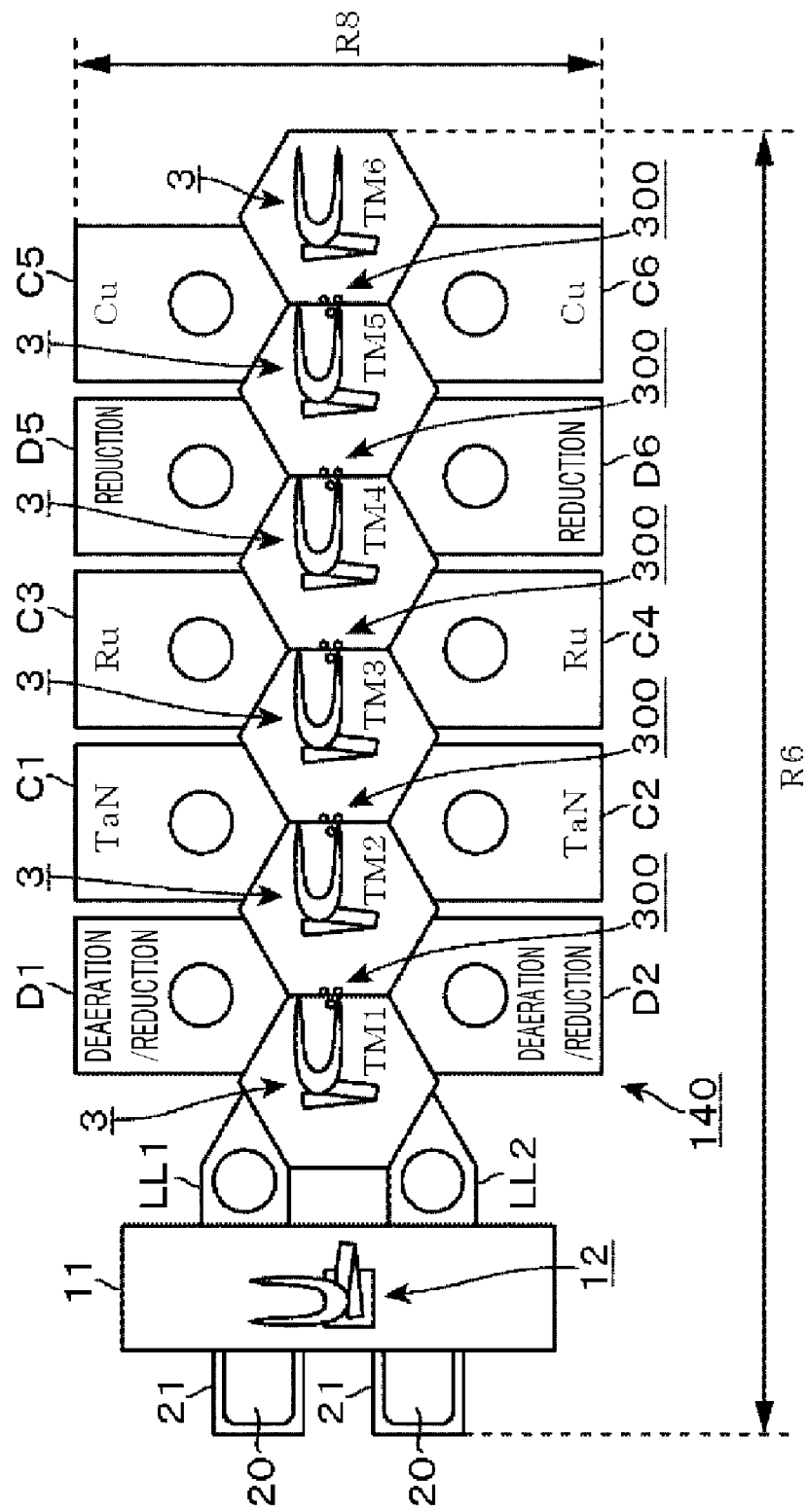
FIG. 57 is a schematic diagram of a vacuum processing apparatus as a comparative example of the vacuum processing apparatus in accordance with the fourth example embodiment.
Figure 58:
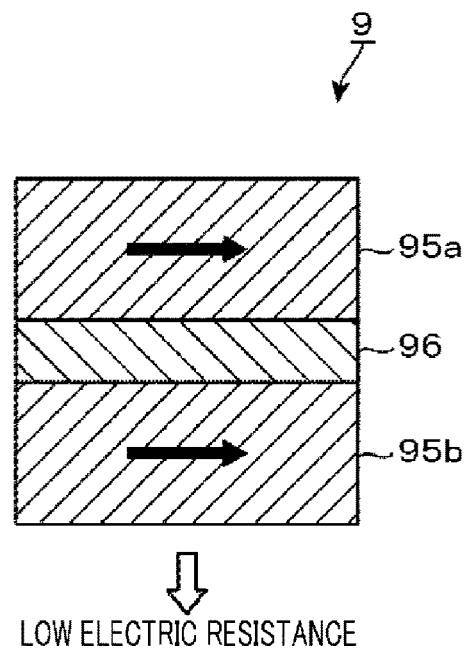
FIG. 58 is a longitudinal cross-sectional view illustrating a MTJ device.
Figure 59:
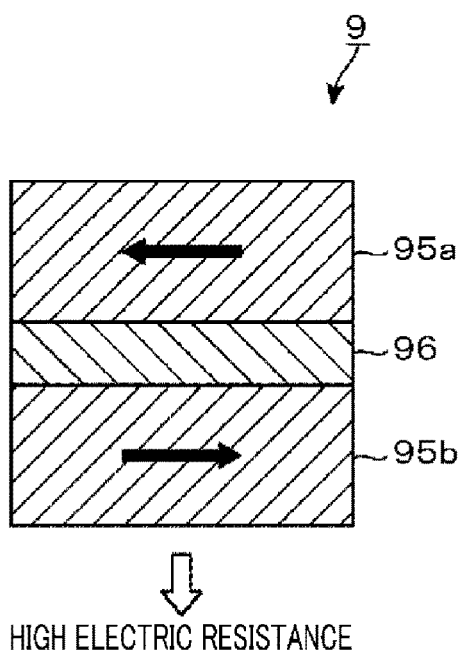
FIG. 59 is a longitudinal cross-sectional view illustrating a MTJ device.

In order to compare with the vacuum processing apparatus 130, a vacuum processing apparatus 140 is illustrated in FIG. 57. The vacuum processing apparatus 140 fills Cu in a recess of an interlayer insulating film in the same manner as the vacuum processing apparatus 130. In the vacuum processing apparatus 140, in the same manner as the vacuum processing apparatus 120, a transfer module TM has a hexagonal shape in a plane view, and six transfer modules TM1 to TM6 are provided. Further, each process module is configured as a pentagonal module. The vacuum processing apparatus 140 includes, as process modules, pentagonal modules that perform the same processes as the square modules D1, D2, D5, and D6, respectively, in addition to the pentagonal modules C1 to C6. These pentagonal modules are assigned the same reference numerals D1, D2, D5, and D6 as the square modules. However, in the vacuum processing apparatus 140, modules corresponding to the square modules D3, D4, and D7 are not provided.

In the vacuum processing apparatus 140, a wafer W loaded into the load lock chamber LL1 from the FOUP 20 is transferred through a route of the modules D1→C1→C3→D5→C5 in sequence. Then, the wafer W is transferred through a route of the transfer modules TM1 to TM6→the load lock chamber LL1 in sequence and then returned to the FOUP 20. The wafer W loaded into the load lock chamber LL2 from the FOUP 20 is transferred through a route of the modules D2→C2→C4→D6→C6 in sequence. Then, the wafer W is transferred through a route of the transfer modules TM1 to TM6 the load lock chamber LL2 in sequence and then returned to the FOUP 20. In the vacuum processing apparatus 140, a heating process is not performed by the square modules D3 and D4, so that a time required for a heating process before films are formed in the pentagonal modules C3 and C4 is increased. Further, a cooling process is not performed by the square module D7, so that a waiting time for cooling the wafer W in the load lock chambers LL1 and LL2 is increased.

The pentagonal modules in the vacuum processing apparatus 130 have the same sizes as the pentagonal modules in the vacuum processing apparatus 140. A length of the vacuum processing apparatus 130 in the forward/backward direction as denoted by R5 in FIG. 55 is shorter than a length of the vacuum processing apparatus 140 in the forward/backward direction as denoted by R6 in FIG. 57. For example, R5 is 8.7 m and R6 is 9.9 m. Further, a length of the vacuum processing apparatus 130 in the right and left direction as denoted by R7 in FIG. 55 is the same as a length of the vacuum processing apparatus 140 in the right and left direction as denoted by R8 in FIG. 57, and for example, it is 4.1 m. That is, in the vacuum processing apparatus 130, as compared with the vacuum processing apparatus that performs the same process, it is possible to suppress a foot print and also possible to increase the number of modules. Further, it is possible to obtain an effect caused by the modules increased in number as such.

In the vacuum processing apparatus 130, the square module D7 may be configured as a retreat module. Further, a film to be formed in the vacuum processing apparatus 130 is non-magnetic, so that the alignment module is not provided in the vacuum processing apparatus 130. However, for example, if a magnetic film is formed on a wafer W in any one of the pentagonal modules C3 to C6, the square modules D3 and D4 are configured as alignment modules, and a direction of the wafer W may be adjusted before a magnetic film is formed. In the vacuum processing apparatus 130, there are two process modules that perform the same process. Therefore, if one of these modules cannot be used, the wafer W to be transferred to one module which cannot be used is transferred to the other usable module to undergo a process as described in the example embodiments.

We claim:

1. A substrate processing apparatus that performs a series of processes to a substrate in a vacuum atmosphere by using multiple process modules in sequence, the substrate processing apparatus comprising:
   a transfer chamber in a vacuum atmosphere;
   a row of substrate transfer devices each arranged within the transfer chamber and each configured to be rotatable horizontally and movable back and forth;
   rows of process modules arranged at right and left sides of the row of the substrate transfer devices along the row, each of the process modules performing a process to the substrate;
   standby decompression chambers arranged at one ends of the row of substrate transfer devices; and
   a control unit configured to control a transfer of the substrate,
   wherein the multiple process modules include a process module, having a sidewall at a side of the row of the substrate transfer devices protruded toward a space between the adjacent substrate transfer devices, configured to deliver the substrate with respect to any one of the substrate transfer devices at a front side in an inclination direction of the sidewall and a rear side in the inclination direction thereof,
   in the rows of the process modules, each of the series of the processes is performed by at least two process modules, and
   when one process module of the rows of the process modules is not applicable, the control unit outputs a control signal to continuously process the substrate by using another process module that performs the same process as performed in the one process module, and
   wherein each of the substrate transfer devices is configured to allow to deliver the substrate to an adjacent substrate transfer device without passing through any one of the process modules and without passing through any chamber except an adjacent transfer chamber,
   adjacent substrate transfer devices are partitioned by a gate valve,
   a substrate transfer mechanism configured to transfer the substrate between the adjacent substrate transfer devices is provided in the vicinity of the gate valve,
   one of the substrate transfer devices is configured to deliver the substrate to one of the process modules and to another of the substrate transfer devices which is adjacent to said one of the substrate transfer devices,
   said another of the substrate transfer devices is configured to deliver the substrate to said one of the process modules and to said one of the substrate transfer devices,
   the substrate transfer mechanism includes an elevating device which is provided between adjacent substrate transfer devices and is configured to vertically move, and
   the adjacent substrate transfer devices at both sides of the elevating device deliver the substrate with respect to the elevating device.

2. The substrate processing apparatus of claim 1,
   wherein same processes are included in the series of the processes, and the same processes are performed by the process modules different from each other, and
   the process modules different from each other correspond to the one process module and the another process module, respectively.

3. The substrate processing apparatus of claim 1,
   wherein, in addition to the multiple process modules prepared to perform the series of the processes, a standby process module corresponding to the another process module is used in a case where the one process module of the multiple processing modules is not applicable.

4. The substrate processing apparatus of claim 1,
   wherein the control unit outputs a control signal to preferentially unload a substrate, of which a processing result is deteriorated when the substrate processed in the process module is left in the corresponding process module, from the corresponding process module before transferring a group of substrates of which processing results are not deteriorated even when the substrates processed in the corresponding process modules are left in the corresponding process modules.

5. The substrate processing apparatus of claim 1, further comprising:
   a retreat module which is connected to the transfer chamber and to which a substrate placed in the one process module of the rows of the process modules is temporarily retreated when the one process module is not applicable.

6. The substrate processing apparatus of claim 1,
   wherein, in the rows of the process modules, a laminated film including eight of metal films and metal oxide films in total is formed on the substrate, and
   the process module configured to form a metal is configured to perform a sputtering method.

7. The substrate processing apparatus of claim 6,
   wherein the process module includes different kinds of multiple targets.

8. The substrate processing apparatus of claim 1,
the rows of the process modules and the row of the substrate transfer devices are arranged such that the process module, the substrate transfer device, and the process module are located in zigzags.

9. The substrate processing apparatus of claim 1,
wherein each of the transfer chambers has an octagonal shape in a plane view, and the transfer chambers are continuously connected to share a side of the octagonal shape and include one transfer chamber and another transfer chamber each including the substrate transfer device, when a process module having a sidewall at a side of the row of the substrate transfer devices protruded toward a space between the adjacent substrate transfer devices serves as a main process module, the main process module is connected to the one transfer chamber and the another transfer chamber by allowing the sidewall to be protruded toward the space between the one transfer chamber and the another transfer chamber, and when among the process modules, process modules respectively provided next to the main process module at a front side and at a rear side are subordinate process modules, the subordinate process modules are connected to a side next to the side of the octagonal shape connected to the main process module.

* * * * *

UNITED STATES PATENT AND TRADEMARK OFFICE
CERTIFICATE OF CORRECTION

PATENT NO. : 10,049,860 B2
APPLICATION NO. : 14/412258
DATED : August 14, 2018
INVENTOR(S) : Atsushi Gomi et al.

Page 1 of 1

It is certified that error appears in the above-identified patent and that said Letters Patent is hereby corrected as shown below:

In the Specification

Column 27, Line 21, "row a process module in the second row a process module" should be
-- row → a process module in the second row → a process module --.

Signed and Sealed this
Sixth Day of November, 2018

Andrei Iancu
*Director of the United States Patent and Trademark Office*